(12) United States Patent
Sugawara

(10) Patent No.: US 8,076,710 B2
(45) Date of Patent: Dec. 13, 2011

(54) SEMICONDUCTOR DEVICE AND METHOD FOR MANUFACTURING THE SAME

(75) Inventor: Hiroki Sugawara, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 170 days.

(21) Appl. No.: 12/542,274

(22) Filed: Aug. 17, 2009

(65) Prior Publication Data

US 2009/0302368 A1    Dec. 10, 2009

Related U.S. Application Data

(63) Continuation of application No. PCT/JP2007/055666, filed on Mar. 20, 2007.

(51) Int. Cl.
*H01L 29/41* (2006.01)
*H01L 29/43* (2006.01)
*H01L 29/792* (2006.01)

(52) U.S. Cl. ............... 257/315; 257/365; 257/E21.682

(58) Field of Classification Search .................. None
See application file for complete search history.

(56) References Cited

U.S. PATENT DOCUMENTS

| | | | |
|---|---|---|---|
| 590,086 A | | 9/1897 | Bohrisch |
| 5,194,753 A | * | 3/1993 | Rhodes et al. .............. 257/775 |
| 5,346,844 A | * | 9/1994 | Cho et al. .................. 438/253 |
| 5,639,681 A | * | 6/1997 | Carmody et al. ............ 438/593 |
| 5,977,584 A | * | 11/1999 | Kim ........................... 257/315 |
| 5,981,404 A | * | 11/1999 | Sheng et al. ............... 438/791 |
| 6,001,688 A | * | 12/1999 | Rizzuto ....................... 438/264 |
| 6,110,833 A | * | 8/2000 | Early et al. ................ 438/700 |
| 6,455,888 B1 | * | 9/2002 | Early et al. ................ 257/315 |
| 6,610,580 B1 | * | 8/2003 | Chan et al. ................ 438/424 |
| 7,494,868 B2 | * | 2/2009 | Choi et al. ................. 438/257 |

FOREIGN PATENT DOCUMENTS

| | | |
|---|---|---|
| JP | 5-183127 A | 7/1993 |
| JP | 5-267683 A | 10/1993 |
| JP | 9-051082 A | 2/1997 |
| JP | 9-172152 A | 6/1997 |
| JP | 10-163456 A | 6/1998 |

OTHER PUBLICATIONS

International Search Report of PCT/JP2007/055666, Mailing Date of Jun. 19, 2007.

* cited by examiner

*Primary Examiner* — Benjamin Sandvik
*Assistant Examiner* — Joseph Schoenholtz
(74) *Attorney, Agent, or Firm* — Fujitsu Patent Center

(57) ABSTRACT

A method for manufacturing a semiconductor device is provided. The method includes forming multiple conductive patterns 13a, forming an intermediate insulating film 16 on all of device isolation insulating films 6 and the conductive patterns 13a, forming a second conductive film 17 on the intermediate insulating film 16, patterning the second conductive film 17, the intermediate insulating film 16, and the multiple conductive patterns 13a, individually, to make the conductive patterns 13a into floating gates 13c and to make the second conductive film 17 into multiple strip-like control gates 17a. In the method, an edge, in a plan layout, of at least one of each of the conductive patterns 13a and each of the device isolation insulating films 6 is bent in a region between the control gates 17a adjacent in a row direction.

22 Claims, 65 Drawing Sheets

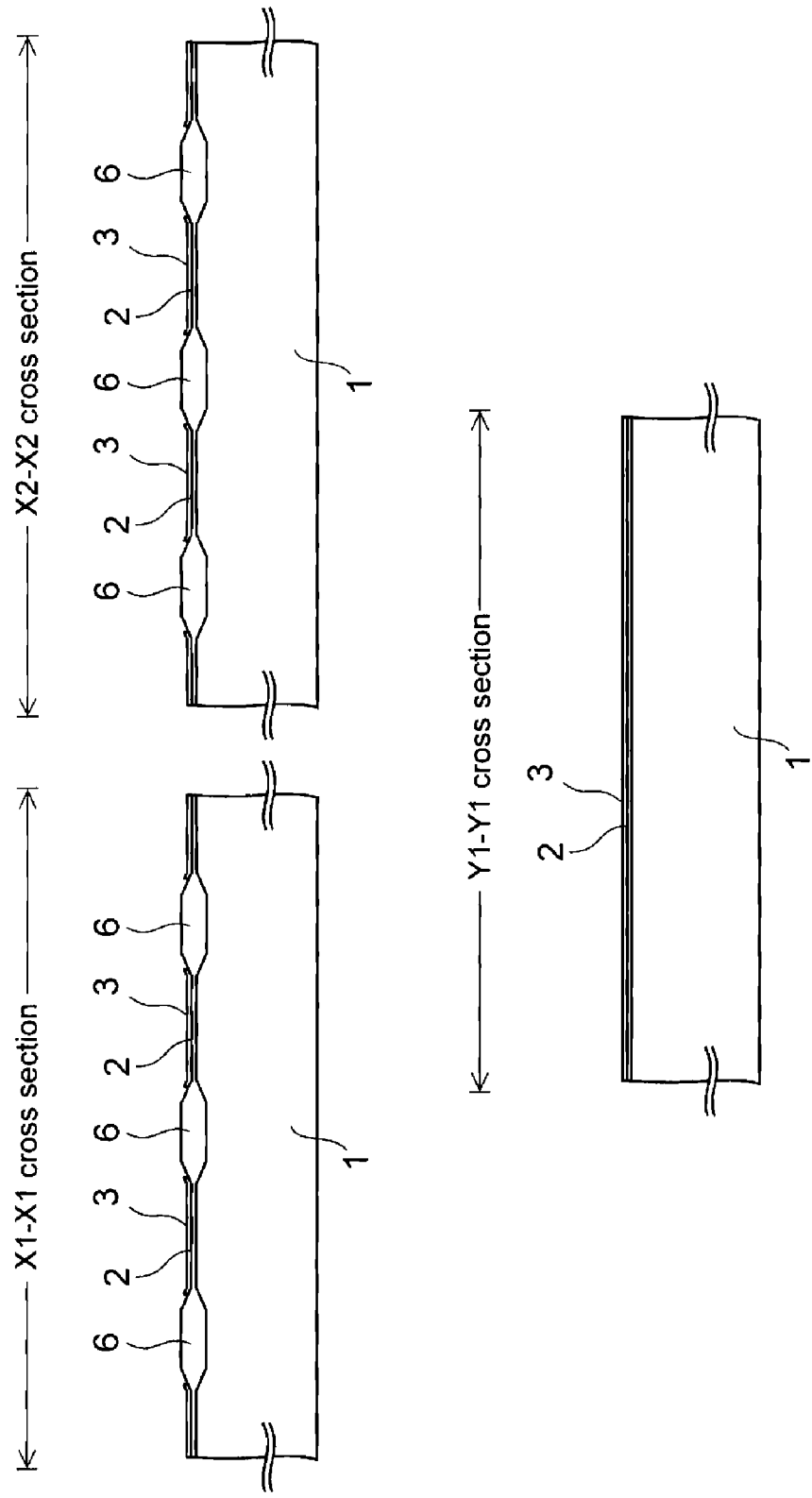

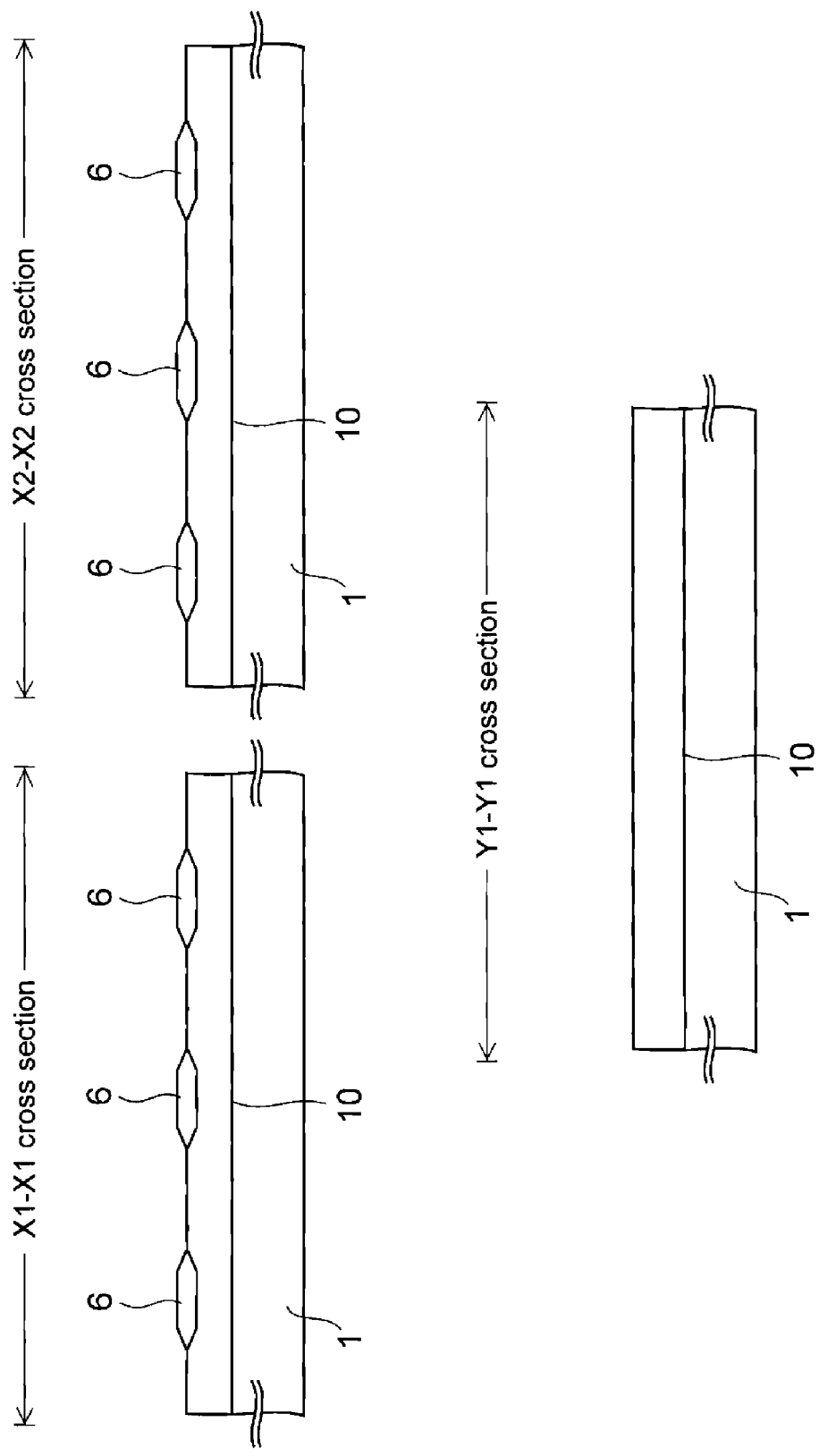

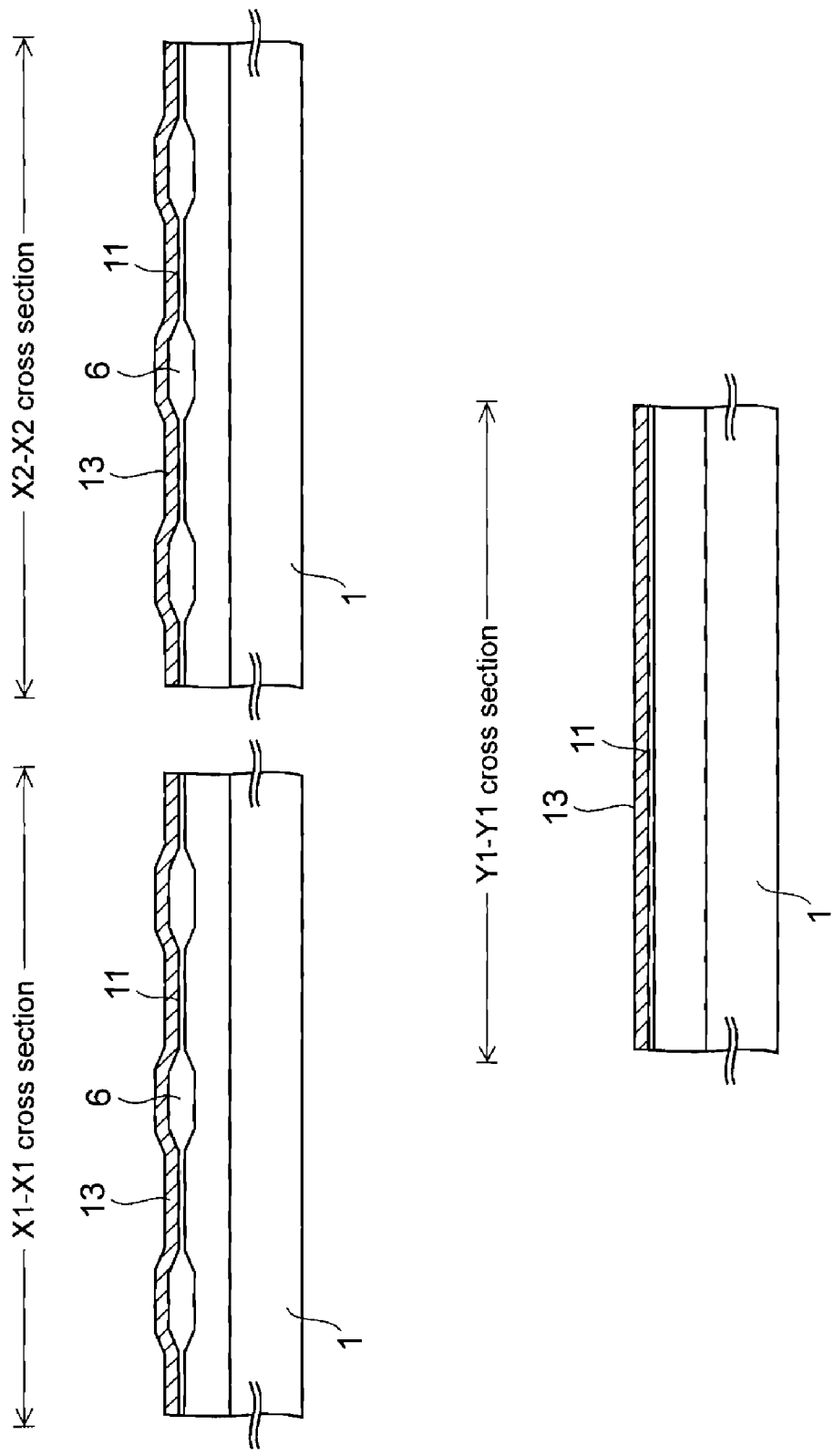

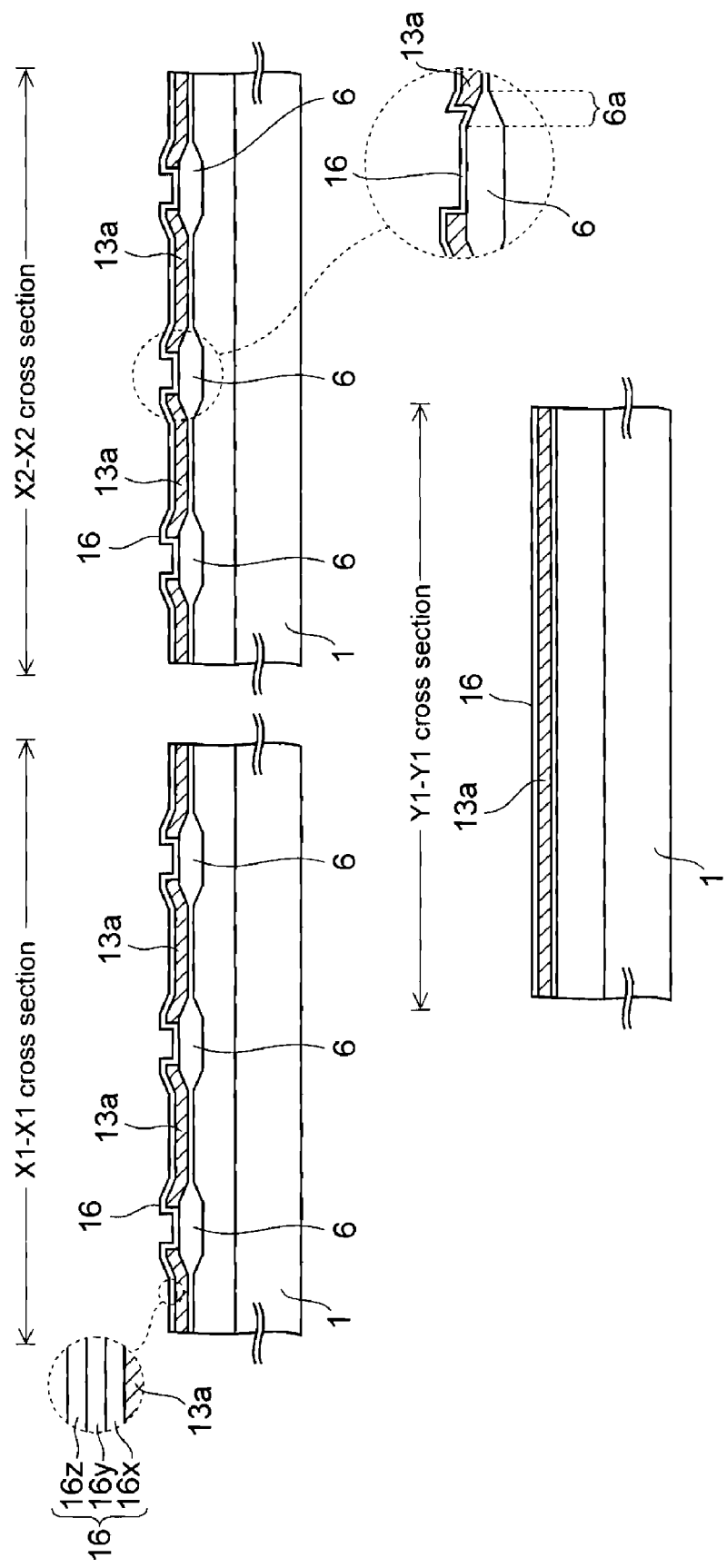

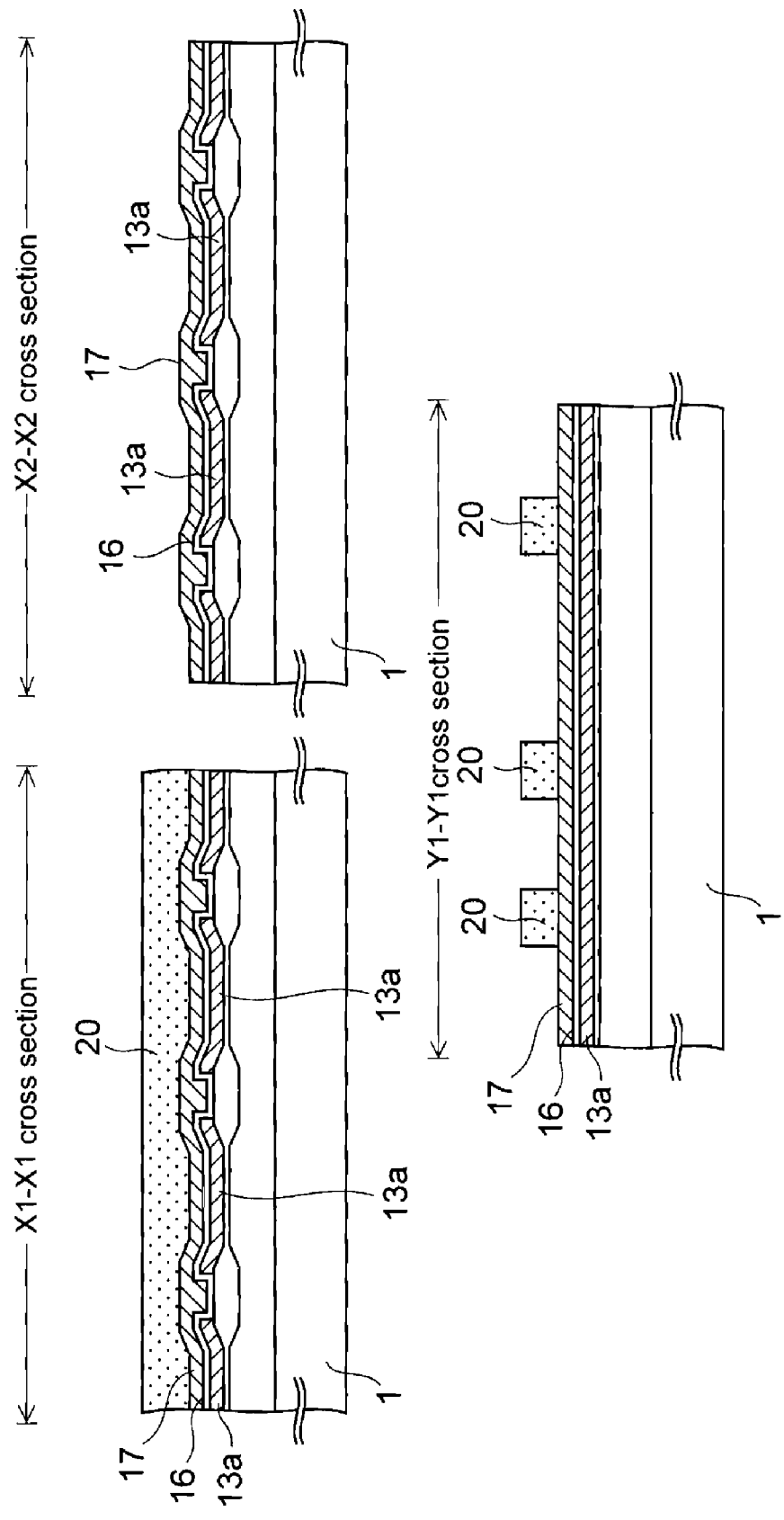

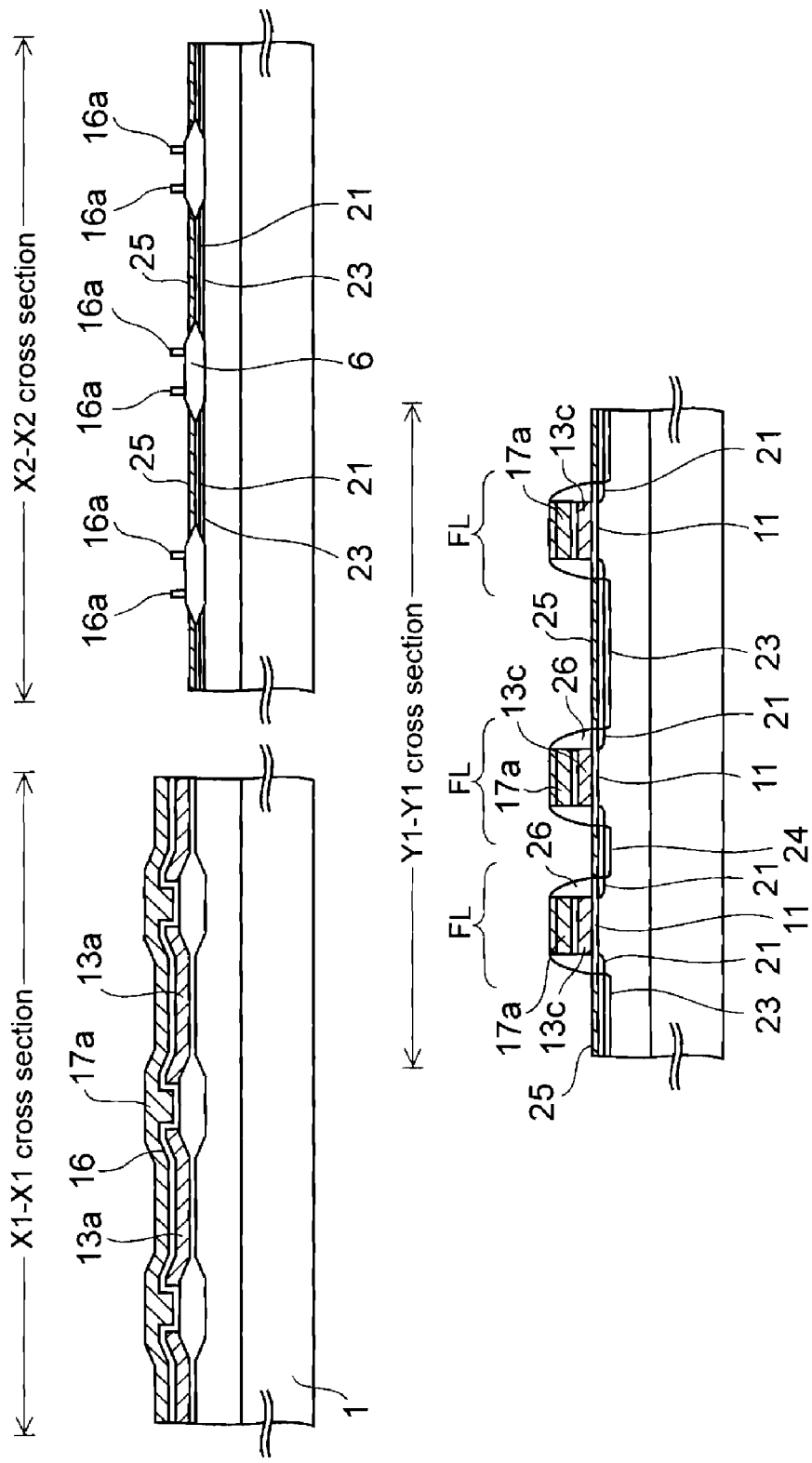

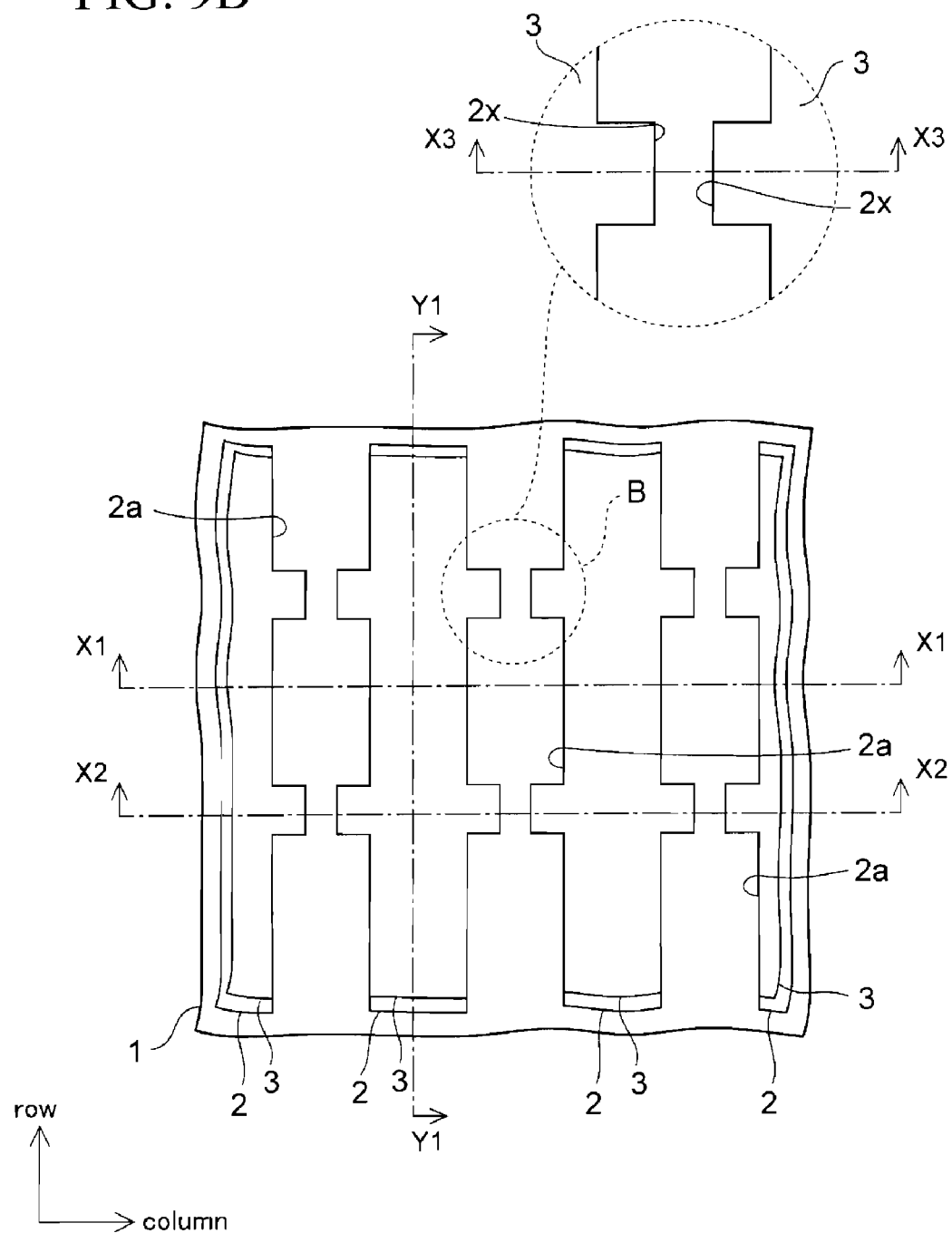

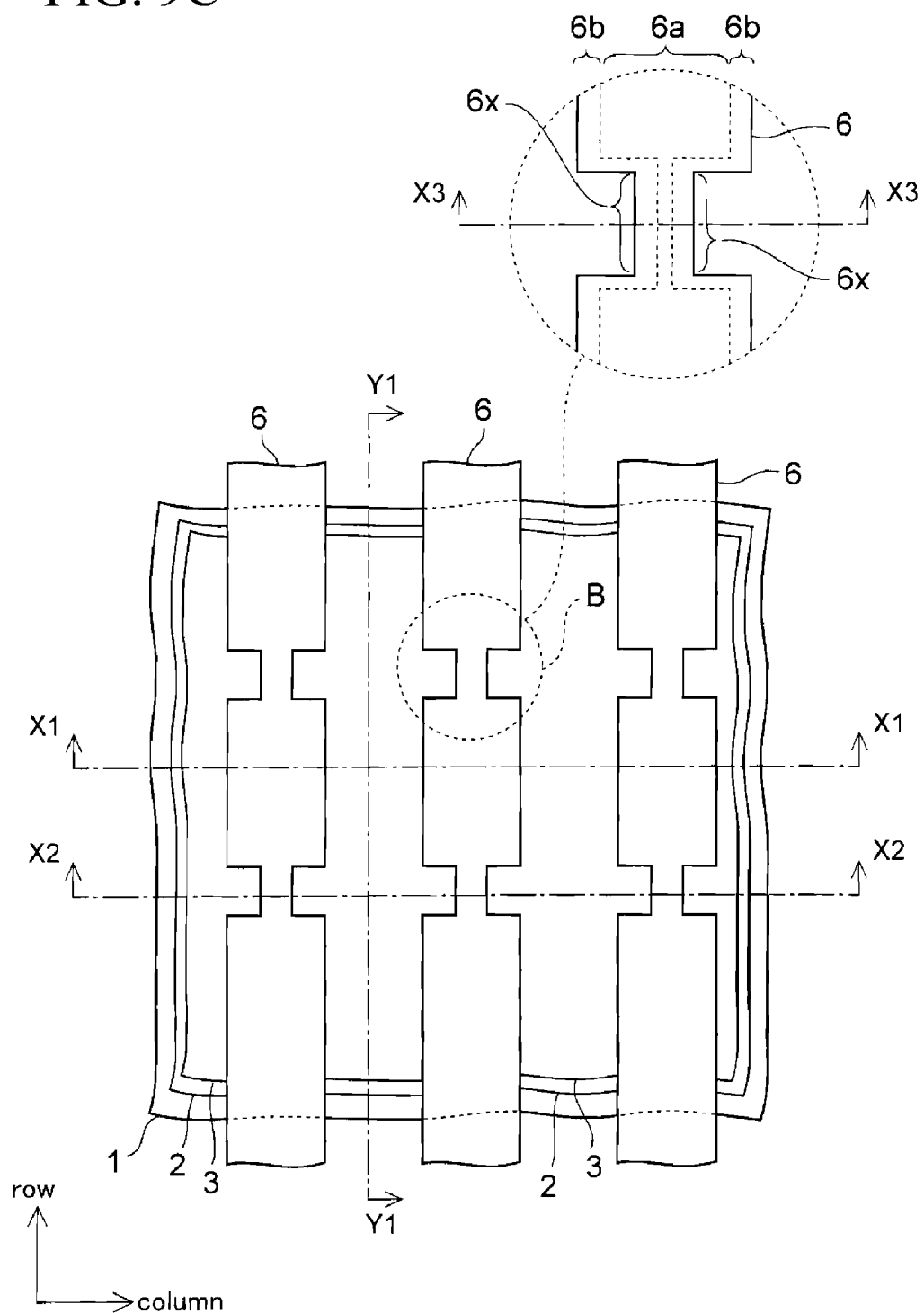

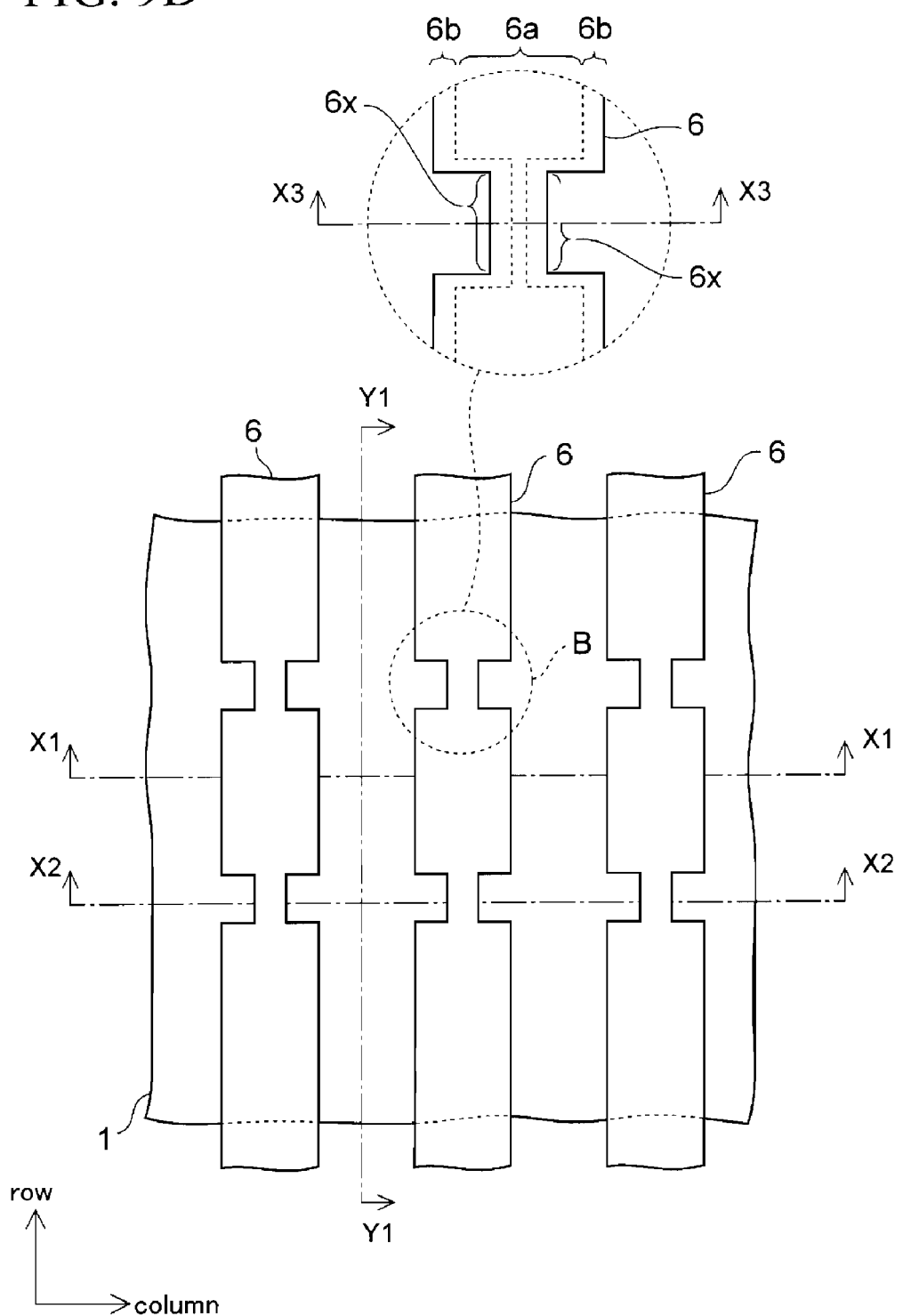

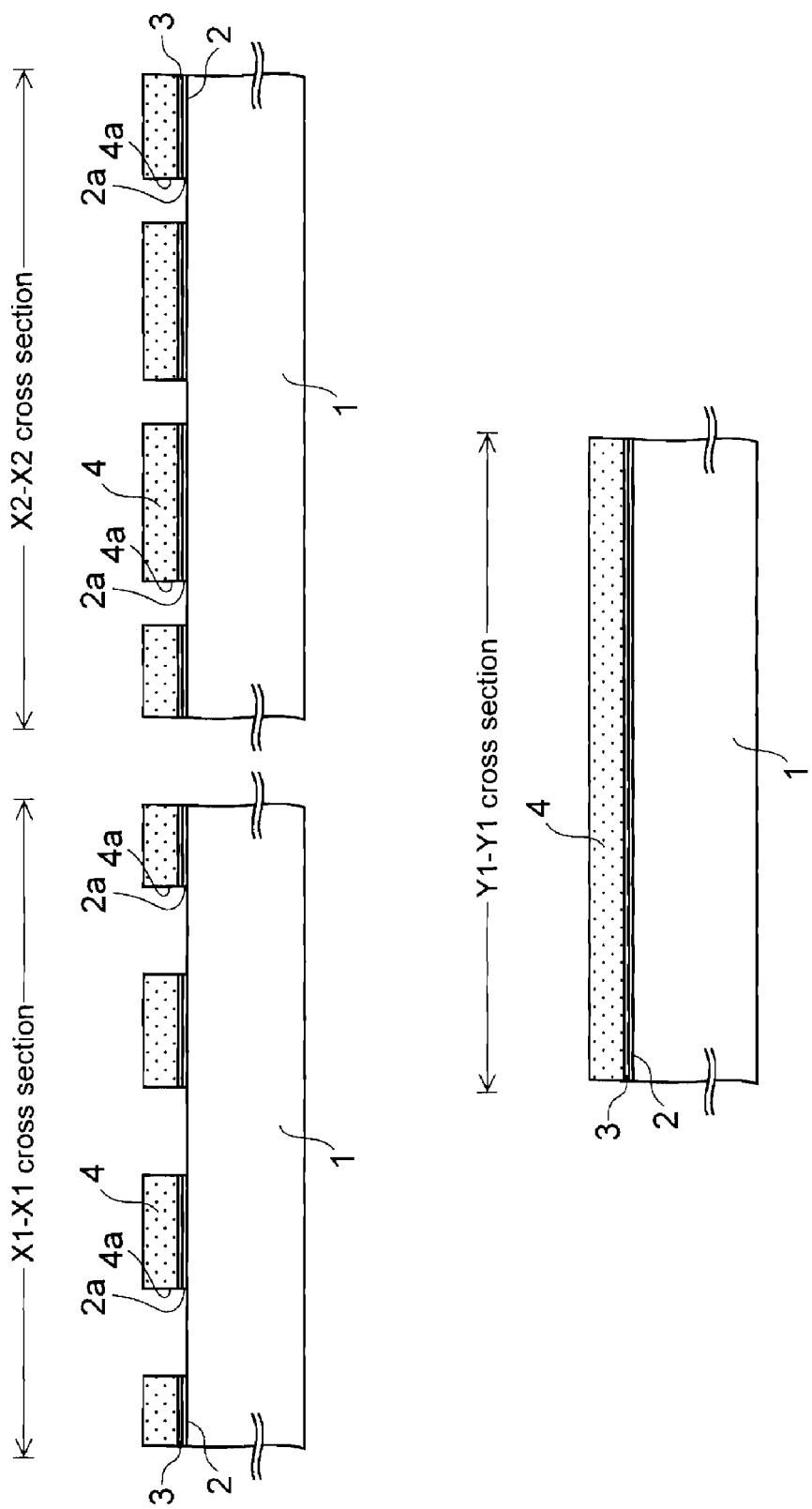

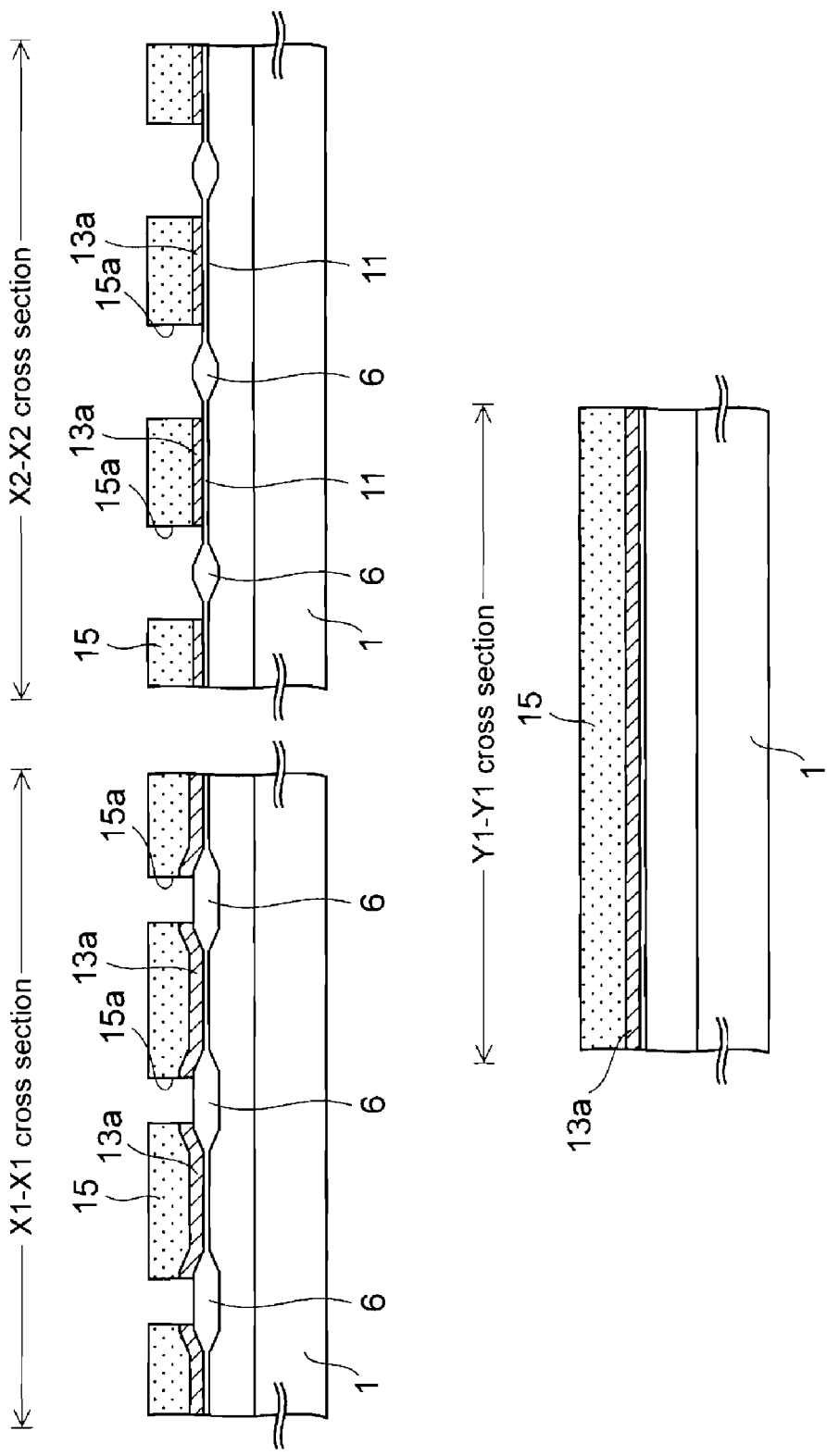

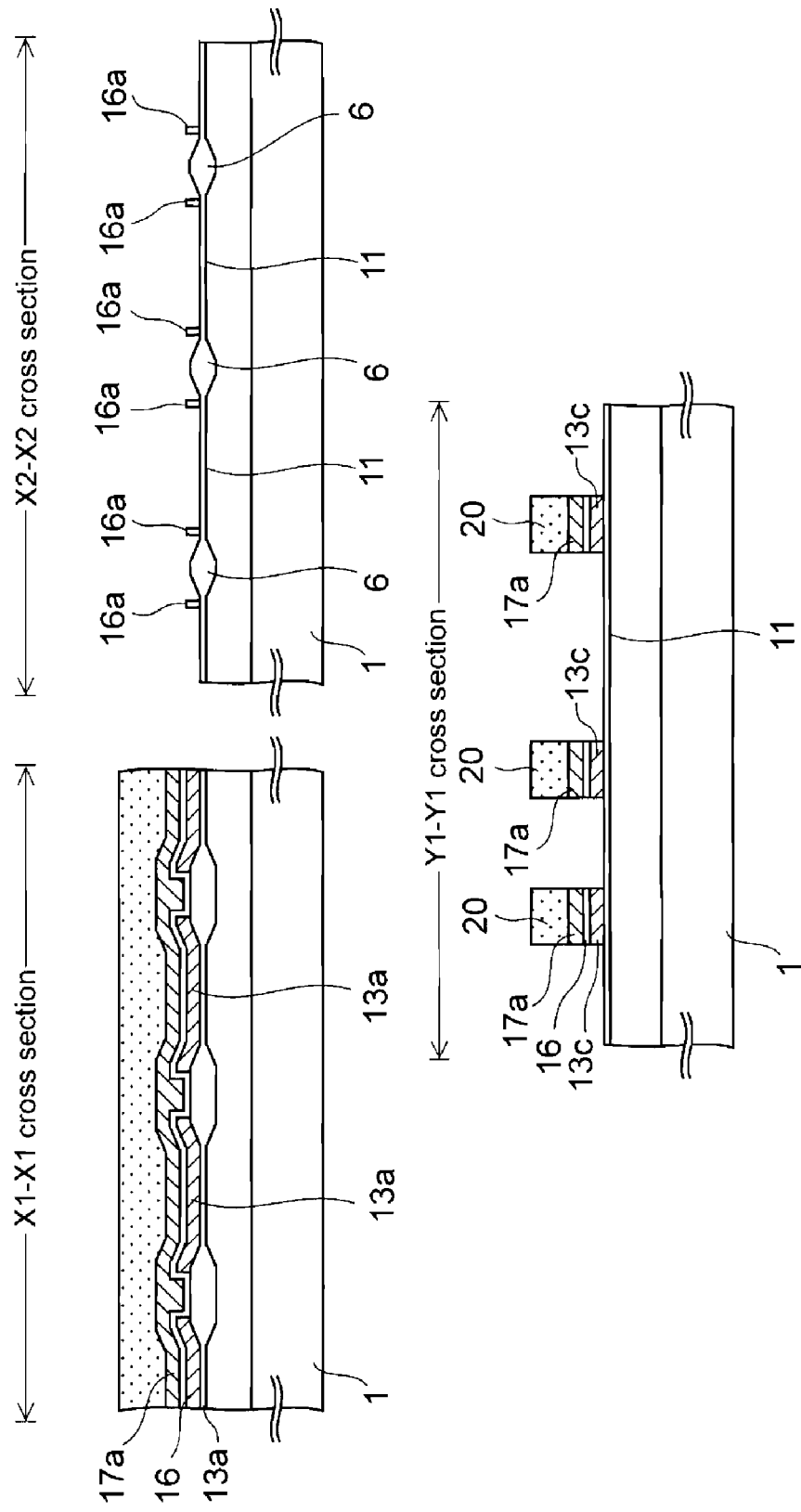

SEMICONDUCTOR DEVICE AND METHOD FOR MANUFACTURING THE SAME

CROSS-REFERENCE TO RELATED APPLICATIONS

This application is based upon prior International Patent Application No. PCT/JP2007/55666, filed on Mar. 20, 2007, the entire contents of which are incorporated herein by reference.

FIELD

It is related to a semiconductor device and a method for manufacturing the semiconductor device.

BACKGROUND

There are various types of nonvolatile memories formed on semiconductor substrates. Among those, a flash memory, which stores information by accumulating electrons in a floating gate, is generally and widely used due to the merits that higher integration can be achieved.

Such flash memory includes an ONO film and a control gate which are formed on a floating gate. Of these films, unnecessary ONO film at portions between cells is desired to be removed by etching. In reality, however, some portions of the ONO film between the cells are not etched due to a step of an underlying layer, so that the etching residues of ONO film remain.

For example, in Japanese Laid-open Patent Publication No. 05-267683, in order to solve a problem that a residue of an ONO film causes an electric short-circuit between adjacent floating gates and thereby lowers a yield, the ONO film is formed after insulating side walls are formed on side surfaces of the floating gates. In this way, the etching residue of the ONO film is unlikely to be left.

However, when the insulating side walls are newly formed in this manner, the number of manufacturing processes is increased, which in turn increases the manufacturing cost of a semiconductor device.

SUMMARY

According to one aspect discussed herein, a semiconductor device includes a semiconductor substrate, device isolation insulating films formed in the semiconductor substrate, a tunnel insulating film formed over the semiconductor device between the device isolation insulating films, a plurality of floating gates formed in a matrix form over the tunnel insulating film, an intermediate insulating film formed over the floating gates, and a plurality of strip-shaped control gates that are respectively formed over the intermediate insulating films, the control gate collectively covering the plurality of the floating gates aligned in a single column, wherein a residue of the intermediate insulating film is formed to linearly extend over the device isolation insulating film or over the tunnel insulating film in a region between the control gates adjacent in a row direction, and a portion of the residue is located out of a slanting surface of the device isolation insulating film.

According to another aspect discussed herein, a method for manufacturing a semiconductor device includes forming device isolation insulating films in a semiconductor substrate, forming a tunnel insulating film over the semiconductor substrate between the device isolation insulating films, forming a first conductive film over the device isolation insulating films and the tunnel insulating film, patterning the first conductive film to make the first conductive film into a plurality of conductive patterns separated from one another over the device isolation insulating films, forming an intermediate insulating film over the device isolation insulating films and the conductive patterns, forming a second conductive film over the intermediate insulating film, patterning the second conductive film, the intermediate insulating film, and the plurality of conductive patterns to make the plurality of conductive patterns into a plurality of floating gates in a matrix form, and to make the second conductive films into a plurality of strip-shaped control gates each collectively covering the plurality of the floating gates aligned in a single column, wherein, in a region between the control gates adjacent in a row direction, an edge of a plan layout of either the conductive pattern or the device isolation insulating film is bent.

BRIEF DESCRIPTION OF THE DRAWINGS

FIGS. 9A to 9F are plan views of a semiconductor device according to a third embodiment during the manufacturing thereof;

FIGS. 11A to 11G are cross-sectional views of the semiconductor device according to the third embodiment during the manufacturing thereof;

DESCRIPTION OF EMBODIMENT

Figure 1A:
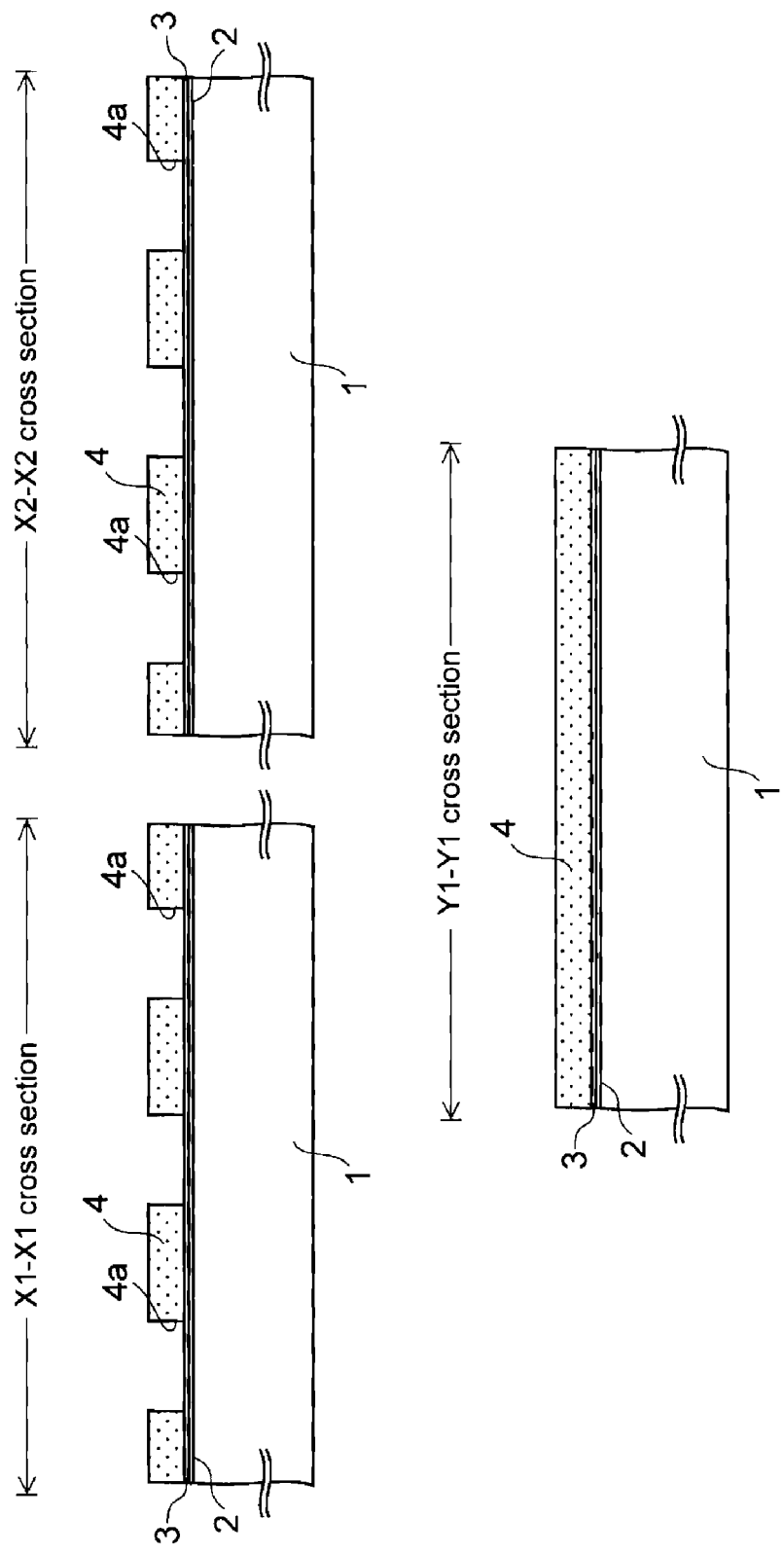
FIGS. 1A to 1P are cross-sectional views of a semiconductor device according to a preliminary explanation during the manufacturing thereof.

FIGS. 1A to 1P are cross-sectional views of a semiconductor device according to a preliminary explanation during the manufacturing thereof. FIGS. 2A to 2G are plan views of this semiconductor. Note that the cross-sectional views in FIGS. 1A to 1P correspond to the cross-sectional views taken along the lines X1-X1, X2-X2, and Y1-Y1 of FIGS. 2A to 2G.

This semiconductor device is a flash memory and is manufactured in the following manner.

Firstly, processes for obtaining a cross-sectional structure depicted in FIG. 1A are described.

Firstly, a thermal oxide film 2 is formed on a surface of a p type silicon substrate 1. Thereafter, a silicon nitride film 3 is formed on the thermal oxide film 2 by a CVD (chemical vapor deposition) method. After that, a photoresist is applied on the silicon nitride film 3. The photoresist is then exposed and developed, so as to form a first resist pattern 4 including windows 4a.

Figure 2A:
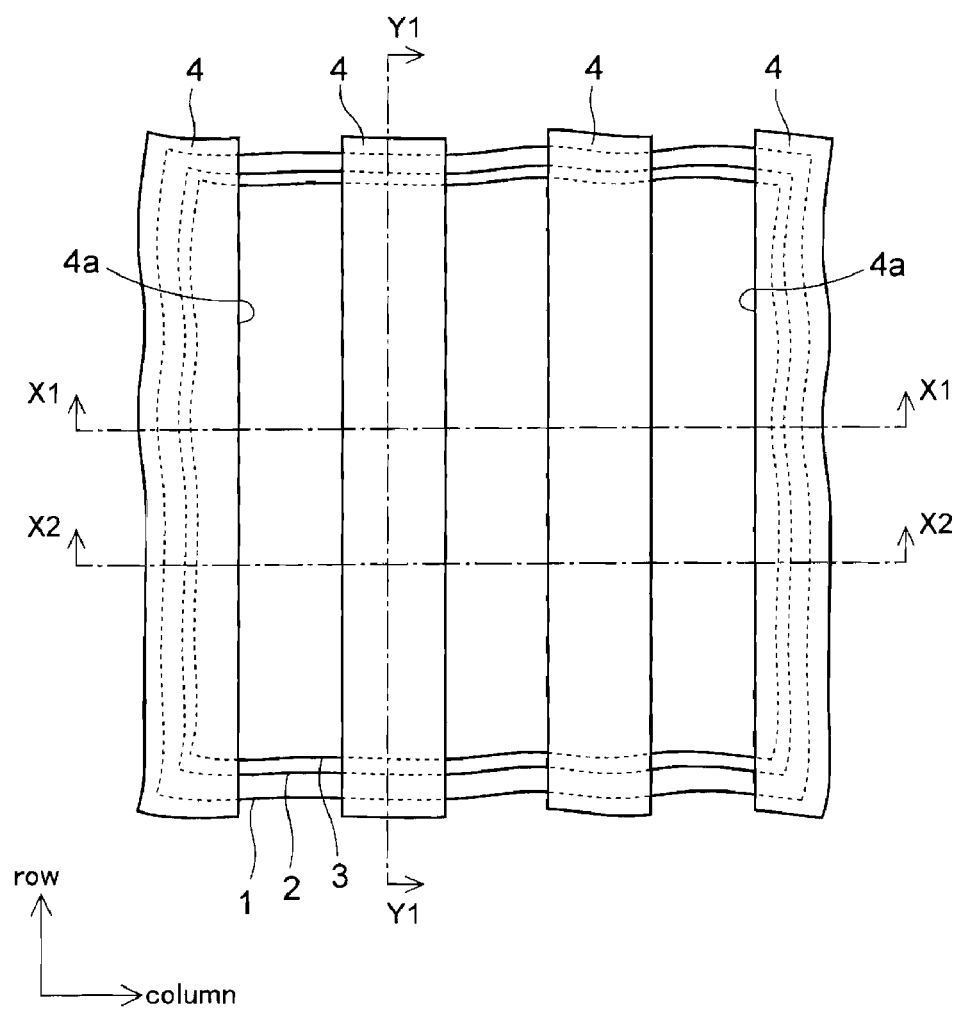
FIGS. 2A to 2G are plan views of the semiconductor device according to the preliminary explanation during the manufacturing thereof.

FIG. 2A is a plan view after this process is finished. As depicted in FIG. 2A, each window 4a of the first resist pattern 4 has a strip-shaped planar shape extending in a row direction.

Figure 1B:
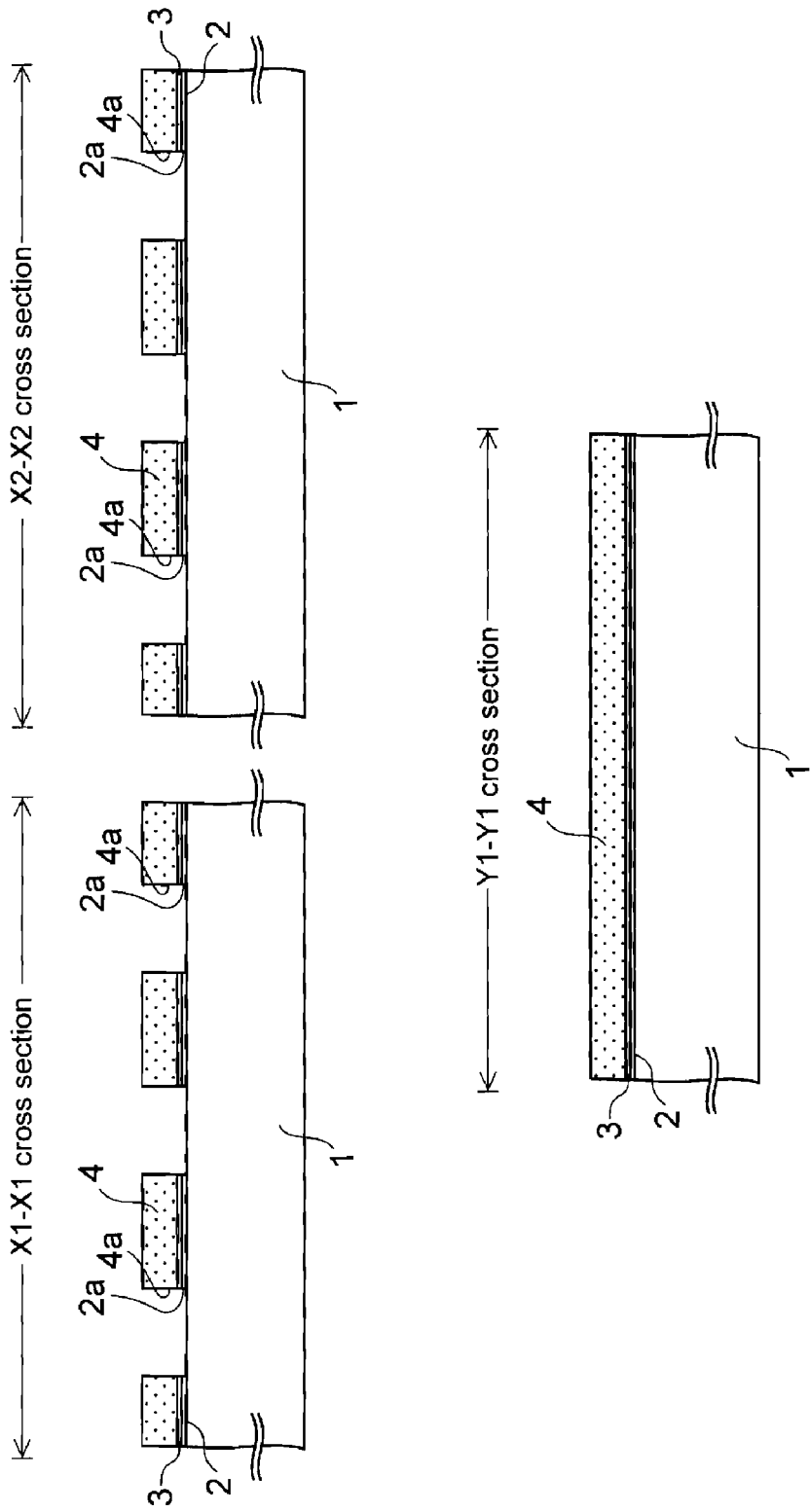

Subsequently, as depicted in FIG. 1B, the silicon nitride film 3 is dry-etched through the windows 4a so as to form openings having shapes corresponding respectively to the windows 4a, in the silicon nitride film 3. Furthermore, the thermal oxide film 2 which is exposed through the openings is removed by dry etching, so that openings 2a as depicted in FIG. 1B are formed in the thermal oxide film 2.

After that, the first resist pattern 2 is removed.

Figure 2B:
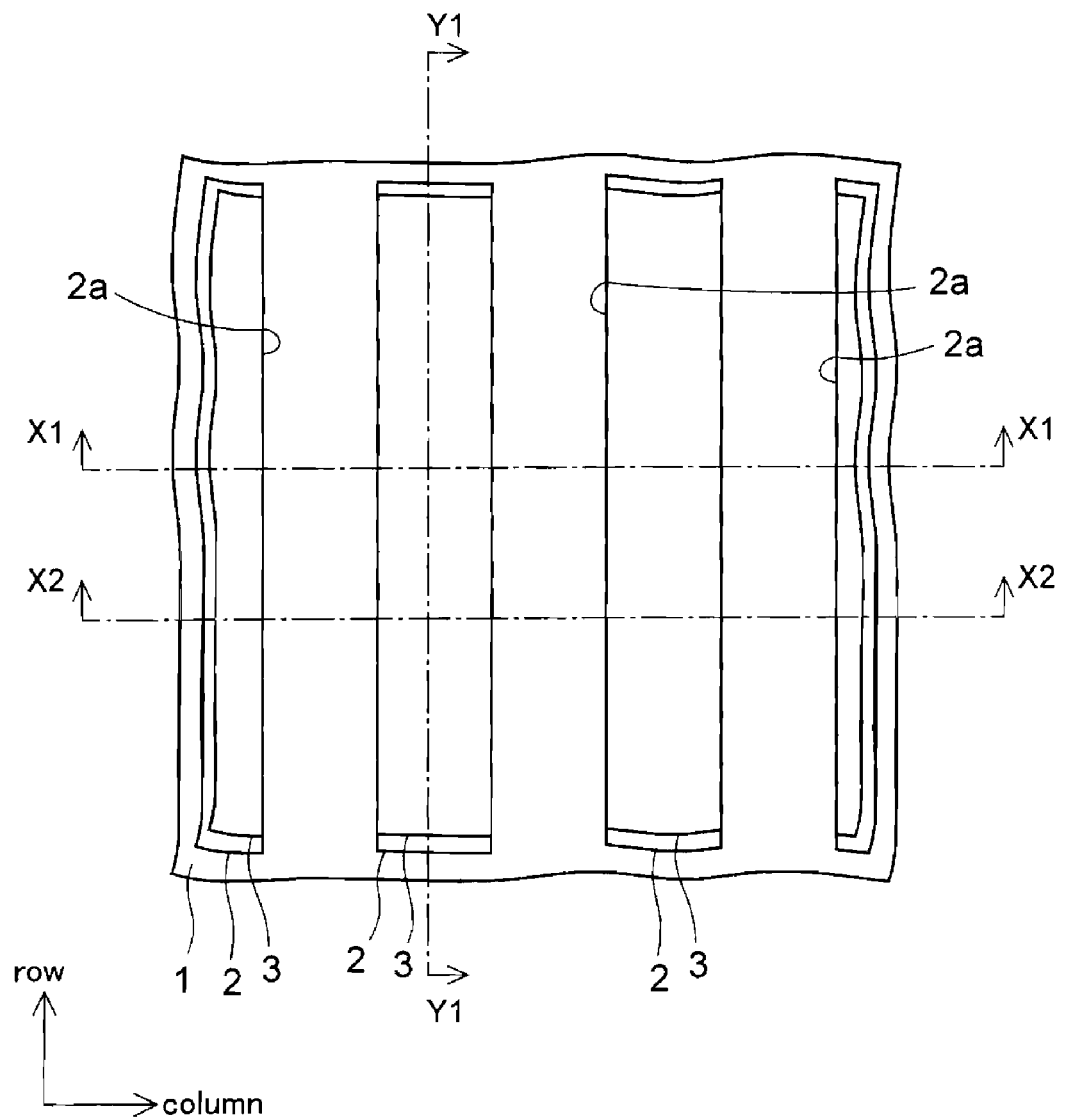

FIG. 2B is a plan view after this process is finished. As depicted in FIG. 2B, the planar shape of each opening 2a is strip-shaped, and extends in the row direction.

Next, as depicted in FIG. 1C, surfaces of the silicon substrate 1, which are exposed respectively through the openings 2a, are thermally oxidized to respectively form device isolation insulating films 6 each formed of a field oxide film. Such a device isolation structure is also referred to as LOCOS (local oxidation of silicon).

Figure 2C:
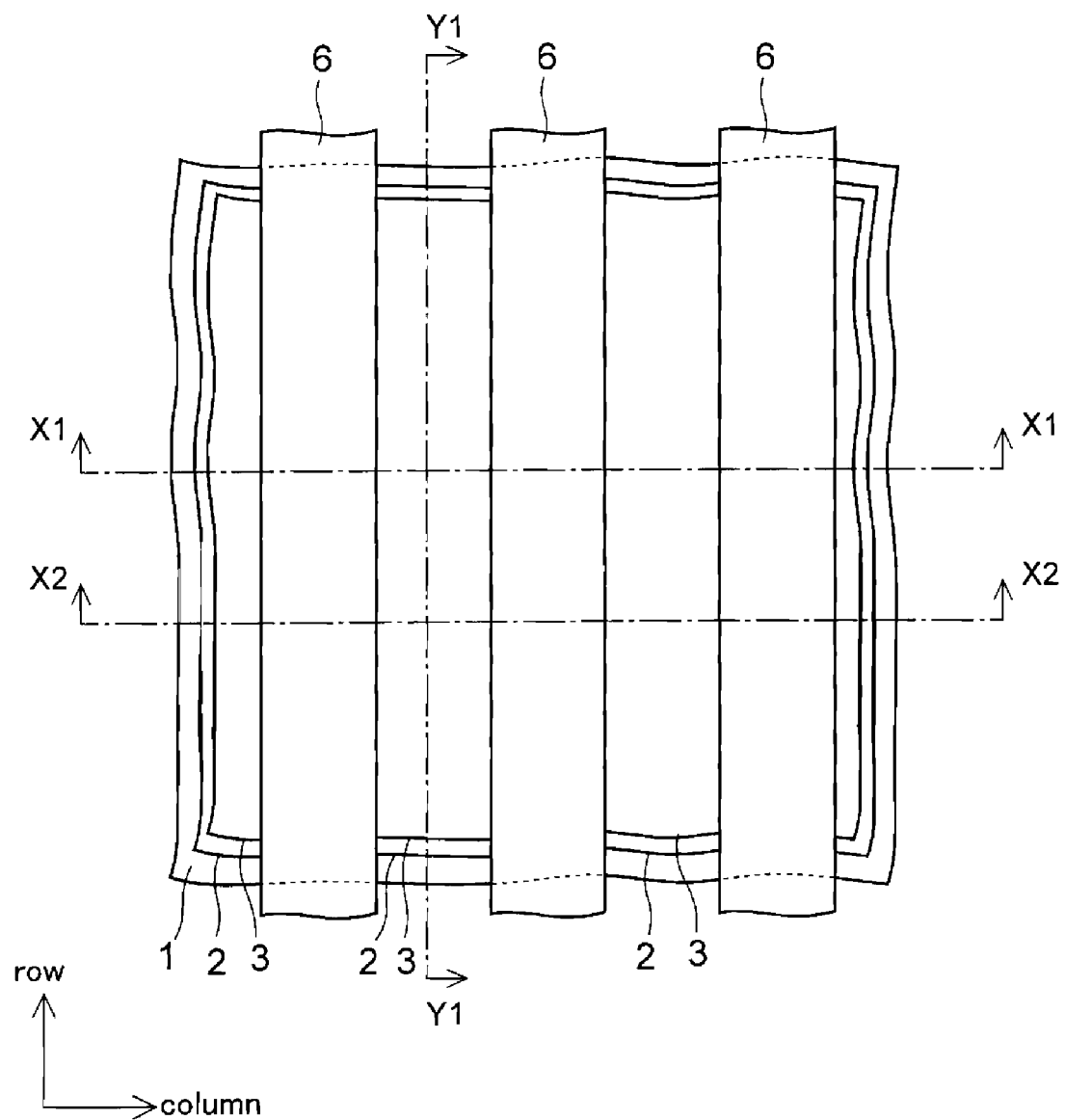

The plan view after this process is finished becomes like FIG. 2C. As depicted in FIG. 2C, each device isolation insulating film 6 has a strip-shaped planar shape extending in the row direction.

Figure 1D:
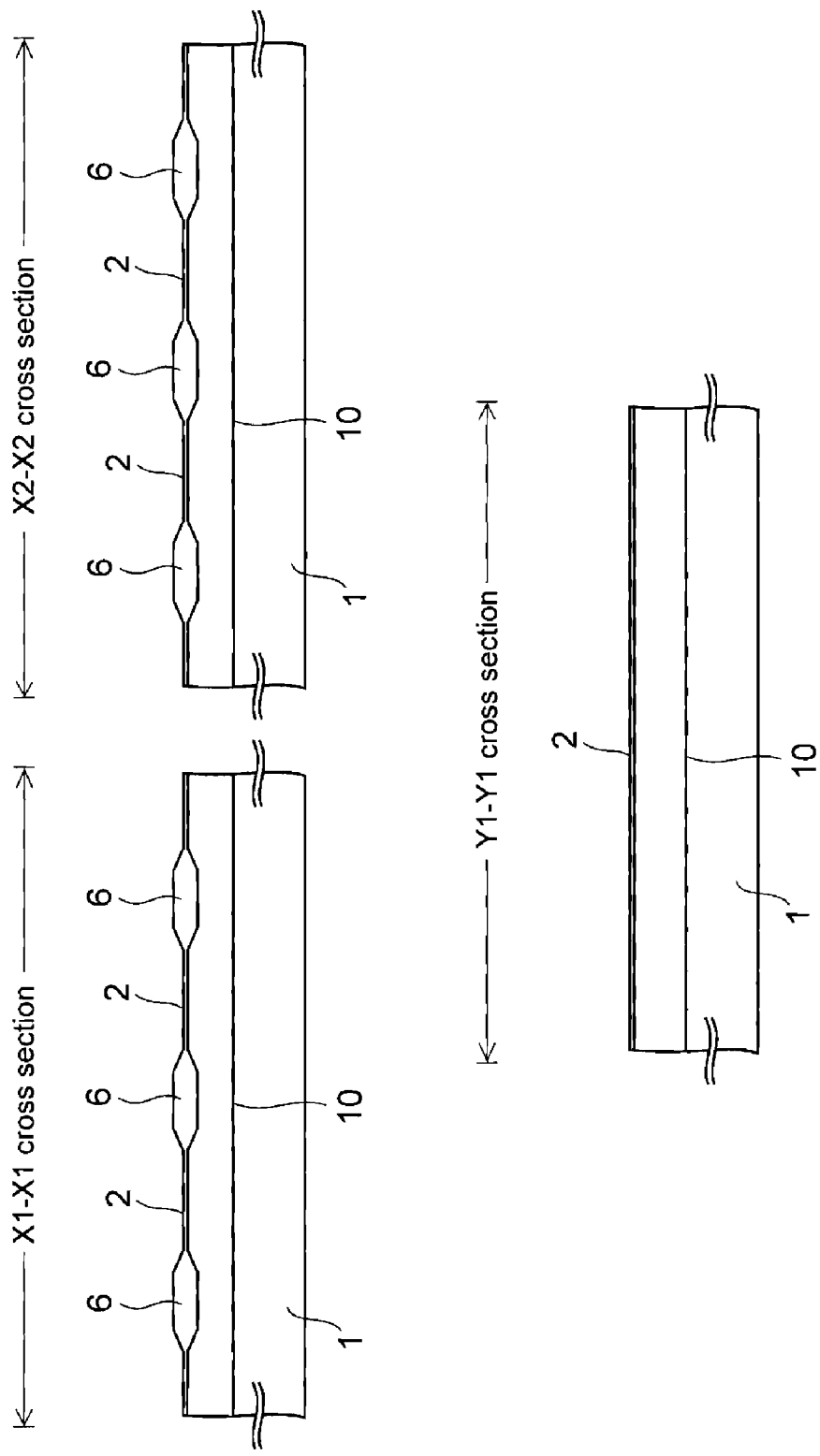

Then, as depicted in FIG. 1D, after the silicon nitride film 3 is removed by dry etching, ions of p type impurities are ion-implanted to a predetermined depth into the silicon substrate 1 with the thermal oxide film 2 being used as a through film. Consequently, a p well 10 is formed.

Furthermore, the thermal oxide film 2 is wet-etched, so that a clean surface of the silicon substrate 1 between the adjacent device isolation insulating films 6 is exposed as depicted in FIG. 1E.

Figure 2D:
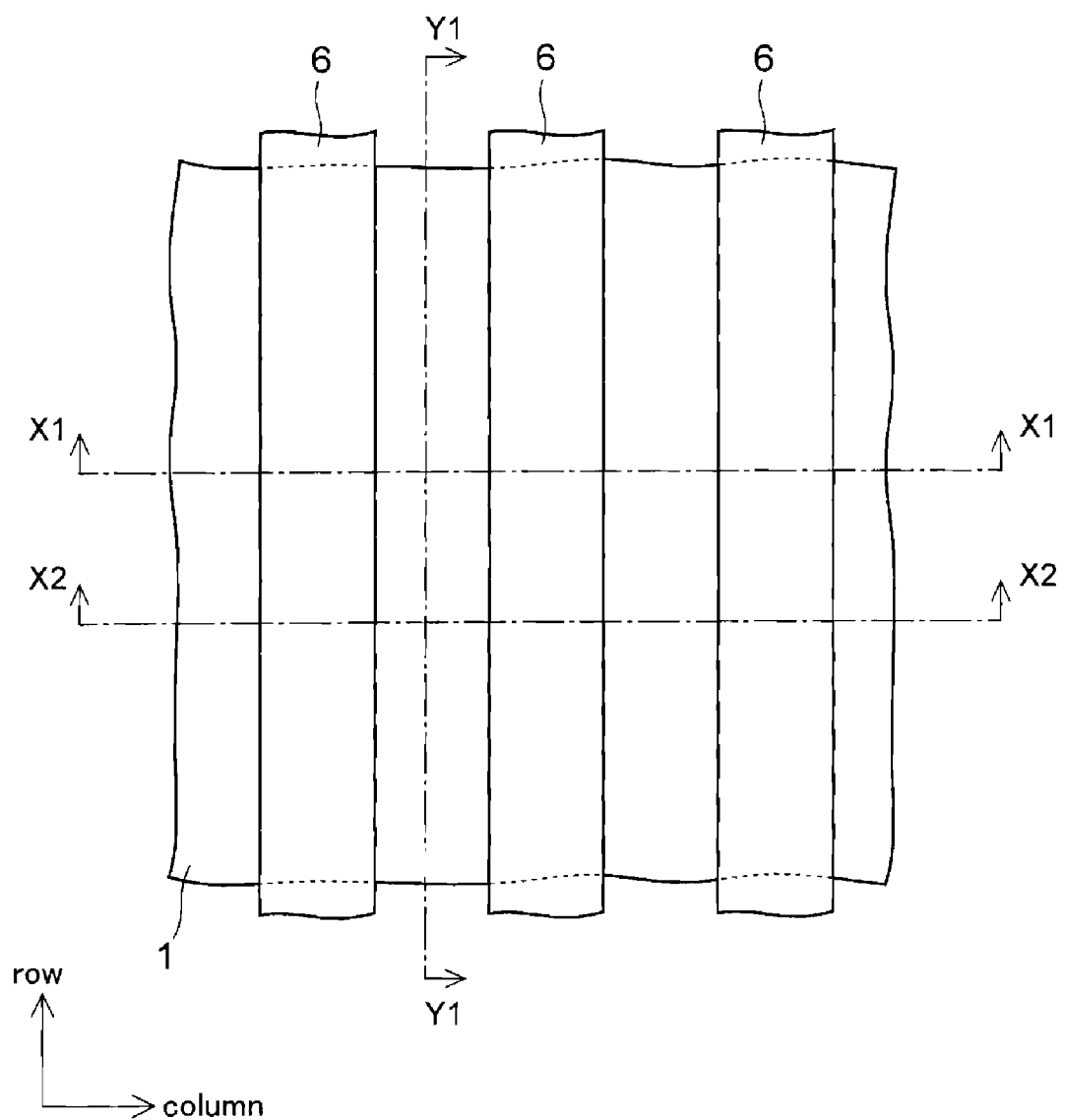

FIG. 2D is a plan view after the processes up to this point are finished.

Figure 1F:
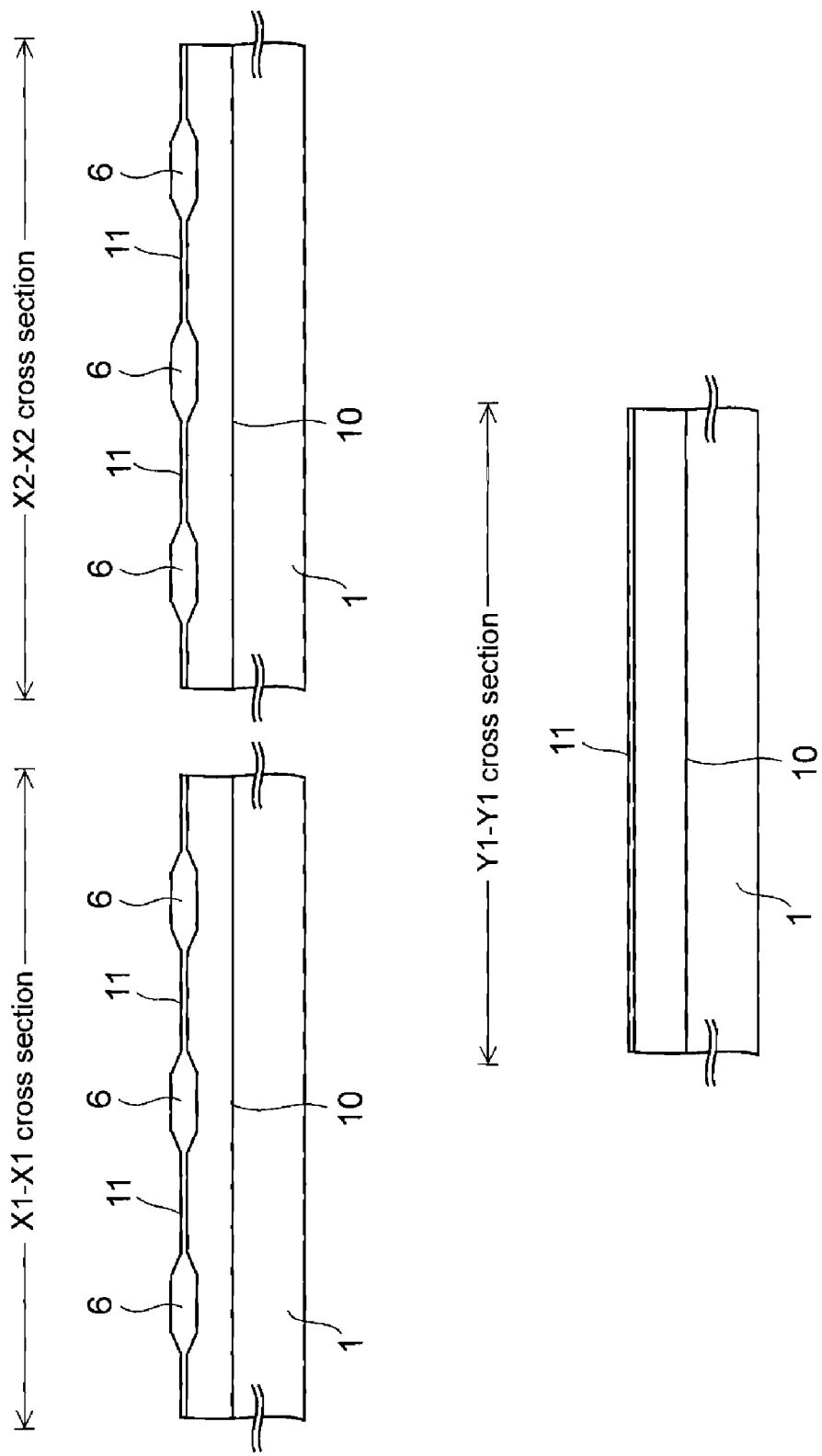

Subsequently, as depicted in FIG. 1F, the clean surface of the silicon substrate 1 which is exposed between the adjacent device isolation insulating films 6 is thermally oxidized to form a thermal oxide film with a thickness of approximately 9 nm. The resultant thermal oxide film serves as a tunnel insulating film 11.

Next, as depicted in FIG. 1G, by a CVD method using a mixed gas of silane ($SiH_4$) and phosphine ($PH_3$), a polysilicon film is formed as a first conductive film 13 with a thickness of approximately 90 nm on the tunnel insulating films 11. Here, the polysilicon film is caused to be an n type by doping phosphorus thereinto at the time of its film formation.

Note that, in place of such a polysilicon film, an amorphous silicon film into which an n type impurity is doped may be formed as the first conductive film 13.

Figure 1H:
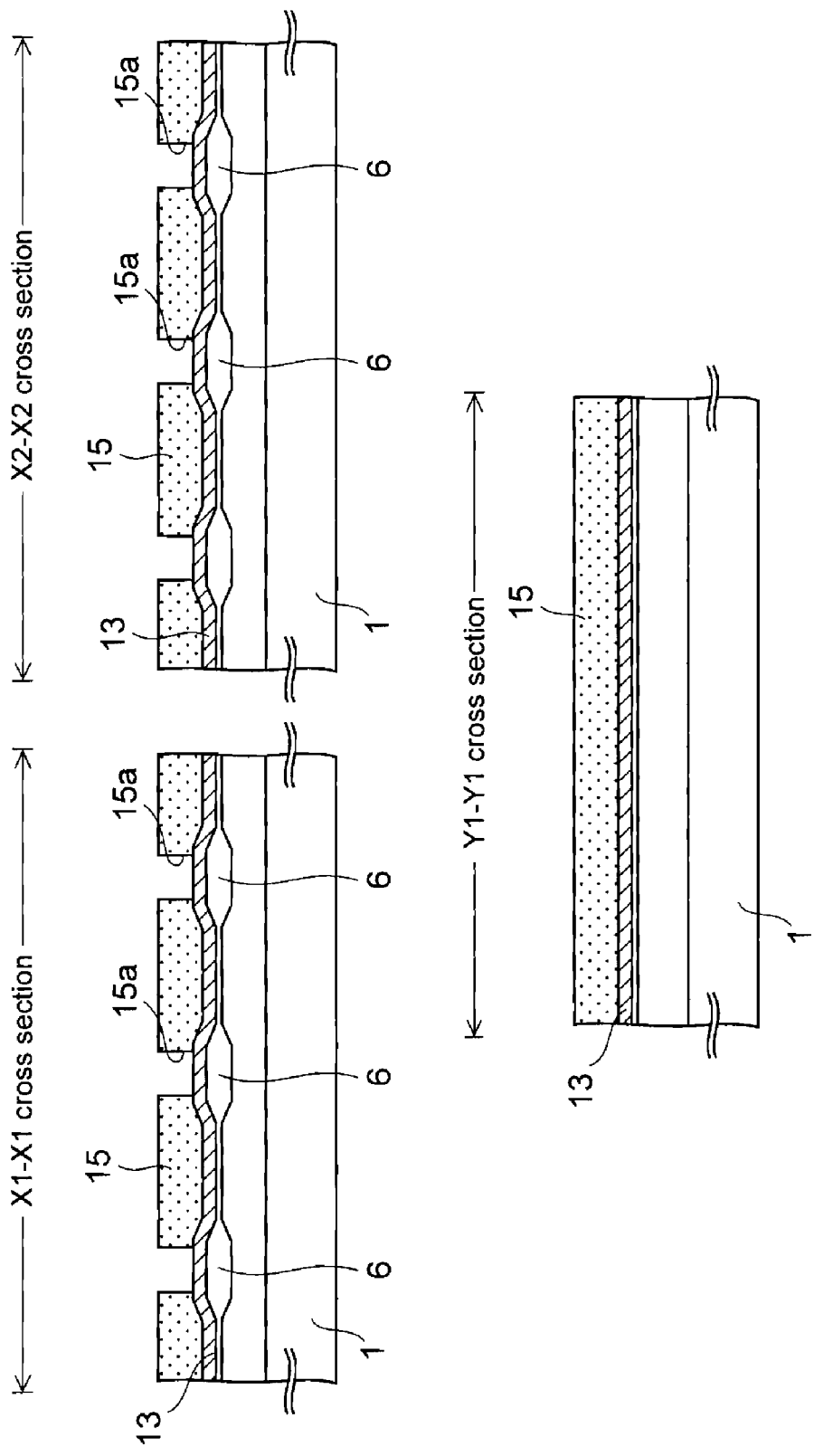

After that, as depicted in FIG. 1H, a photoresist is applied to the entire upper surface of the first conductive film 13. The photoresist is then exposed and developed, so as to form a second resist pattern 15 including windows 15a over the device isolation insulating films 6.

Figure 2E:
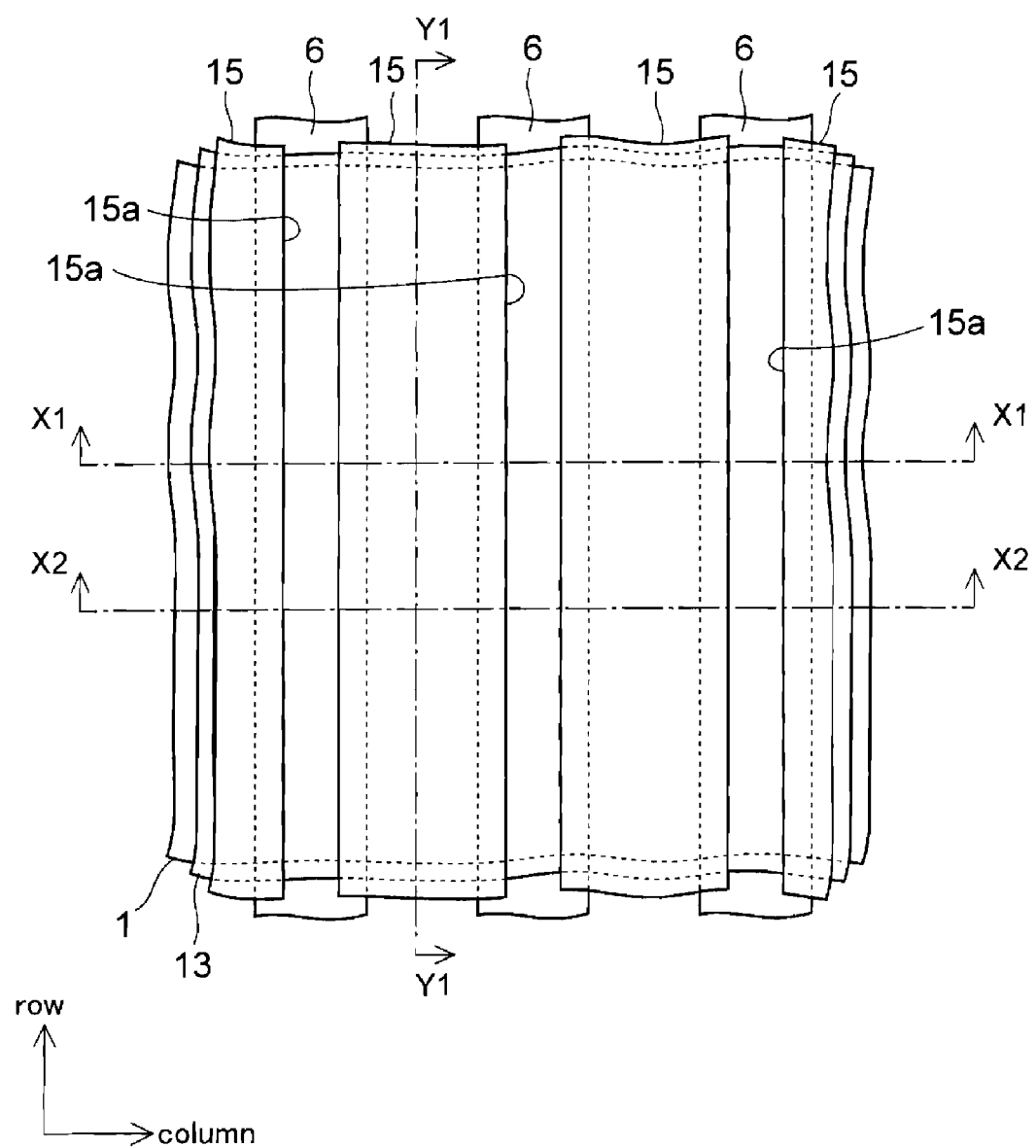

FIG. 2E is a plan view after the second resist pattern 15 is formed in this manner.

Figure 1I:
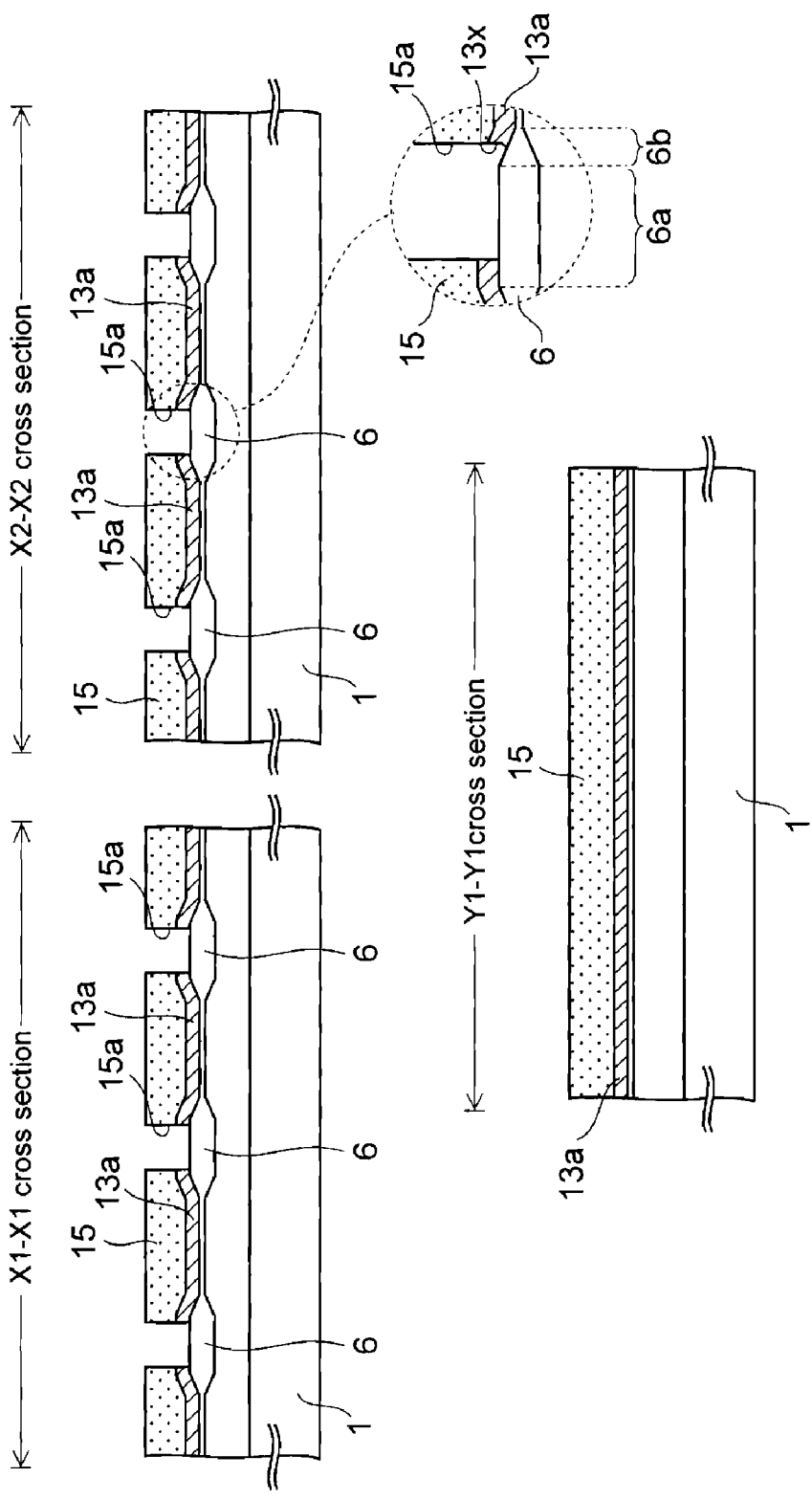

After that, as depicted in FIG. 1I, byusing the second resist pattern 15 as a mask, the first conductive film 13 is dry-etched. The first conductive film 13 thus dry-etched serves as multiple conductive patterns 13a, which are separated from one another on the device isolation insulating films 6.

This dry etching is performed by RIE (reactive ion etching) using a mixed gas of, for example, $Cl_2$ and $O_2$ as an etching gas.

Here, it is ideally preferable that side surfaces of the conductive pattern 13a be positioned on top surfaces 6a of the device isolation insulating films 6. However, in reality, due to misalignment between the conducive pattern 13a and the device isolation insulating film 6, the side surface 13x of the conductive pattern 13a may be positioned, in some cases, on a slanting surface 6b of the device isolation insulating film 6 as depicted in the dotted circle in FIG. 1I.

When the side surface 13x is positioned on the slanting surface 6b in this manner, the side surface 13x at a portion in contact with the slanting surface 6b extends in a trailing manner.

After the etching is finished, the second resist pattern 15 is removed.

Figure 2F:
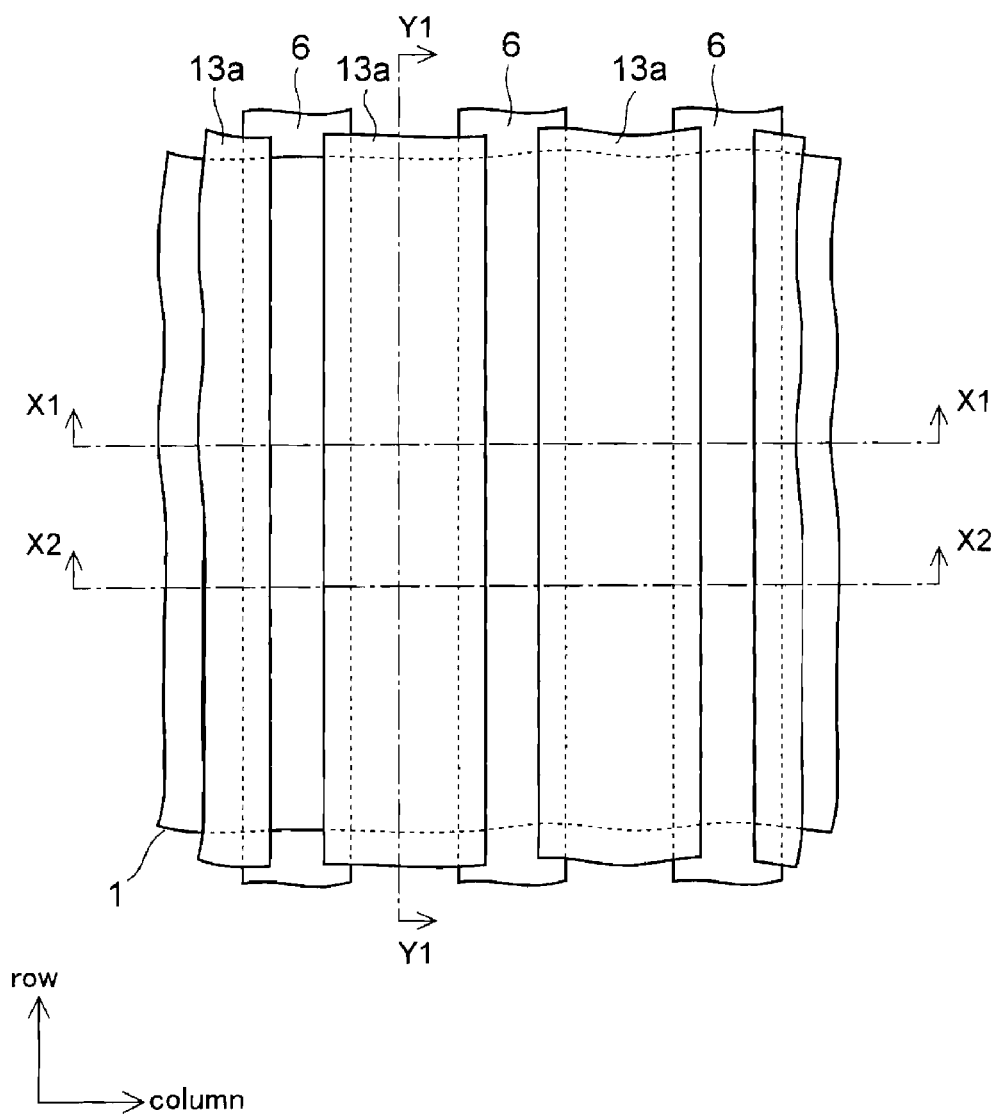

FIG. 2F is a plan view after this process is finished.

As depicted in FIG. 2F, each conductive pattern 13a has a strip-shaped planar shape extending in the row direction and is formed in such a manner that the side surfaces thereof overlap with the device isolation insulating films 6.

Next, as depicted in FIG. 1J, an ONO film is formed, as an intermediate insulating film 16, on each of the device isolation insulating films 6 and the conductive patterns 13a.

The intermediate insulating film 16 is formed by forming a first thermal oxide film 16x, a silicon nitride film 16y, and a second thermal oxide film 16z in this order.

Among these films, the first thermal oxide film 16x is formed by thermally oxidizing the upper surface of the conductive pattern 13a and has a thickness of approximately 8 nm. In addition, the silicon nitride film 16y is formed by a CVD method with a thickness of approximately 10 nm on the first thermal oxide film 16x. Then, the second thermal oxide film 16z is formed by thermally oxidizing the silicon nitride film 16y formed thereunder and has a thickness of approximately 4 nm.

Note that, in place of such an ONO film, an ONONO film which is formed by sequentially forming a silicon nitride film and a silicon oxide film further on the ONO film, or a single-layered silicon oxide film may be formed as the intermediate insulating film 16. This is also the case for first to fourth embodiments to be described later.

Figure 1K:
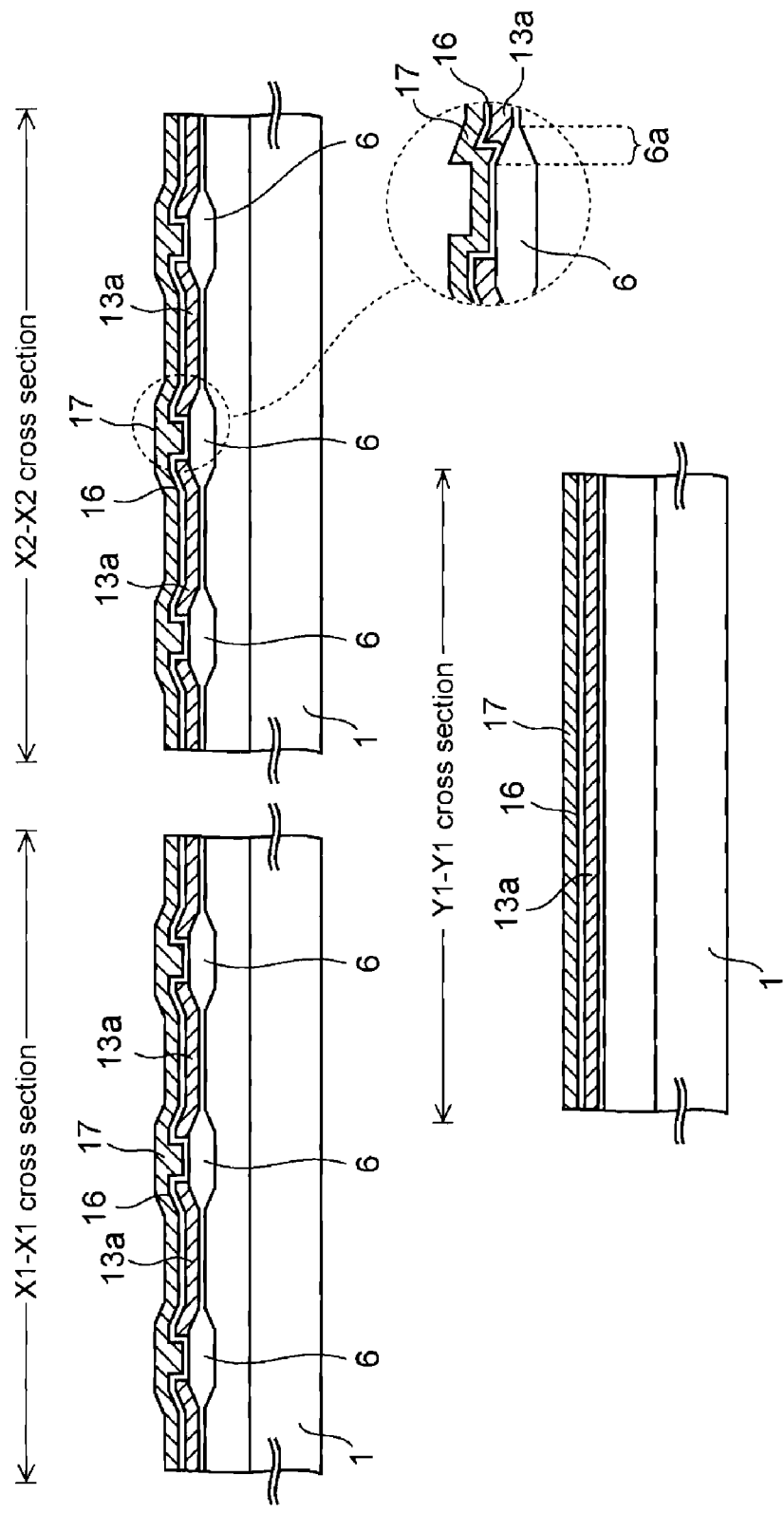

Next, as depicted in FIG. 1K, a polysilicon film with a thickness of approximately 120 nm and a tungsten silicide (WSi) film with a thickness of approximately 150 nm are formed in this order on the intermediate insulating film 16 by a CVD method. These films serve a second conductive film 17.

After that, as depicted in FIG. 1L, a photoresist is applied on the second conductive film 17. The photoresist is then exposed and developed, so as to form a third resist pattern 20. The third resist pattern 20 has a strip-shaped planar shape corresponding to control gates to be described later. Note that a silicon nitride film may be formed as an antireflection film on the second conductive film 17 before the third resist pattern 20 is formed.

Figure 1M:
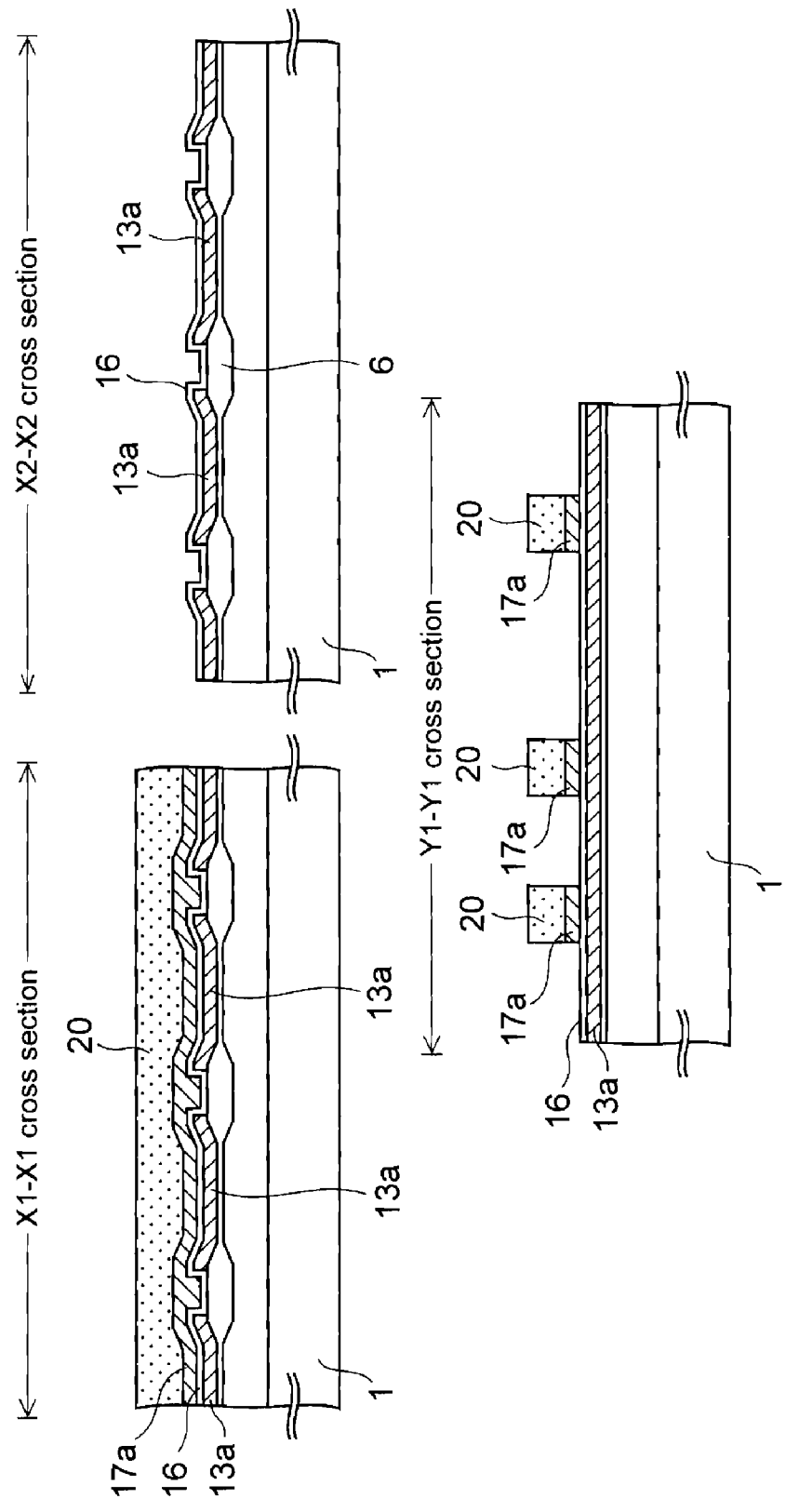

Subsequently, as depicted in FIG. 1M, by using the third resist pattern 20 as a mask, the second conductive film 17 is dry-etched by RIE using a mixed gas of $Cl_2$, $O_2$, and HBr as an etching gas. The second conductive film 17, which is not etched and thus is left, becomes control gates 17a.

Figure 1N:
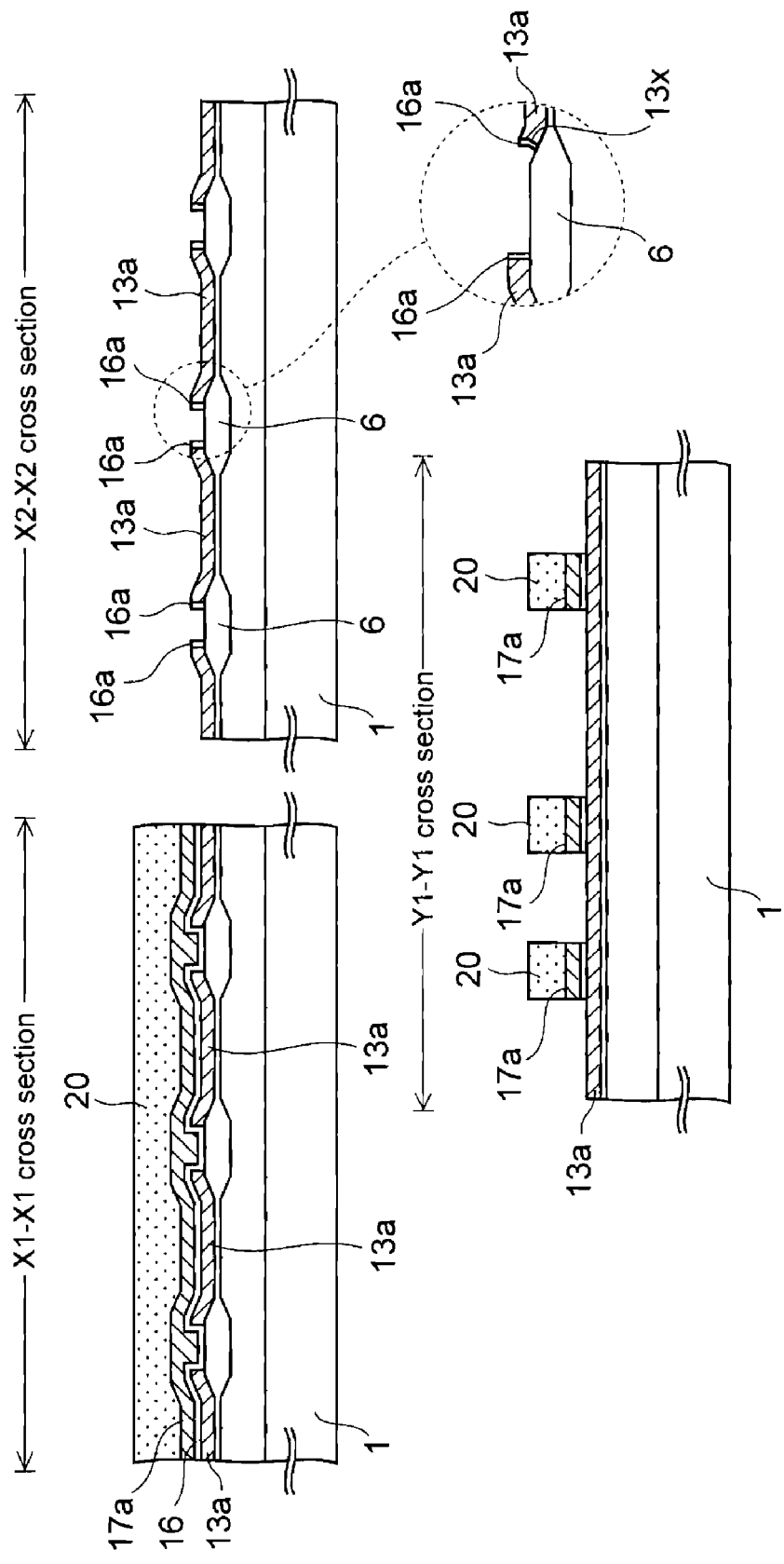
Figure 10:
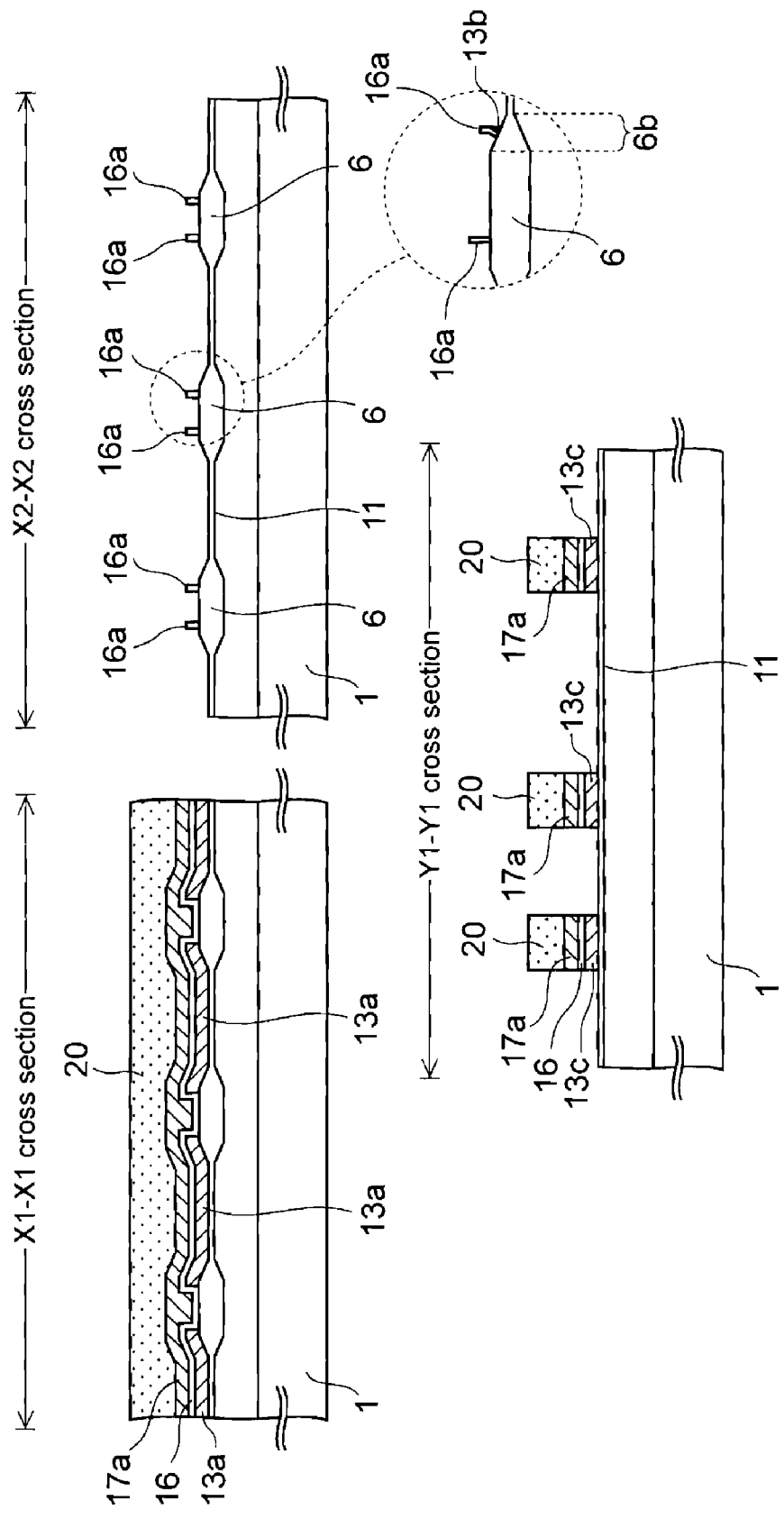
FIGS. 10A to 10F are enlarged cross-sectional views of the semiconductor device according to the third embodiment during the manufacturing thereof.

Furthermore, as depicted in FIG. 1N, the etching gas is changed in the etching chamber used in the above RIE, so that portions of the intermediate insulating film 16 which are not covered with the control gate 17a are removed by etching. In this etching, a mixed gas of, for example, $CF_4$ and Ar is used as an etching gas.

Here, this etching is anisotropic etching in which the etching rate is greatest in a direction vertical to the upper surface of the silicon substrate 1. Accordingly, the intermediate insulating film 16 formed on the upper surfaces of the conductive patterns 13a can be completely removed by the etching. However, the intermediate insulating film 16 formed on the side surface 13x of the conductive pattern 13a cannot be completely removed, because the film thickness thereof on the side surface 13x in the vertical direction of the silicon substrate 1 is thicker than those in the other portions.

As a result, as depicted in the dotted circle in FIG. 1N, a residue 16a of the intermediate insulating film 16 is left on the side surface 13x of the conductive pattern 13a.

Next, as depicted in FIG. 1O, while using the etching chamber again described above, and changing the etching gas to a mixed gas of $Cl_2$, $O_2$, and HBr, portions of the conductive pattern 13a which are not covered with the third resist pattern 20 are removed by the RIE. The conductive patterns 13a, which are not etched and thus left, serves as floating gates 13c.

As described above, the residues 16a of the intermediate insulating film 16 are left on the device isolation insulating films 6. Moreover, as described by referring to FIG. 1I, the side surface 13x of the conductive pattern 13 is formed on the slanting surface 6b of the device isolation insulating film 6 in the trailing manner. For this reason, when this etching is finished, as depicted in the dotted circle in FIG. 1O, the conductive pattern 13a hidden by the trailing portion of the residue 16a is left unetched. Accordingly, a stringer (a linear residue) 13b of the conductive pattern 13a is left beside the residue 16a.

After that, the third resist pattern 20 is removed.

Figure 2G:
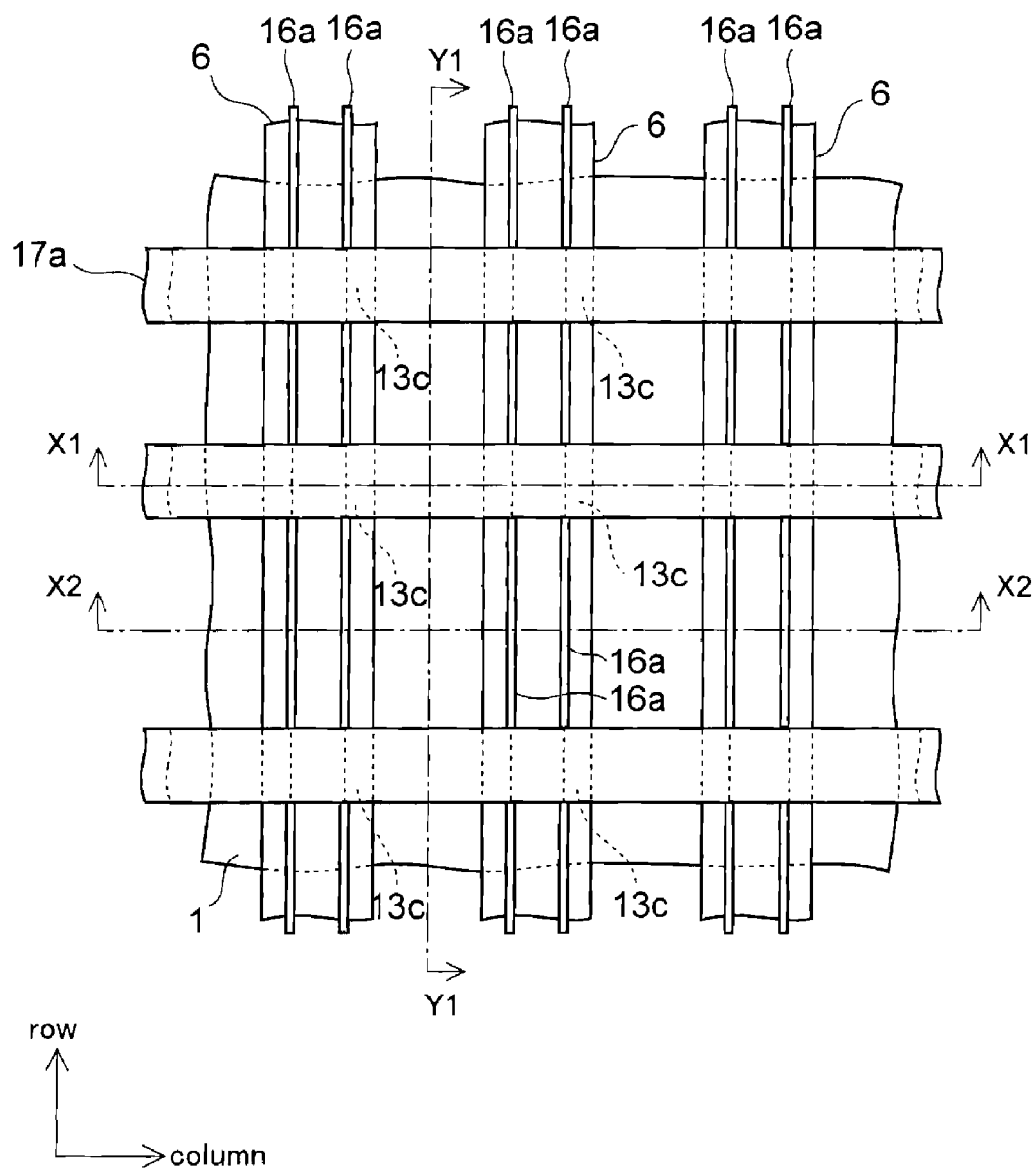

FIG. 2G is a plan view after this process is finished.

As depicted in FIG. 2G, multiple floating gates 13c are formed in a matrix form. In addition, each control gate 17a has a strip-shaped planar shape, which collectively covers the multiple floating gates 13c aligned in a single column.

In addition, the residue 16a extends from one floating gate 13c to the other floating gate 13c, where the floating gates 13c being adjacent in the row direction. Accordingly, when the stringer 13b of the conductive pattern 13a is formed beside the residue 16a as described above, the adjacent floating gates 13c are electrically short-circuited by the stringer 13b.

Next, processes for obtaining a cross-sectional structure depicted in FIG. 1P are described.

Firstly, while using the control gates 17a as masks, ions of n type impurities are ion-implanted into the silicon substrate 1, so that n type source/drain extensions 21 are formed in the silicon substrate 1 beside the floating gates 13c.

Subsequently, an insulating film is formed on the entire upper surface of the silicon substrate 1. The insulating film is then etched back to be left beside each of the control gates 17a as insulating side walls 26. The insulating film is, for example, a silicon oxide film formed by a CVD method.

Thereafter, while using the insulating side walls 26 and the control gates 17a as masks, ions of n type impurities are ion-implanted into the silicon substrate 1. With this, as depicted in FIG. 1P, source lines 24 and drain regions 23 are formed in the silicon substrate 1 beside the floating gates 13c.

Note that the source line 24 is formed in such a way as to extend in a strip-like shape in a direction same as that of the control gates 17a. A portion of the device isolation insulating film 6 which intersects with the source line 24 is removed in advance before the source line 24 is formed.

Furthermore, by a sputtering method, a refractory metal film such as a titanium film is formed on each of the upper surfaces of the silicon substrate 1 and the control gates 17a. Then, the refractory metal film is subjected to annealing to be reacted with silicon, so that a metal silicide layer 25 is formed. After that, the refractory metal film which is left unreacted on the insulating side walls 26 and the like is removed by wet etching.

With the processes described up to this point, formed in the silicon substrate 1 are flash memory cells FL each including the floating gate 13c, the intermediate insulating film 16, the control gate 17a, the source line 24, the drain region 23, and the like.

Thus, the basic structure of the semiconductor device is completed.

In this semiconductor device, as described by referring to FIG. 1O, the side surface of the conductive pattern 13a is formed on the slanting surface 6b of the device isolation insulating film 6 in the trailing manner. As a result, the stringer 13b of the conductive pattern 13a is left beside the residue 16a of the intermediate insulating film 16.

Figure 3:
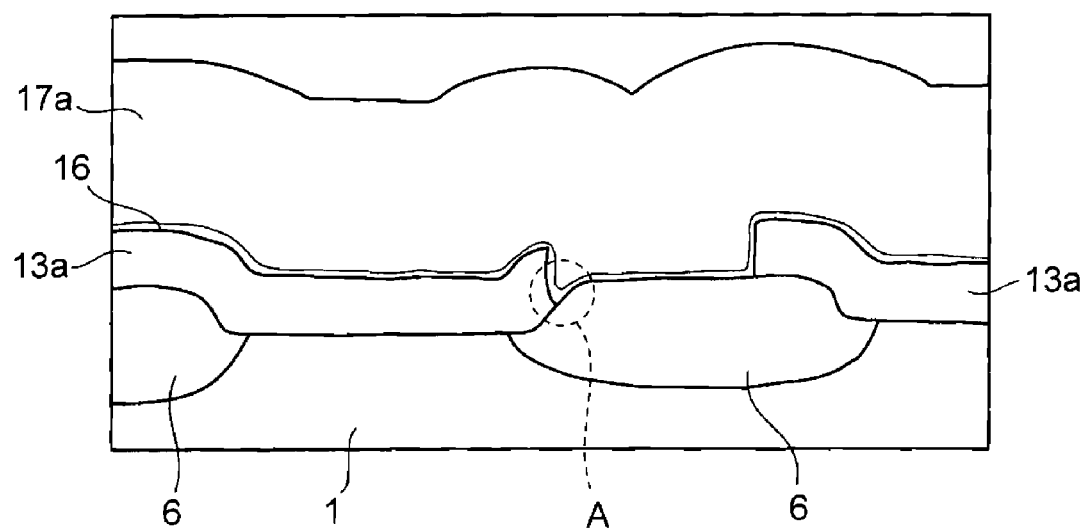
FIG. 3 is a view depicted based on an SEM image of the semiconductor device according to the preliminary explanation.

FIG. 3 is a view drawn based on an SEM (scanning electron microscope) image of this semiconductor device. In the portion A in FIG. 3, the trailing of the conductive pattern 13a occurs.

When such trailing generates in the stringer 13b, floating gates 13c of the flash memory cell FL, which are adjacent in the row direction, are electrically short-circuited. Accordingly, electrons accumulated in one of the floating gates 13c move to the other one of the floating gates 13c through the stringer 13b. Thus, an inversion of memory data or the like is caused, thereby deteriorating the retention characteristic of the flash memory.

In particular, such a problem becomes prominent when misalignment occurs between the device isolation insulating film 6 and the conductive pattern 13a, so that the side surface of the conductive pattern 13a is positioned on the slanting surface 6b of the device isolation insulating film 6.

Figure 14:
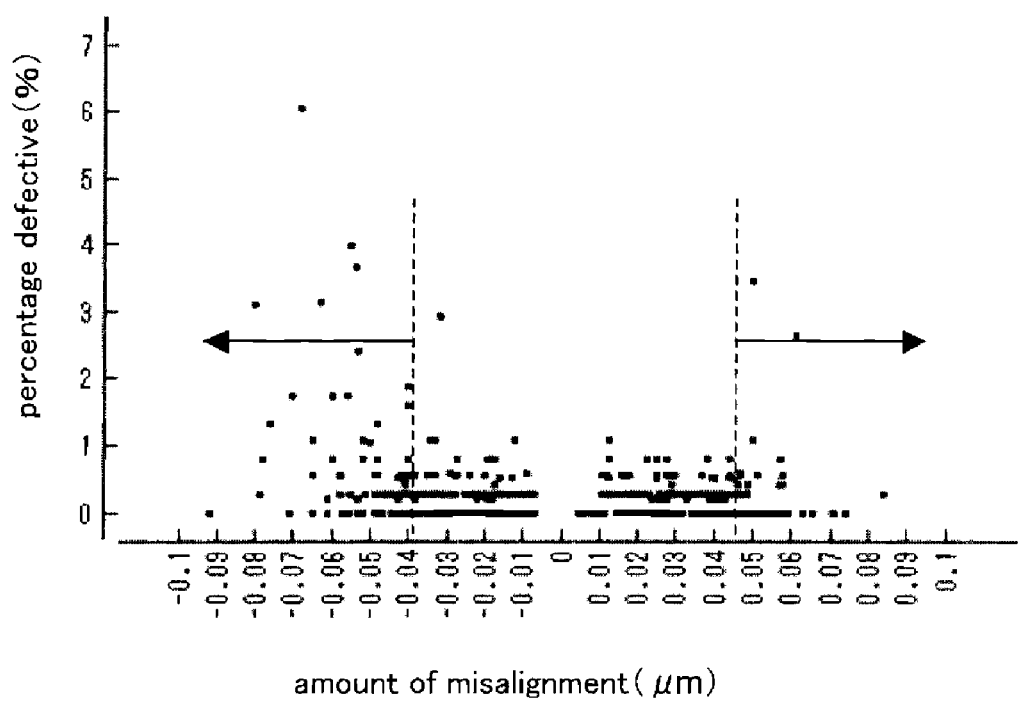
FIG. 14 is a graph obtained by examining a relationship between percentage defective of the semiconductor device and an amount of misalignment between a device isolation insulating film and a conductive pattern.

FIG. 14 is a graph obtained by examining a relationship between percentage defective of the semiconductor device and an amount of misalignment between the device isolation insulating film 6 and the conductive pattern 13a.

Note that, in FIG. 14, it is assumed that the misalignment amount is set to be 0 when the device isolation insulating film 6 and the conductive pattern 13a are positioned as designed, and that the misalignment amount indicates a plus value when the device isolation insulating film 6 is misaligned to the right or left side thereof, for example, to the right side.

As depicted in the graph, the percentage defective is suppressed to low levels when the absolute value of the misalignment amount is 0.04 μm or less. However, when the absolute value of the misalignment amount exceeds 0.04 μm, the increase of the percentage defective becomes prominent.

Thus, the semiconductor device including the flash memory cells is desired to have a structure in which the percentage defective is not increased even when the device isolation insulating film 6 and the conductive pattern 13a are misaligned.

With this taken into consideration, the inventor of the present application has come up with embodiments as described below. Note that, in the figures to be referred to in each of the following embodiments, same reference numerals are given to denote components same as those described in the preliminary explanation, and the descriptions thereof are omitted.

First Embodiment

FIGS. 4A to 4D are plan views of a semiconductor device according to a first embodiment during the manufacturing thereof. In addition, FIGS. 5A to 5D are enlarged cross-sectional views taken along the line X3-X3 of FIGS. 4A to 4D. Furthermore, FIGS. 6A to 6E are cross-sectional views taken along the lines X1-X1, X2-X2, and Y1-Y1 of FIGS. 4A to 4D.

In the present embodiment, while performing the same processes as those described in the preliminary explanation, the plan layout of the second resist pattern 15 is changed as described below, so that a semiconductor device in which the retention characteristic of a flash memory can be improved is manufactured.

Figure 4A:
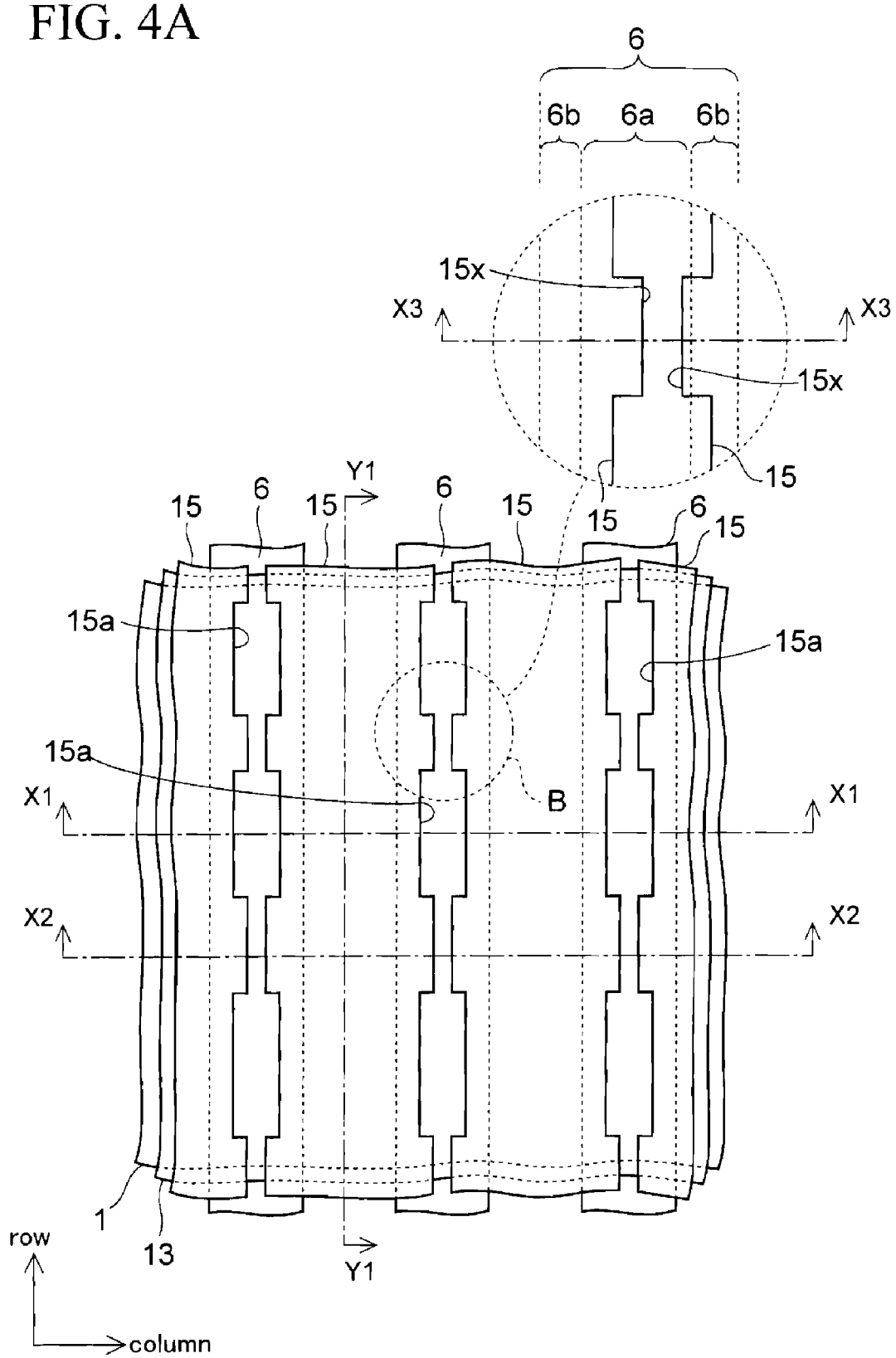
FIGS. 4A to 4D are plan views of a semiconductor device according to a first embodiment during the manufacturing thereof.
Figure 5A:
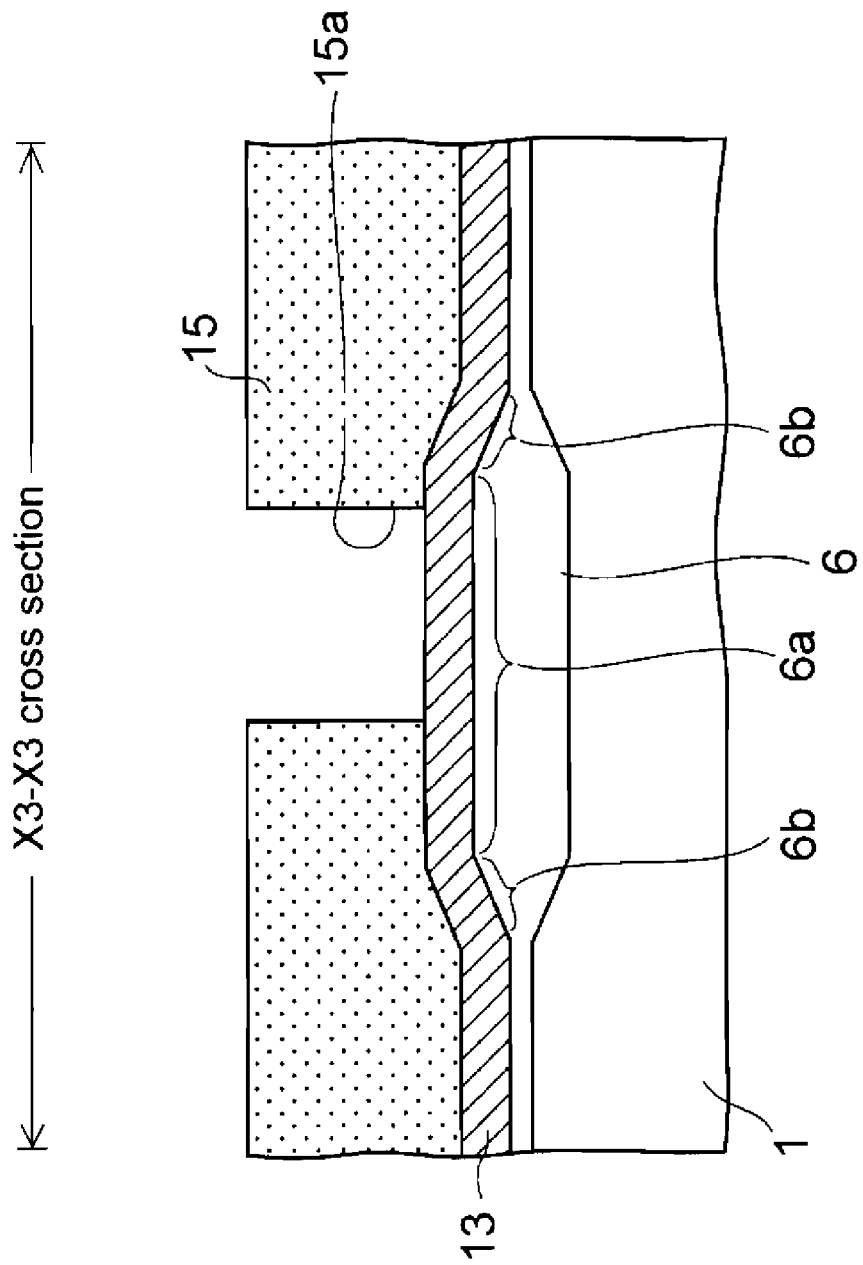
FIGS. 5A to 5D are enlarged cross-sectional views of the semiconductor device according to the first embodiment during the manufacturing thereof.
Figure 6A:
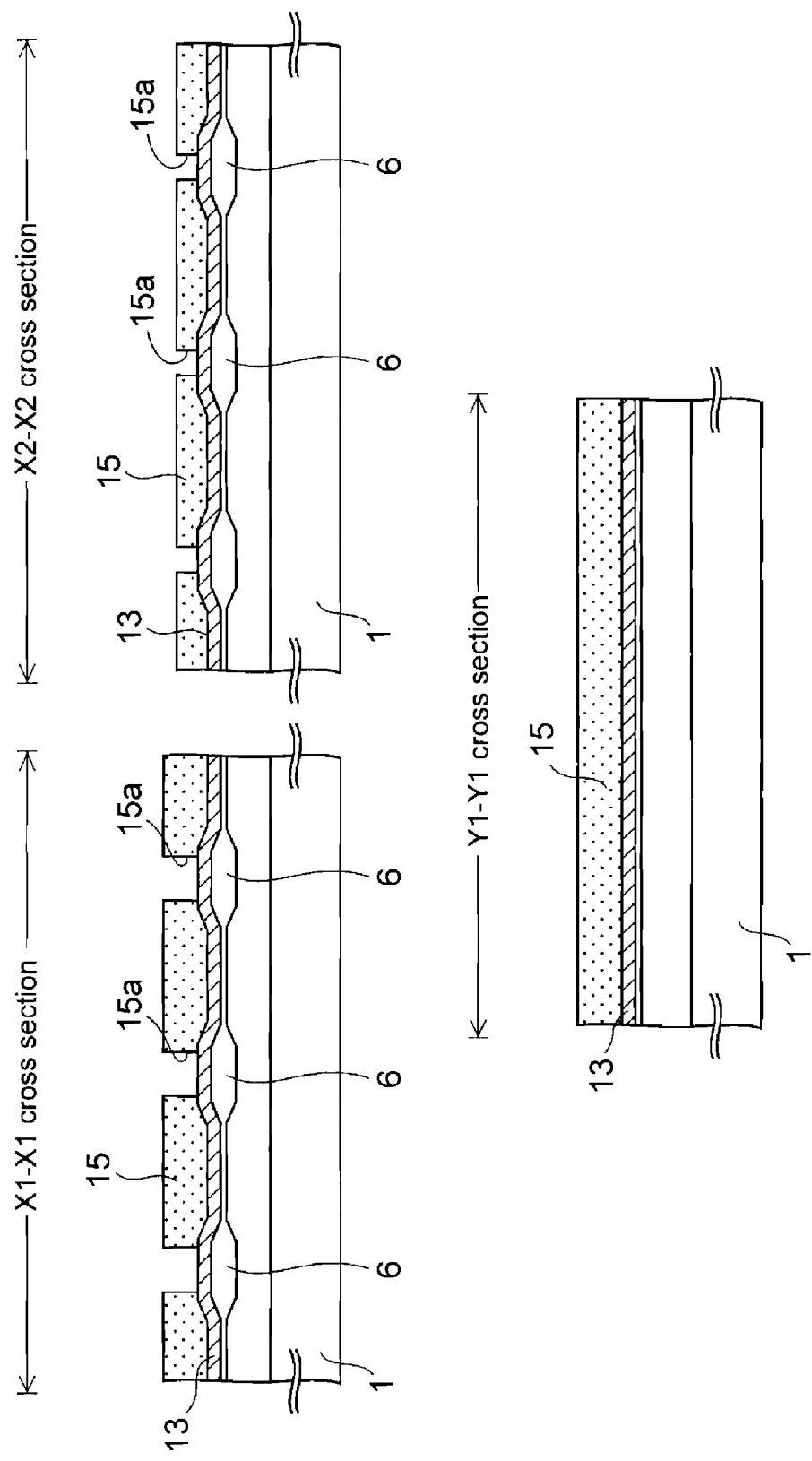
FIGS. 6A to 6E are cross-sectional views of the semiconductor device according to the first embodiment during the manufacturing thereof.

To manufacture such a semiconductor device, as depicted in FIGS. 4A, 5A, and 6A, a second resist pattern 15 is firstly formed by performing the processes of FIGS. 1A to 1H described in the preliminary explanation.

As depicted in the plan view of FIG. 4A, according to the present embodiment, in a region B between the adjacent control gates 17a that is formed later, a convex portion 15x which protrudes toward the inner side of the device isolation insulating film 6 is provided in each edge of the second resist pattern 15.

Figure 4B:
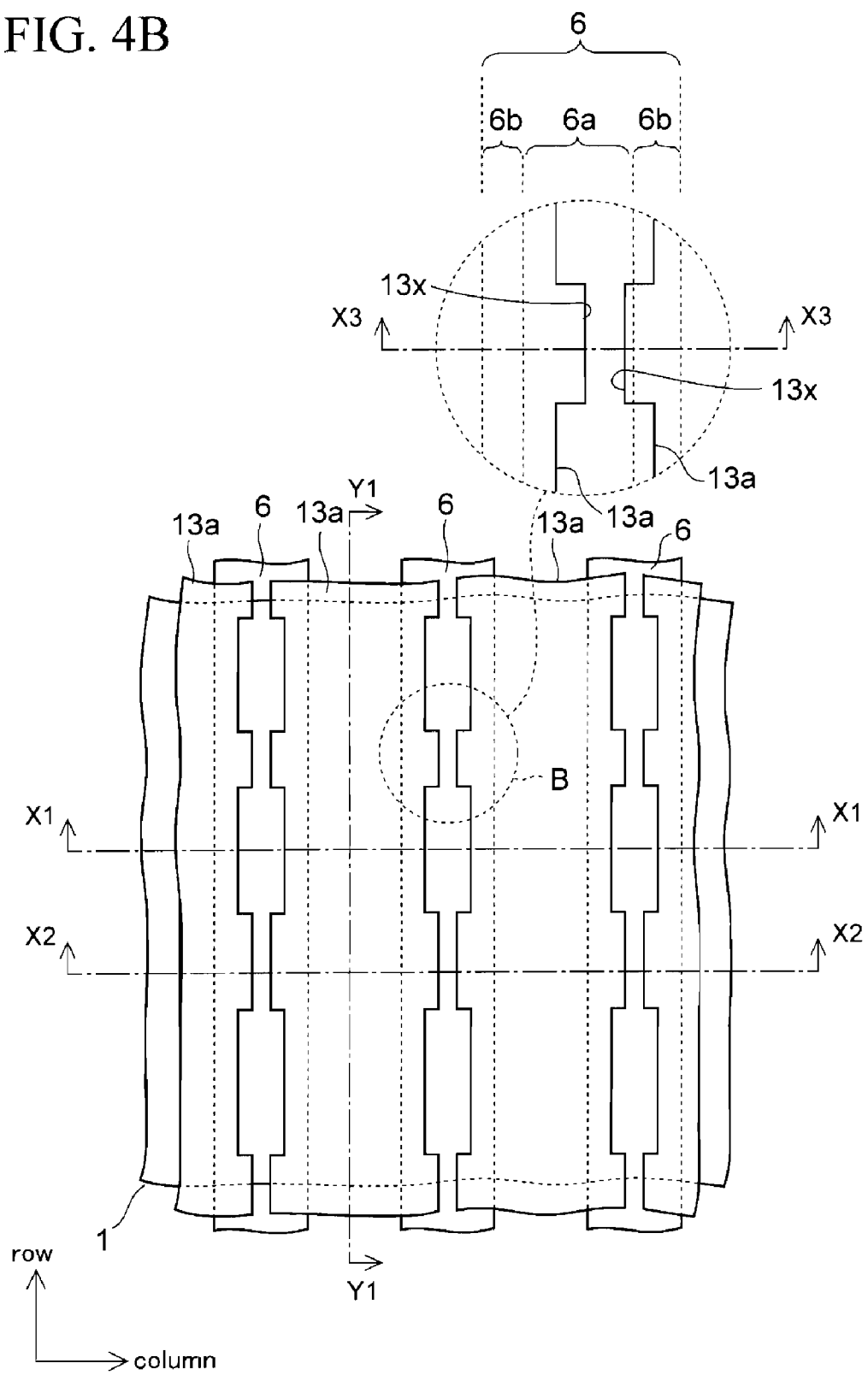
Figure 5B:
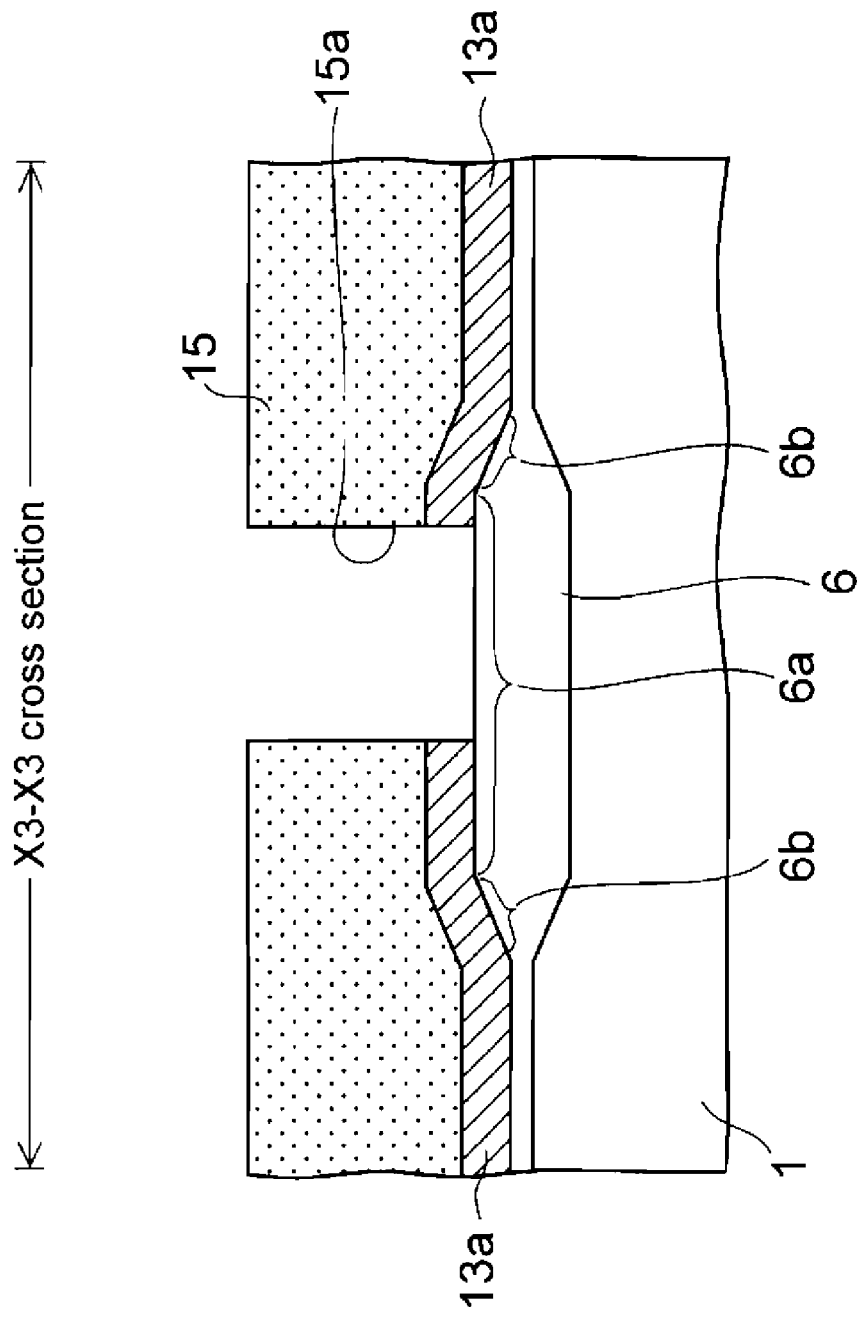
Figure 6B:
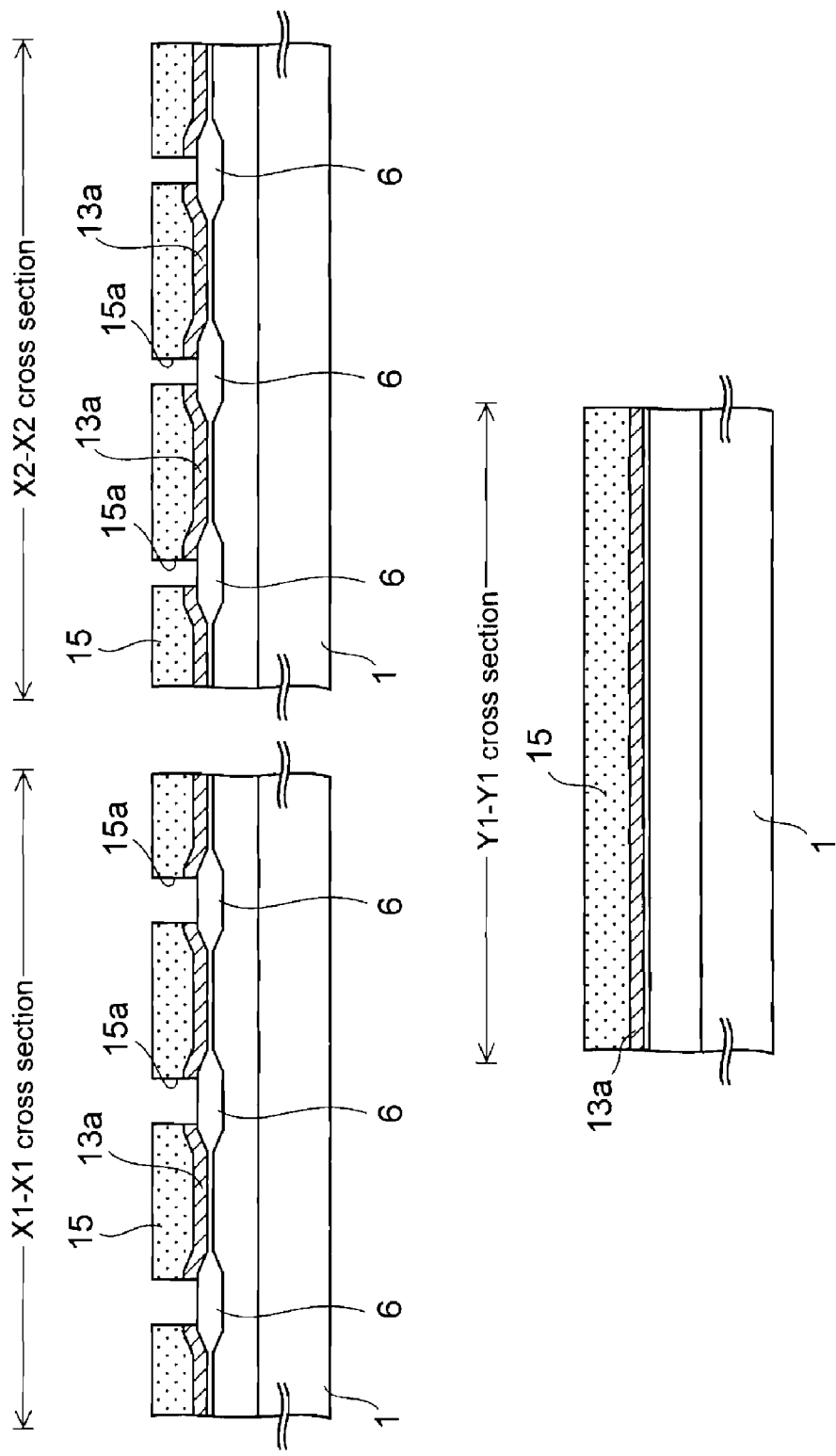

Subsequently, as depicted in FIGS. 4B, 5B, and 6B, by using the second resist pattern 15 as a mask, a first conductive film 13 is etched by the method described in the preliminary explanation, so as to form multiple conductive patterns 13a which are separated from one another on the device isolation insulating films 6.

Note that, in the plan view of FIG. 4B, the second resist pattern 15 is omitted for the plan layout of the conductive pattern 13a to be easily seen.

As depicted in FIG. 4B, each conductive pattern 13a has a substantially strip-shaped planar shape extending in a row direction. Furthermore, convex portions 13x which protrude, in a plan view, toward the inner sides of the respective device isolation insulating film 6 are formed in accordance with the convex portions 15x in the second resist pattern 15.

After that, the second resist pattern 15 is removed.

Figure 4C:
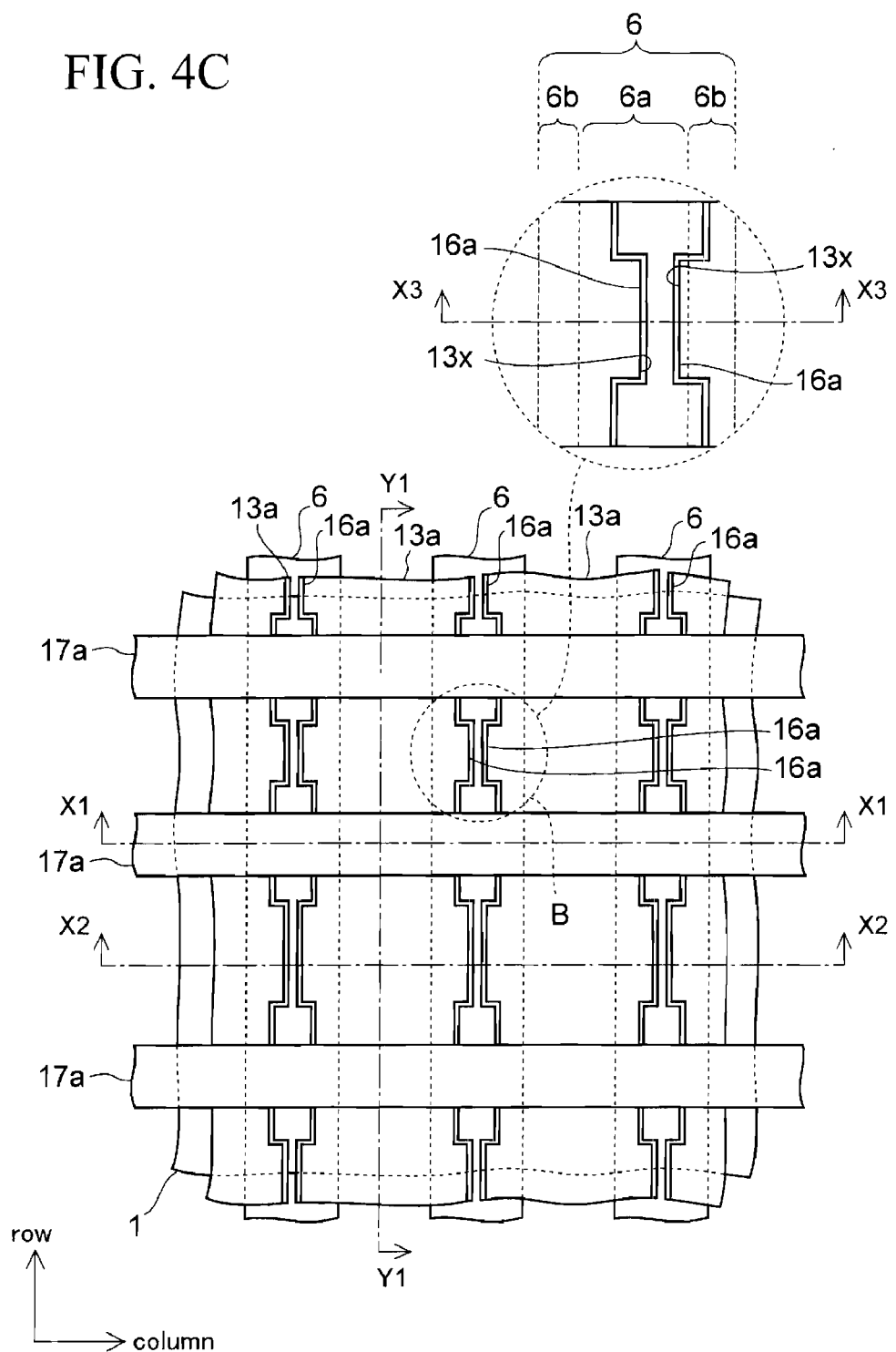
Figure 5C:
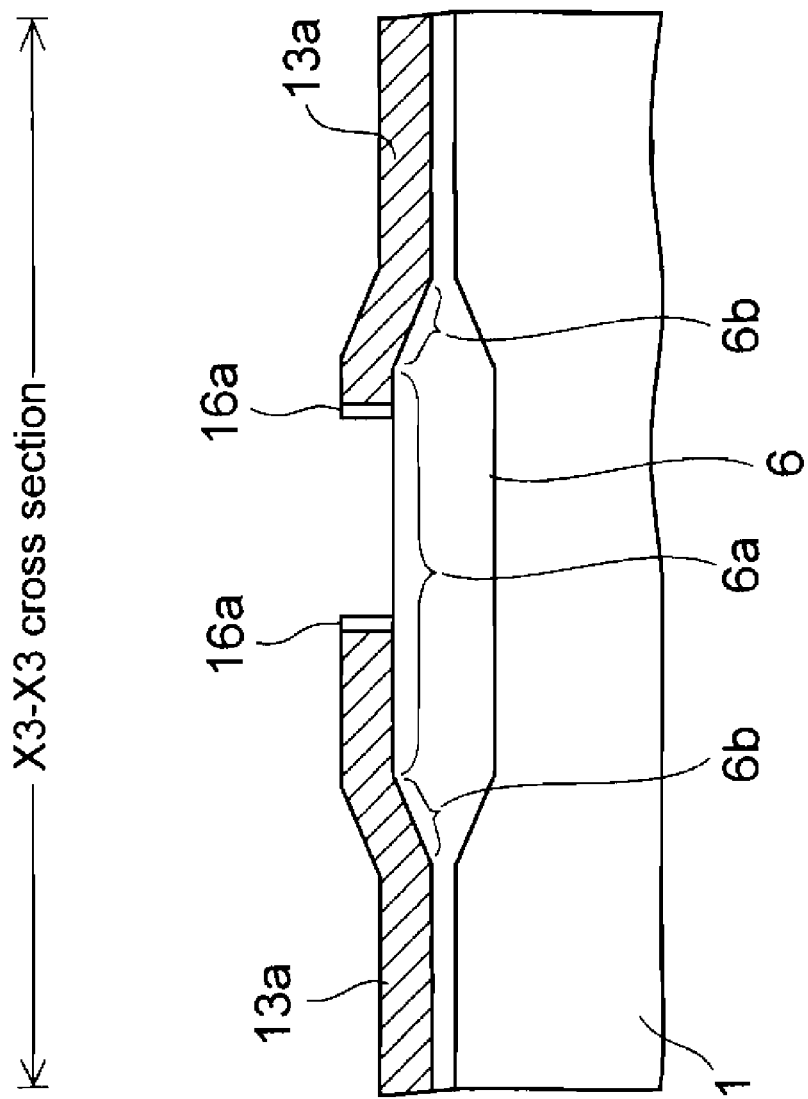
Figure 6C:
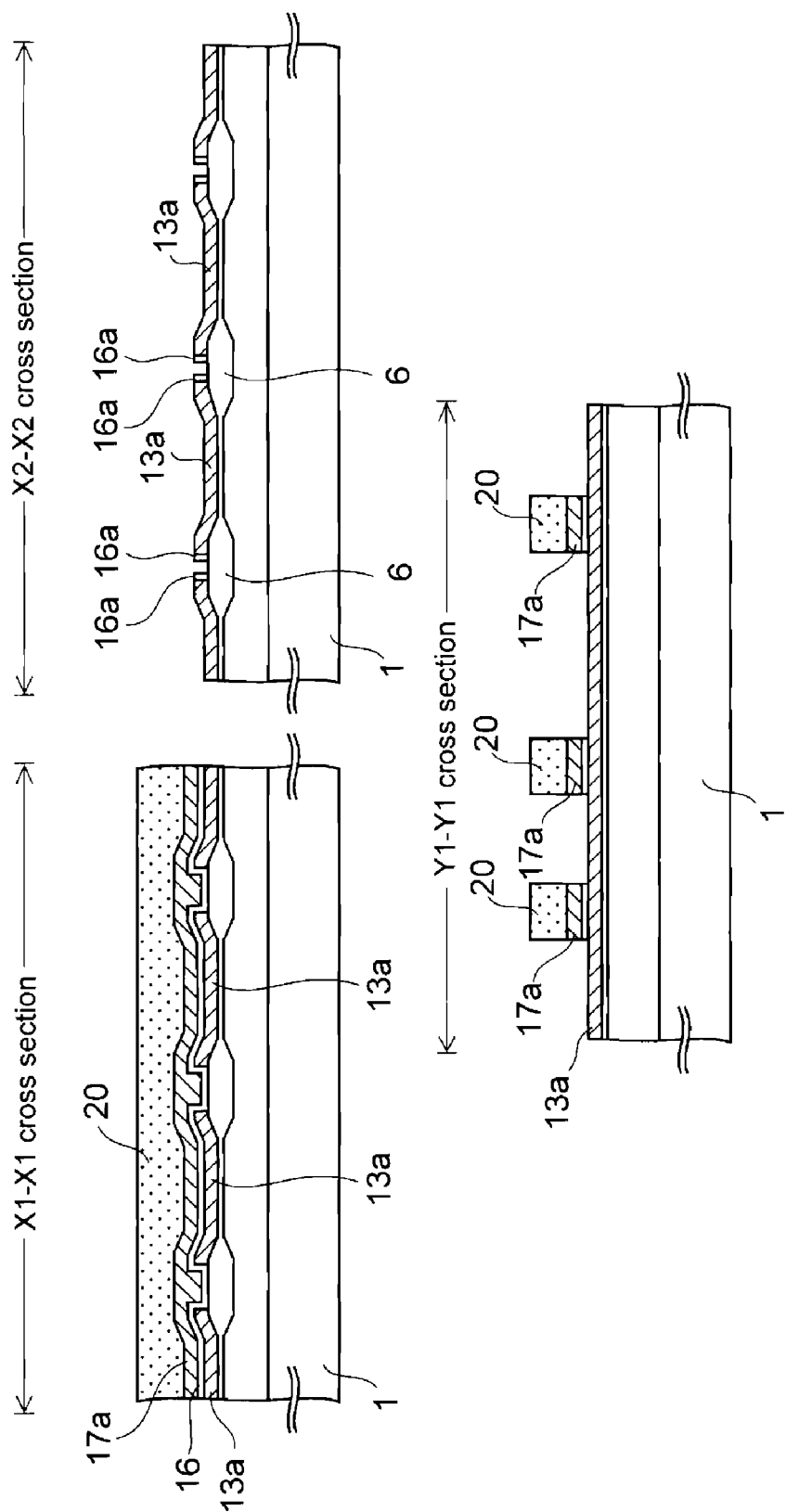

Next, the processes of FIGS. 1J to 1N described in the preliminary explanation are performed to obtain the structure depicted in FIGS. 4C, 5C, and 6C.

As depicted in FIG. 4C, since the convex portions 13x are provided in each edge of the conductive pattern 13a as described above, residues 16a in the region B between the control gates 17a are caused to have linear planar shapes that follow the convex portions 13x and bend toward the inner sides of the device isolation insulating film 6.

Figure 4D:
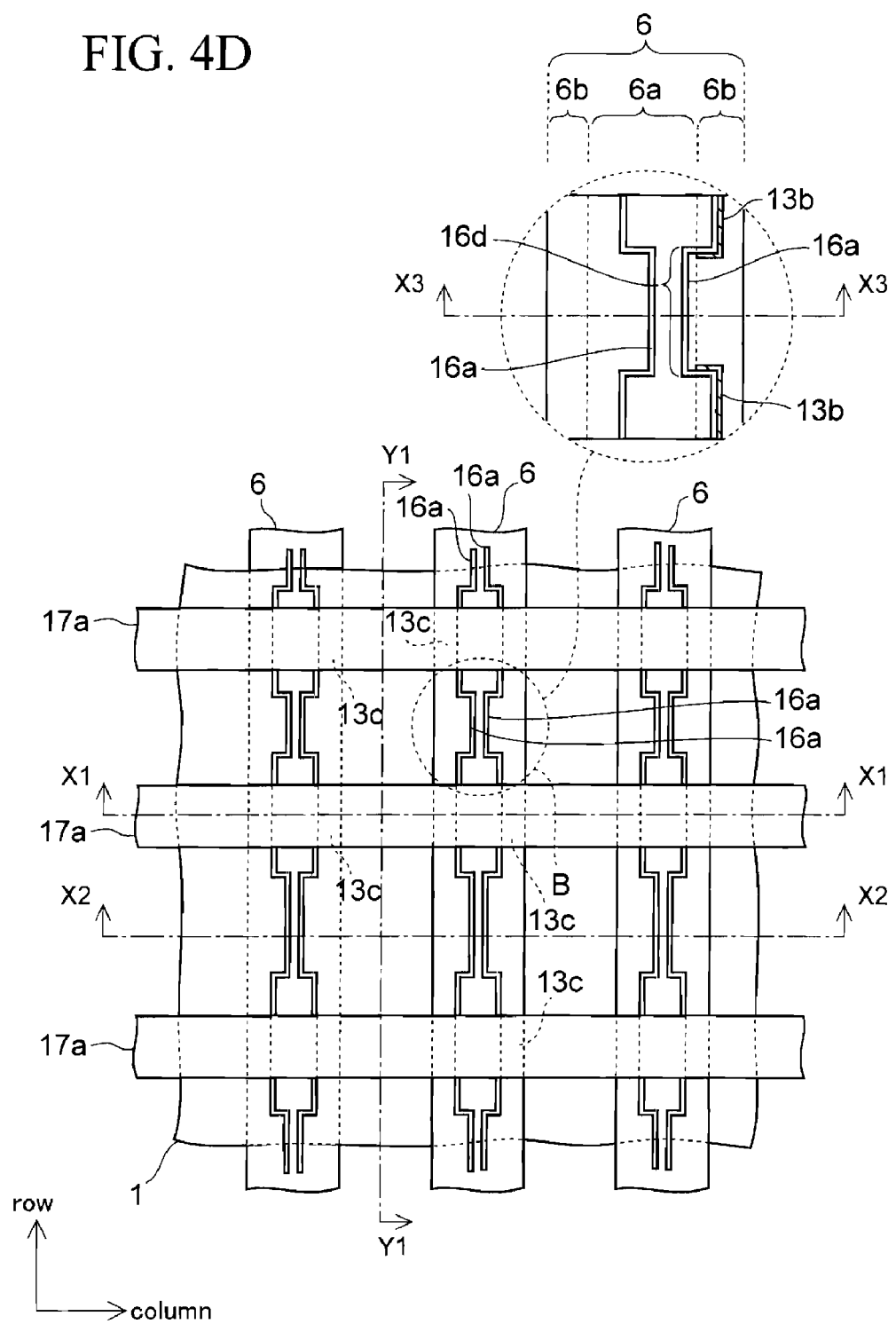
Figure 5D:
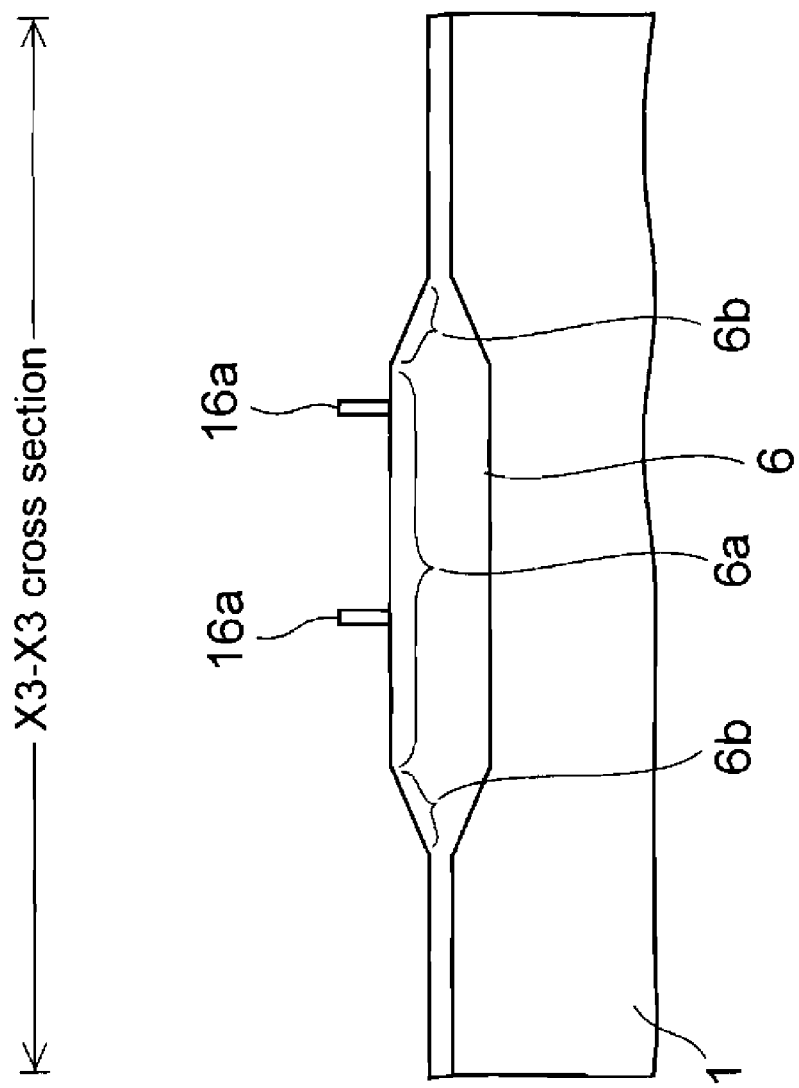
Figure 6D:
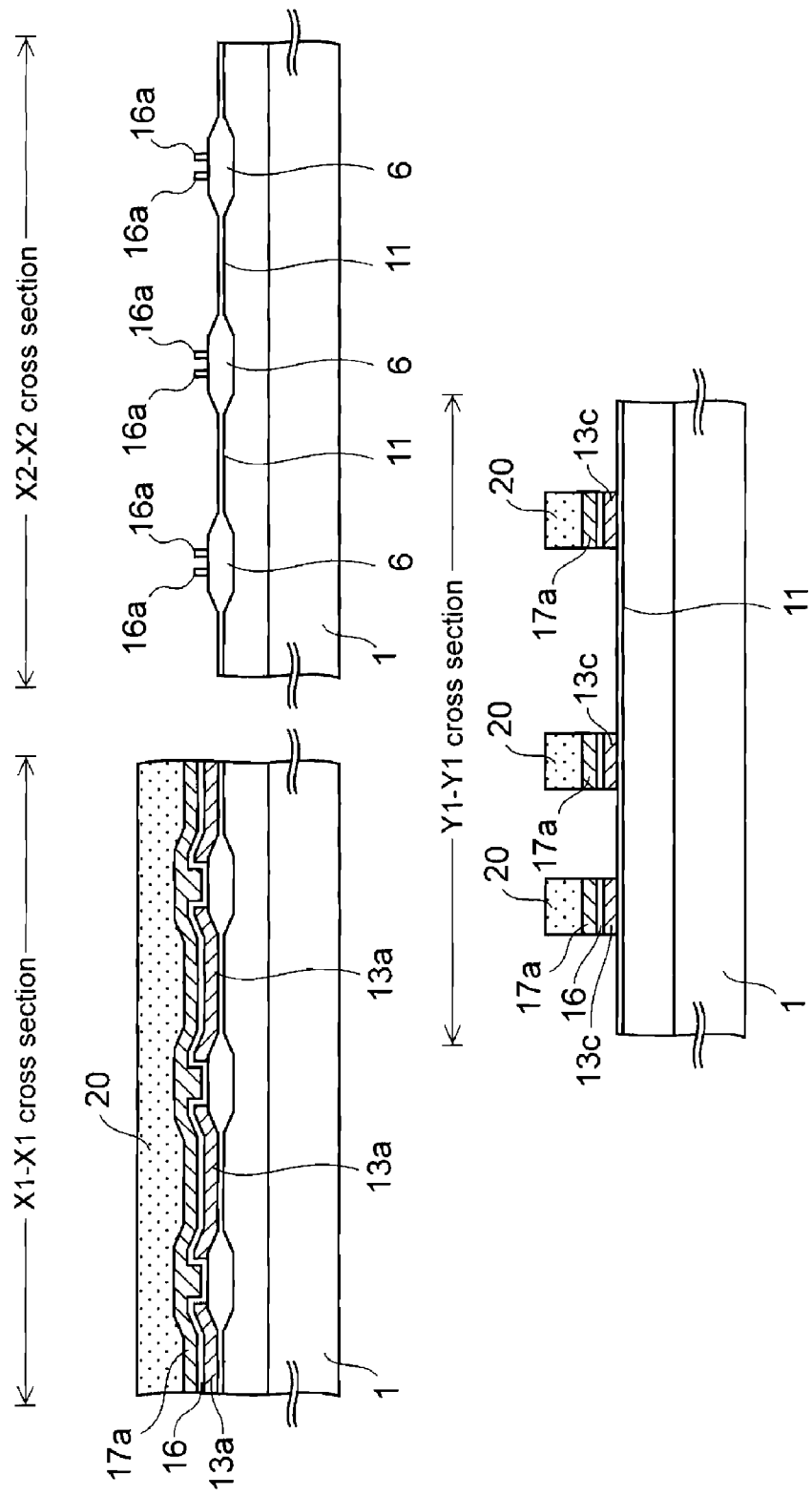

Subsequently, the conductive patterns 13a are etched according to the process of FIG. 1O in the preliminary explanation. Accordingly, as depicted in FIGS. 4D, 5D, and 6D, portions of the conductive patterns 13a which are not covered with the control gates 17a are removed, thereby forming multiple floating gates 13c in a matrix form.

Here, the residue 16a extends from one of the each adjacent floating gate 13c to the other floating gate 13c.

Figure 6E:
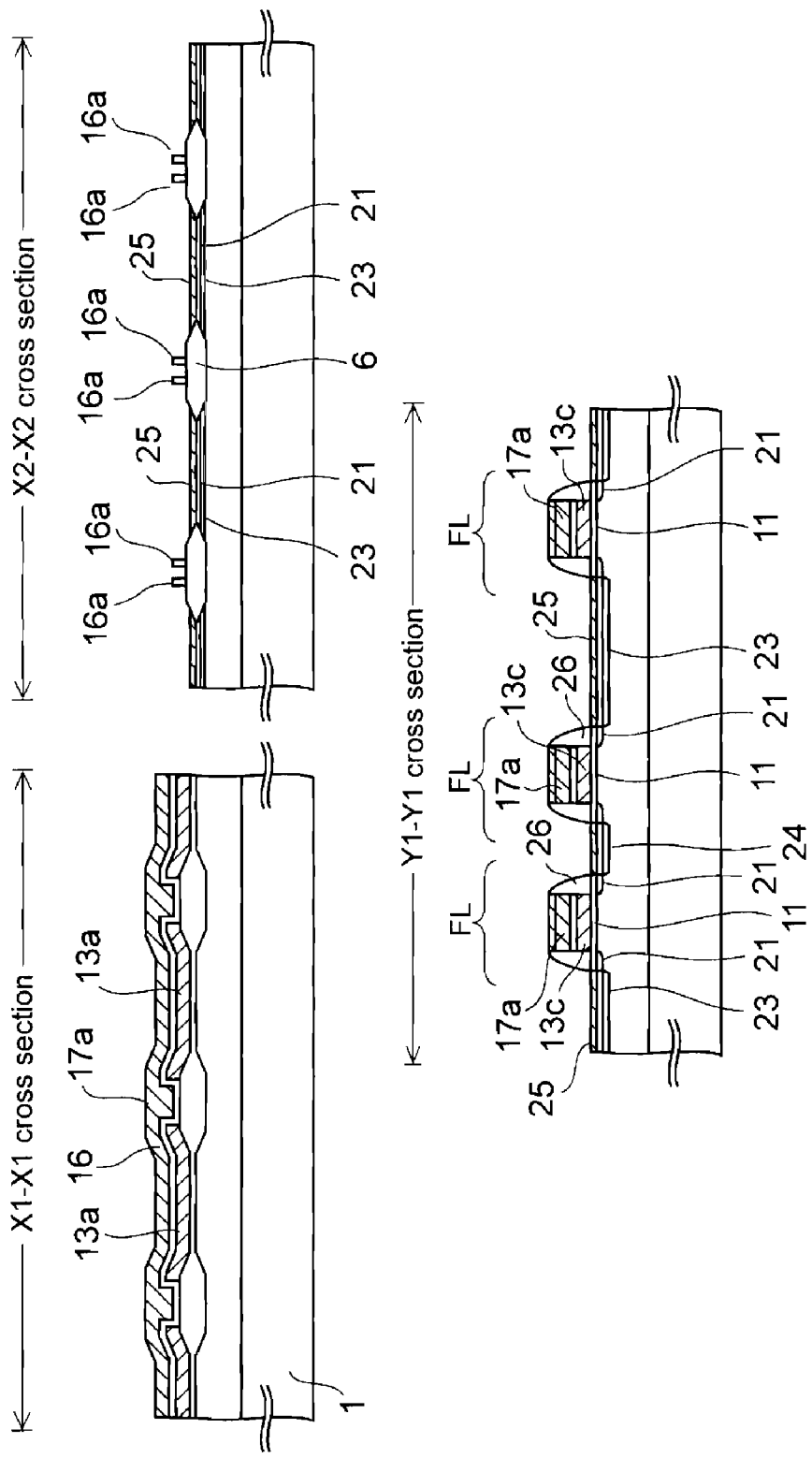

After that, the process of FIG. 1P described in the preliminary explanation is performed to complete the basic structure of the semiconductor device according to the present embodiment as depicted in FIG. 6E.

According to the present embodiment as described above, as depicted in FIG. 4D, the residues 16a of the intermediate insulating film 16 are formed to bend toward the inner sides of the device isolation insulating films 6, in the region B between the control gates 17a adjacent in the row direction.

For this reason, when misalignment occurs between the device isolation insulating film 6 and the conductive pattern 13a, a portion 16d of the residue 16a is positioned out of the slanting surface 6b of the device isolation insulating film 6 but is positioned on the top surface 6a as depicted in the dotted circle in FIG. 4D.

As depicted in FIG. 5B, the trailing of the side surface of the conductive pattern 13a does not occur on the top surface 6a. Accordingly, a stringer 13b of the conductive pattern 13a (see FIG. 4D) is not formed beside the residue 16a. Therefore, as depicted in the dotted circle in FIG. 4D, the stringer 13b formed on the slanting surface 6b is divided by the top surface 6a. Thus, the floating gates 13c adjacent in the row direction are prevented from being electrically short-circuited by the stringer 13b. Consequently, the retention characteristic of the semiconductor device including the flash memory is improved, and the yield of the semiconductor device is also improved.

Moreover, in the present embodiment, as compared with the case of the preliminary explanation, it is only needed to change the plan layouts of the conductive patterns 13a. Accordingly, some new additional processes are not needed. Thus, an increase in manufacturing cost of the semiconductor device can be suppressed.

Second Embodiment

Figure 7A:
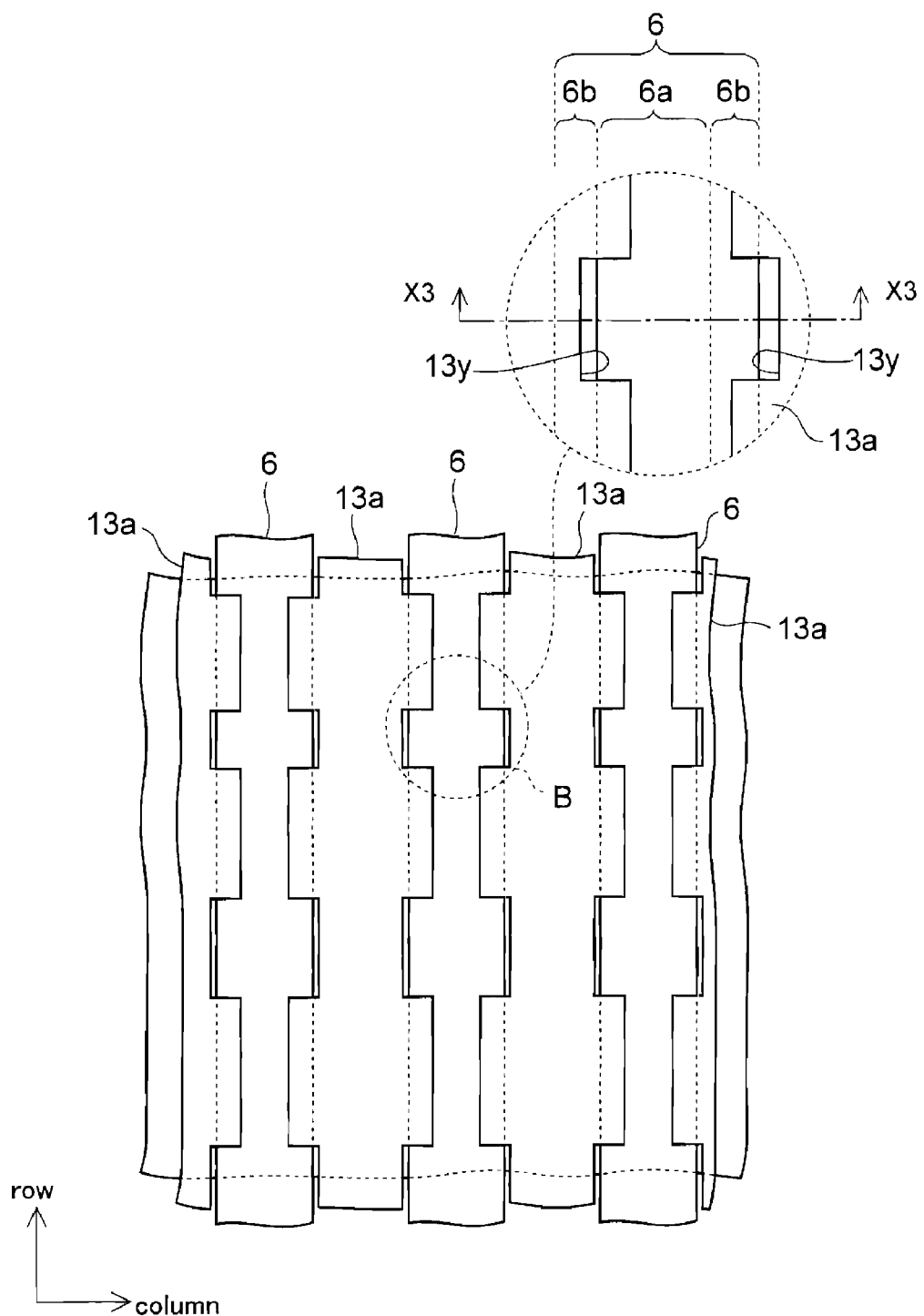
FIGS. 7A and 7B are plan views of a semiconductor device according to a second embodiment during the manufacturing thereof.
Figure 7B:
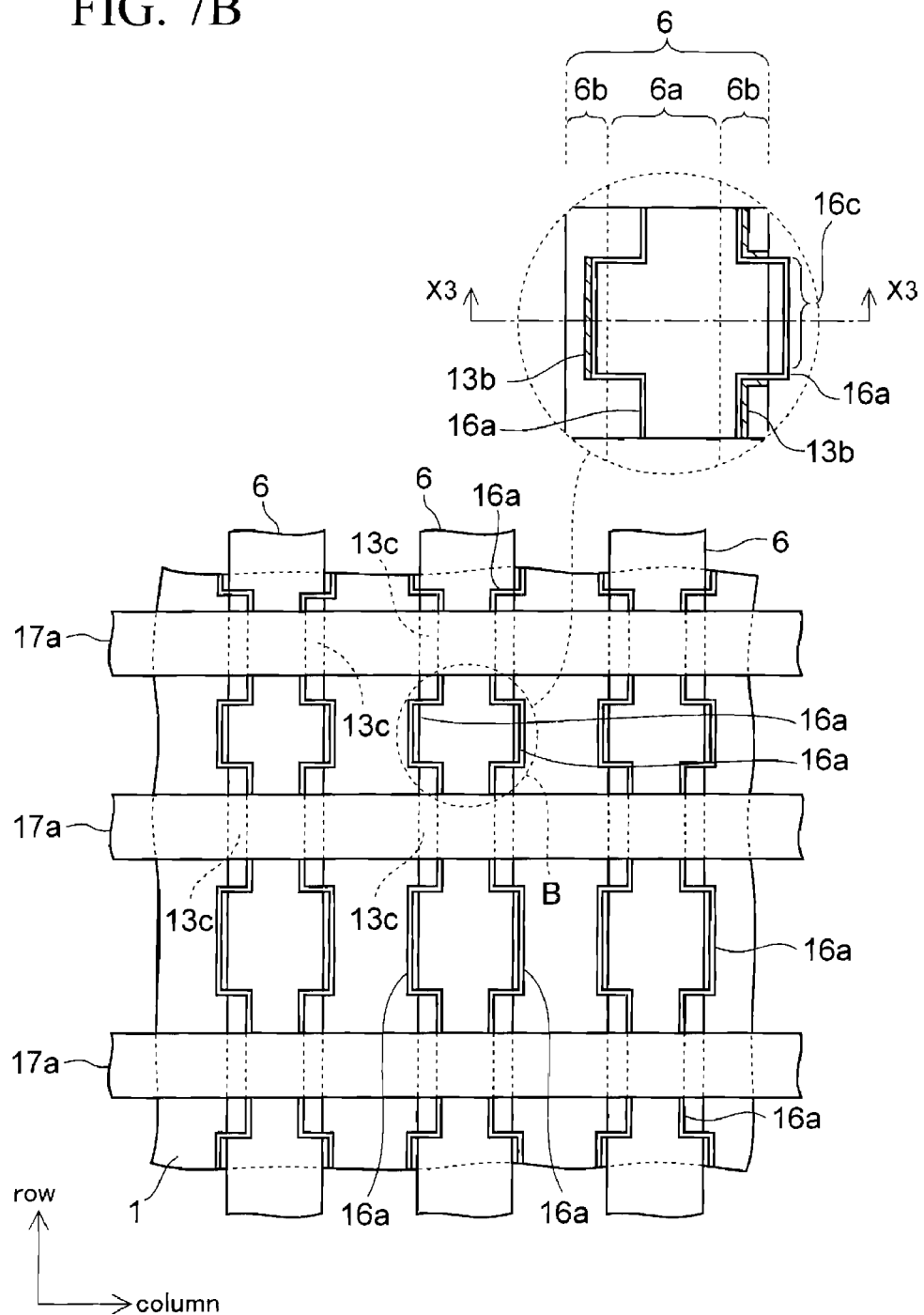
Figure 8A:
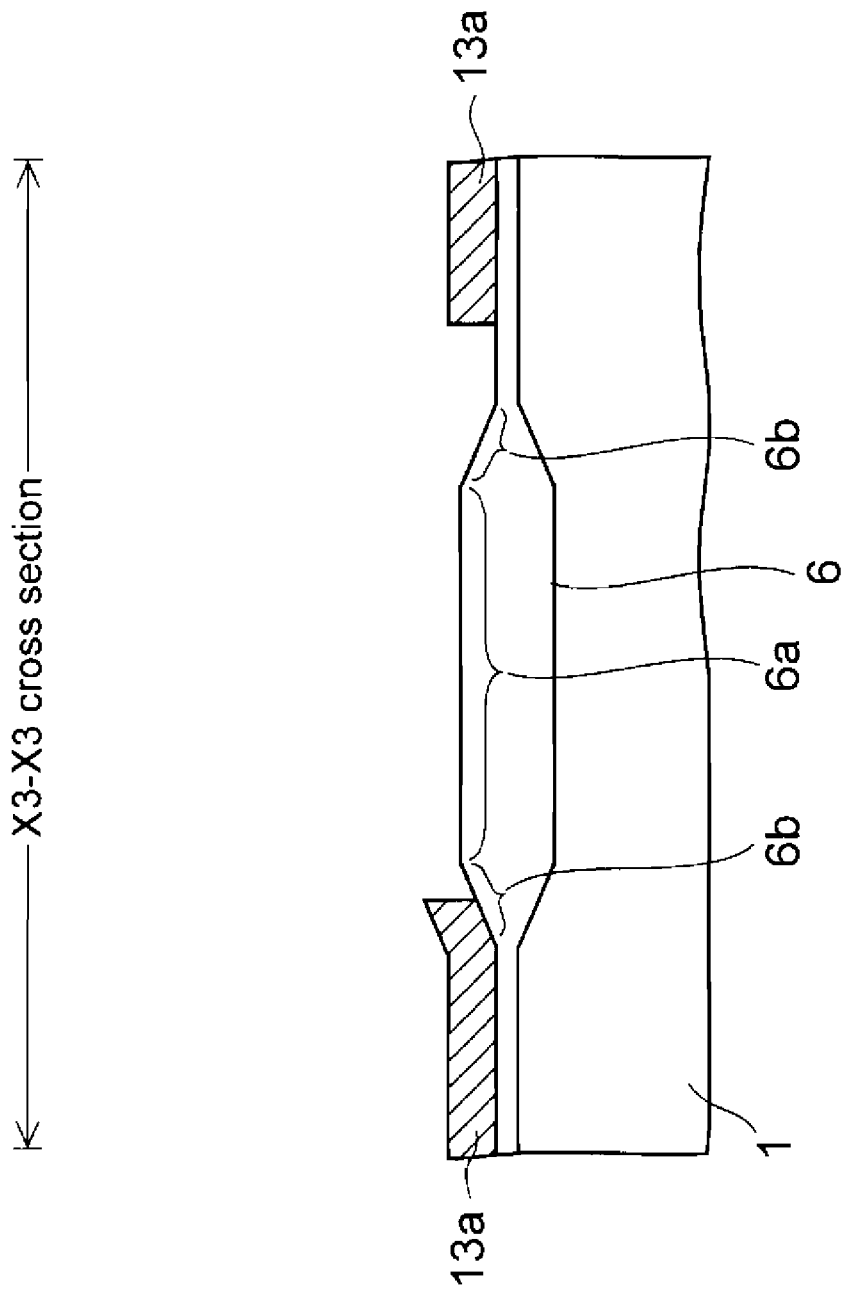
FIGS. 8A and 8B are plan views depicting the semiconductor device according to the second embodiment during the manufacturing thereof.
Figure 8B:
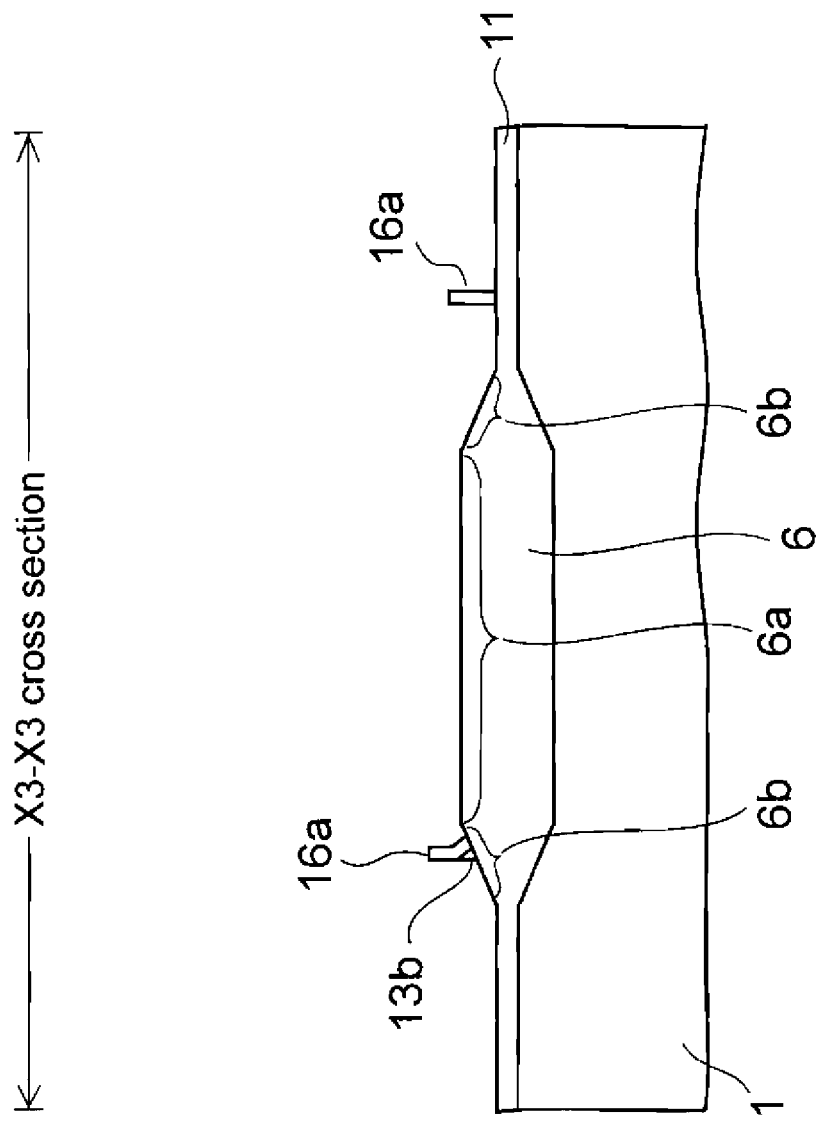

FIGS. 7A and 7B are plan views of a semiconductor device according to a second embodiment during the manufacturing thereof. FIGS. 8A and 8B are enlarged cross-sectional views taken along the line X3-X3 of these plan views.

To manufacture this semiconductor device, the processes of FIGS. 1A to 1I described in the preliminary explanation are performed to form conductive patterns 13a as depicted in FIGS. 7A and 8A.

In the present embodiment, however, as depicted in FIG. 7A, concave portions 13y recessed in a direction away from the device isolation insulating film 6 is provided in the edges of the conductive patterns 13a that extend in a strip-like shape in a row direction.

After that, the processes of FIGS. 1J to 1O in the preliminary explanation are performed to obtain the structure depicted in FIGS. 7B and 8B.

As depicted in FIG. 7B, the concave portions 13y are provided in the edge of the conductive pattern 13a. Therefore, the planar shapes of residues 16a in a region B between the control gates 17a extend in such a way as to bend toward the outer sides of the device isolation insulating films 6.

Accordingly, in the case where the device isolation insulating film 6 and the conductive pattern 13a are misaligned, a portion 16c of the residue 16a of the intermediate insulating film 16 is formed on a tunnel insulating film 11. Since the upper surface of the tunnel insulating film 11 is flat, the trailing of the conductive pattern 13a as described in the preliminary explanation does not occur. Accordingly, a stringer 13b of the conductive pattern 13a is not left beside the portion 16c of the residue 16a. Thus, the floating gates 13c adjacent in the row direction can be prevented from being electrically short-circuited by the stringer 13b.

Third Embodiment

FIGS. 9A to 9F are plan views of a semiconductor device according to a third embodiment during manufacturing process thereof. In addition, FIGS. 10A to 10F are enlarged cross-sectional views taken along the line X3-X3 of FIGS. 9A to 9F. Furthermore, FIGS. 11A to 11G are cross-sectional views taken along the lines X1-X1, X2-X2, and Y1-Y1 of FIGS. 9A to 9F.

In the above-described first and second embodiments, the convex portions 13x or the concave portions 13y are provided in the conductive pattern 13a, so that the stringer 13b is divided at the region between the floating gates 13c that are adjacent in the row direction.

In contrast, in the present embodiment, while performing the same processes as those in the preliminary explanation, the plan layout of the device isolation insulating film 6 is changed as follows to divide the stringer 13b.

Figure 9A:
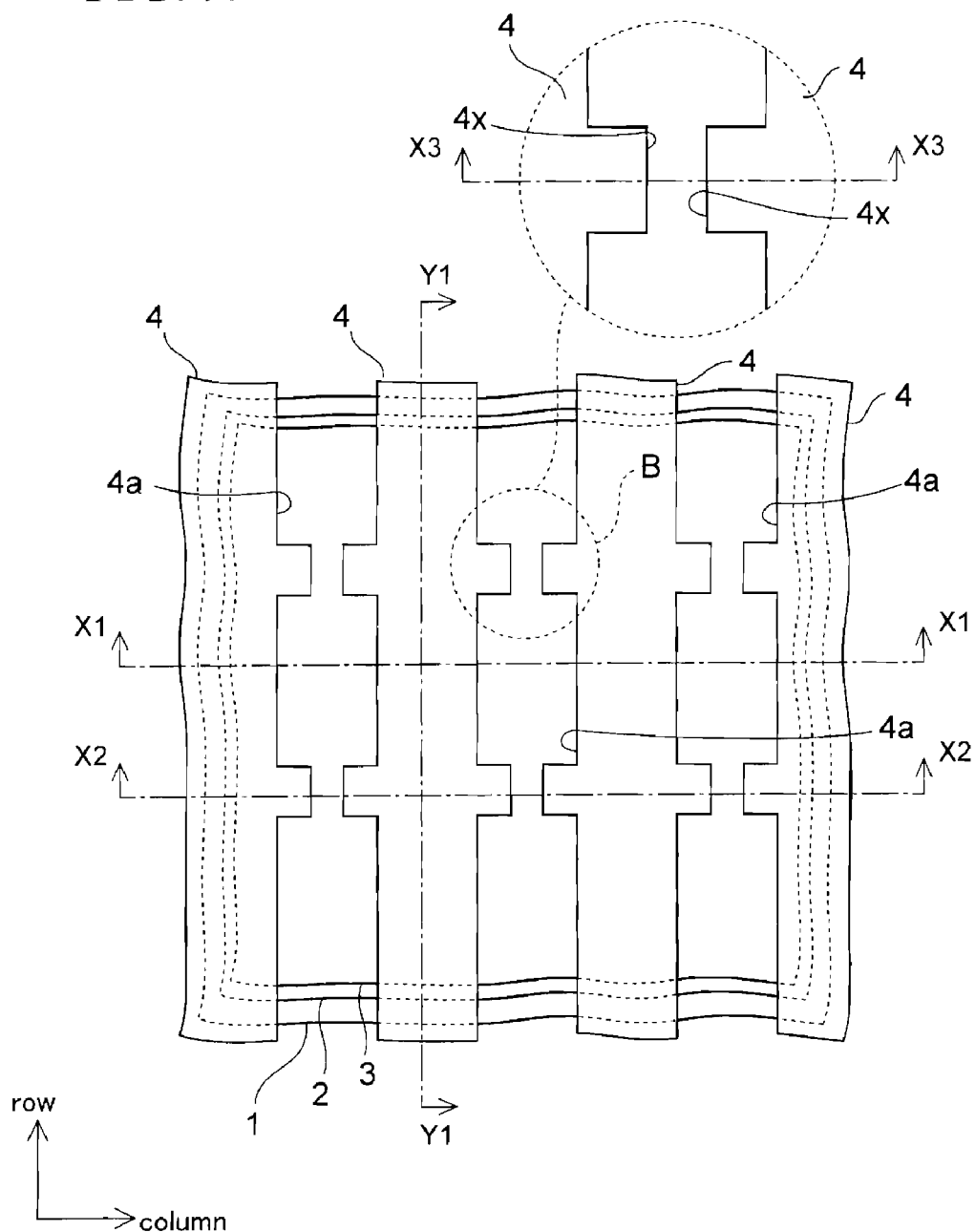
Figure 10A:
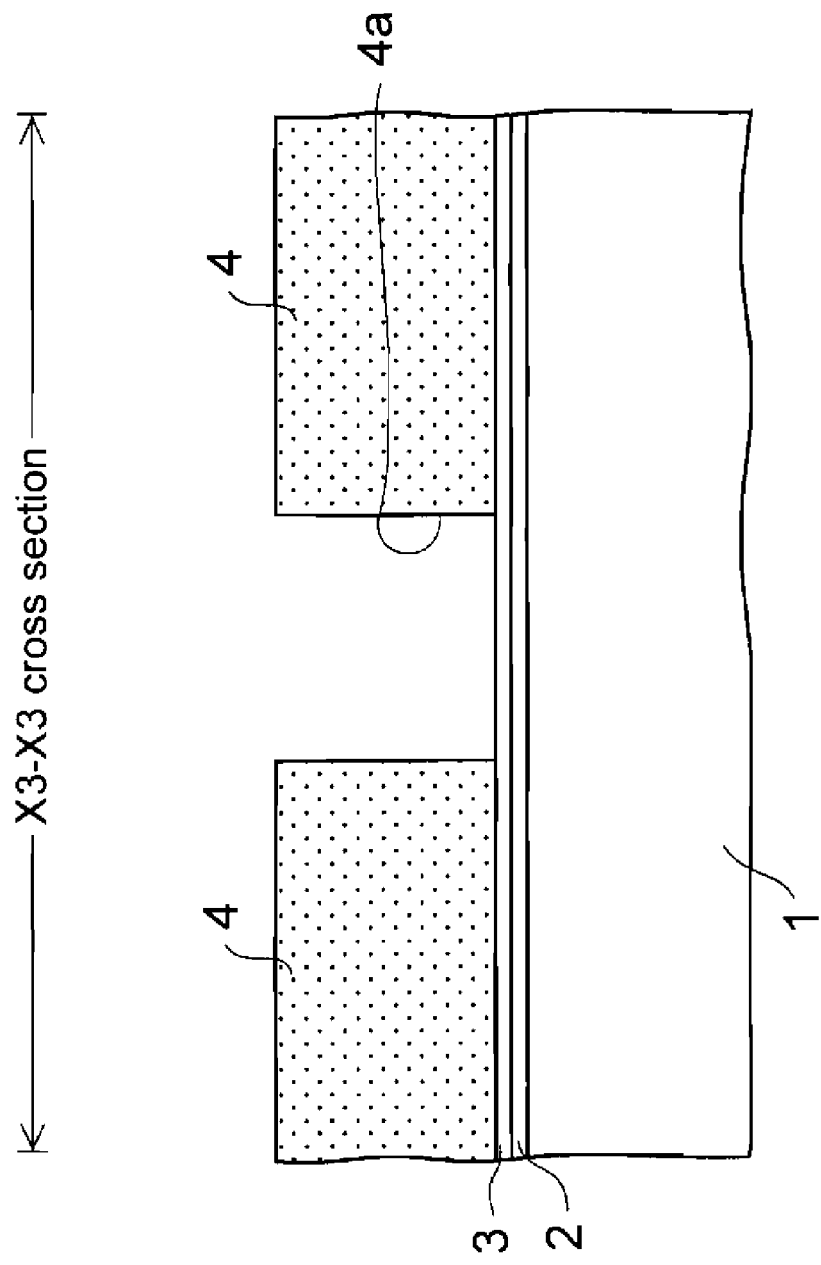
Figure 11A:
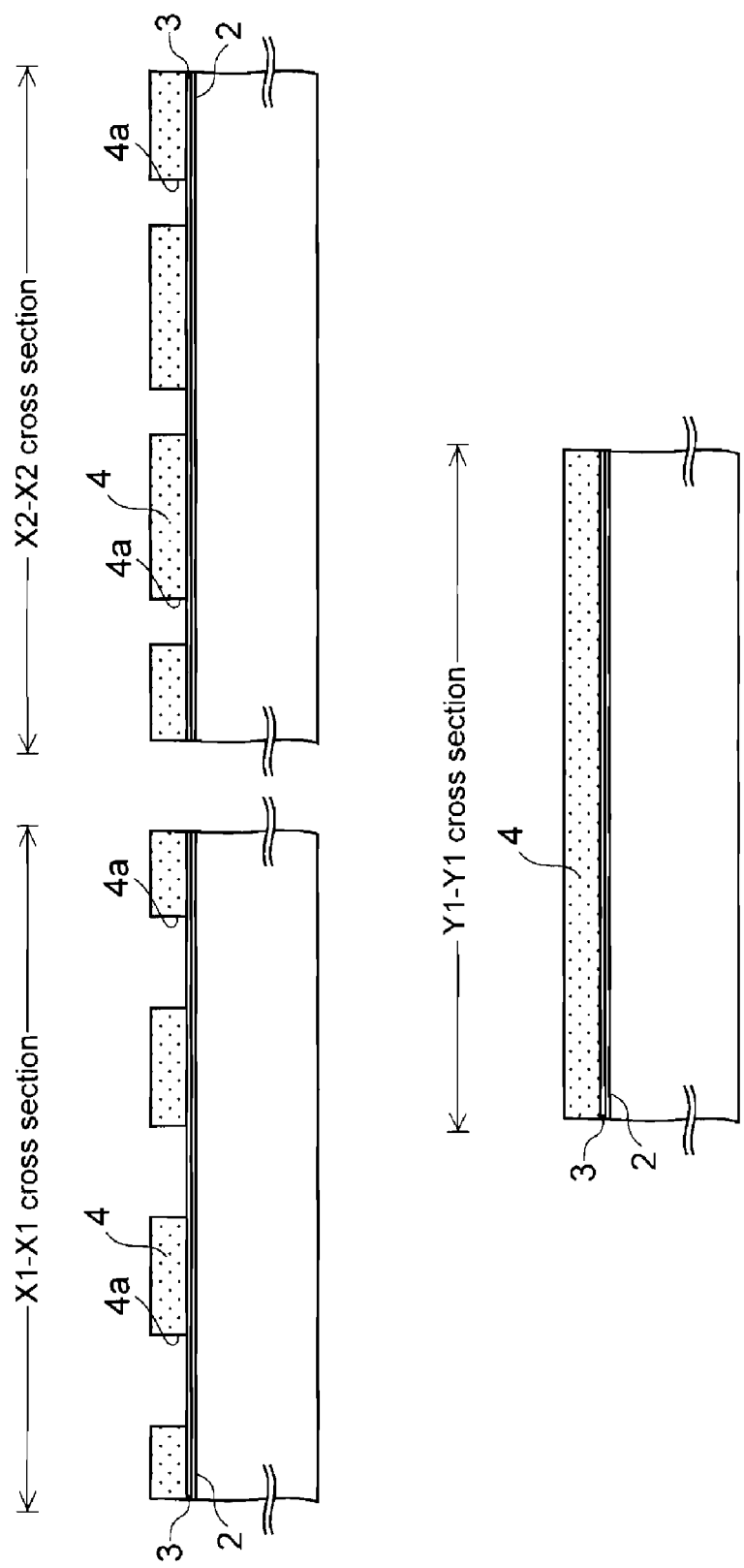

To manufacture the semiconductor device according to the present embodiment, as depicted in FIGS. 9A, 10A, and 11A, the first resist pattern 4 is firstly formed by performing the process of FIG. 1A described in the preliminary explanation.

As depicted in the plan view of FIG. 9A, in the present embodiment, convex portions 4x are provided in the window 4a of the first resist pattern 4.

Figure 10B:
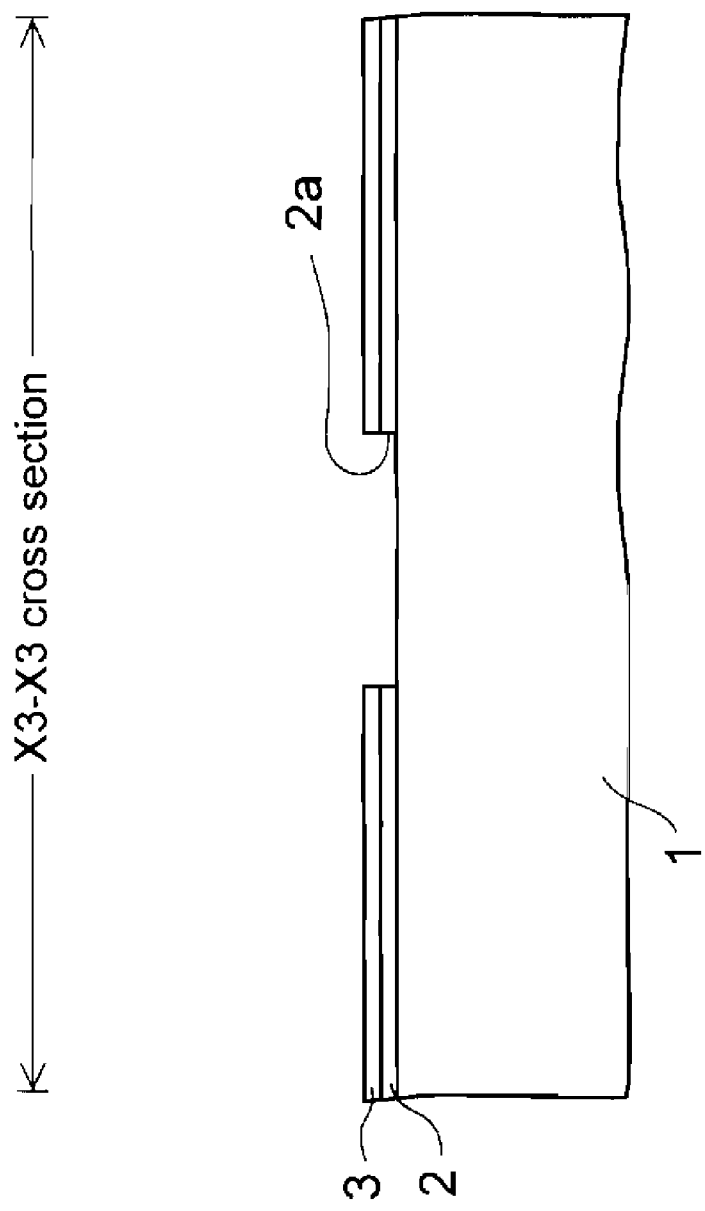

Subsequently, as depicted in FIGS. 9B, 10B, and 11B, similar to FIG. 1B in the preliminary explanation, by using the first resist pattern 4 as a mask, a thermal oxide film 2 and a silicon nitride film 3 are dry-etched to form openings 2a in these films. Thereafter, the first resist pattern 4 is removed.

As depicted in FIG. 9B, convex portions 2x reflecting the convex portions 4x of the first resist pattern 4 are formed in the opening 2a.

Figure 10C:
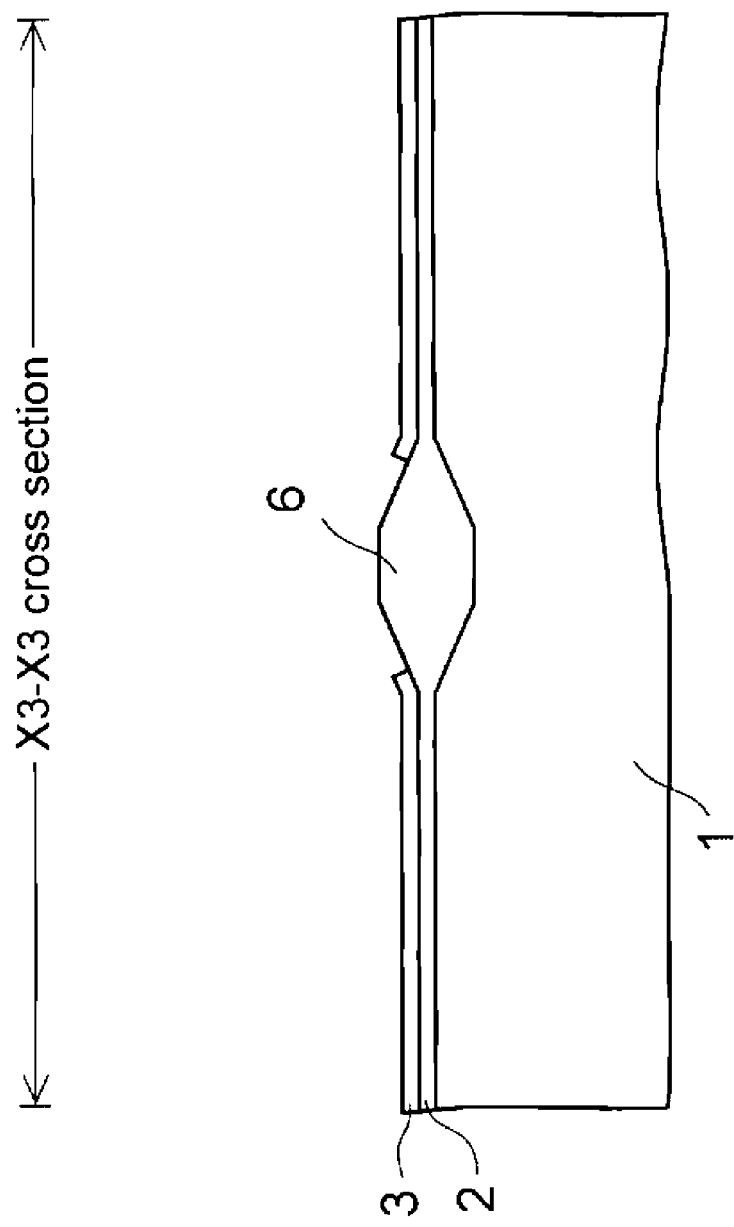
Figure 11C:
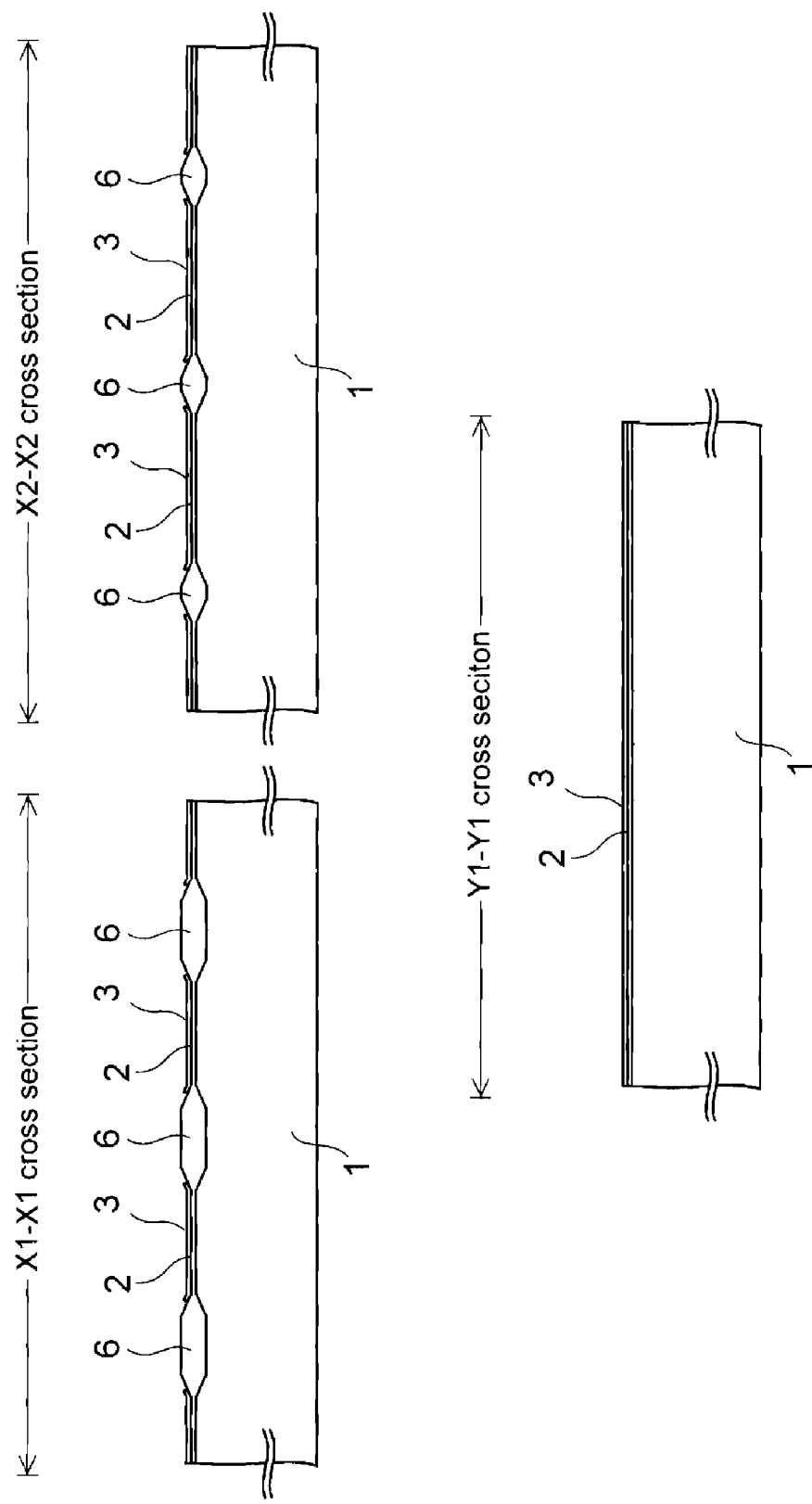

Subsequently, as depicted in FIGS. 9C, 10C, and 11C, by performing the process of FIG. 1C described in the preliminary explanation, surfaces of a silicon substrate 1 which are exposed through the opening 2a are thermally oxidized to form device isolation insulting films 6 formed of a thermal oxide film.

As depicted in the plan view of FIG. 9C, reflecting the convex portions 2x of the opening 2a, concave portions 6x are formed in the edge of the device isolation insulating film 6 in such a way as to be recessed in a direction toward the inner side of the device isolation insulating film 6.

Figure 10D:
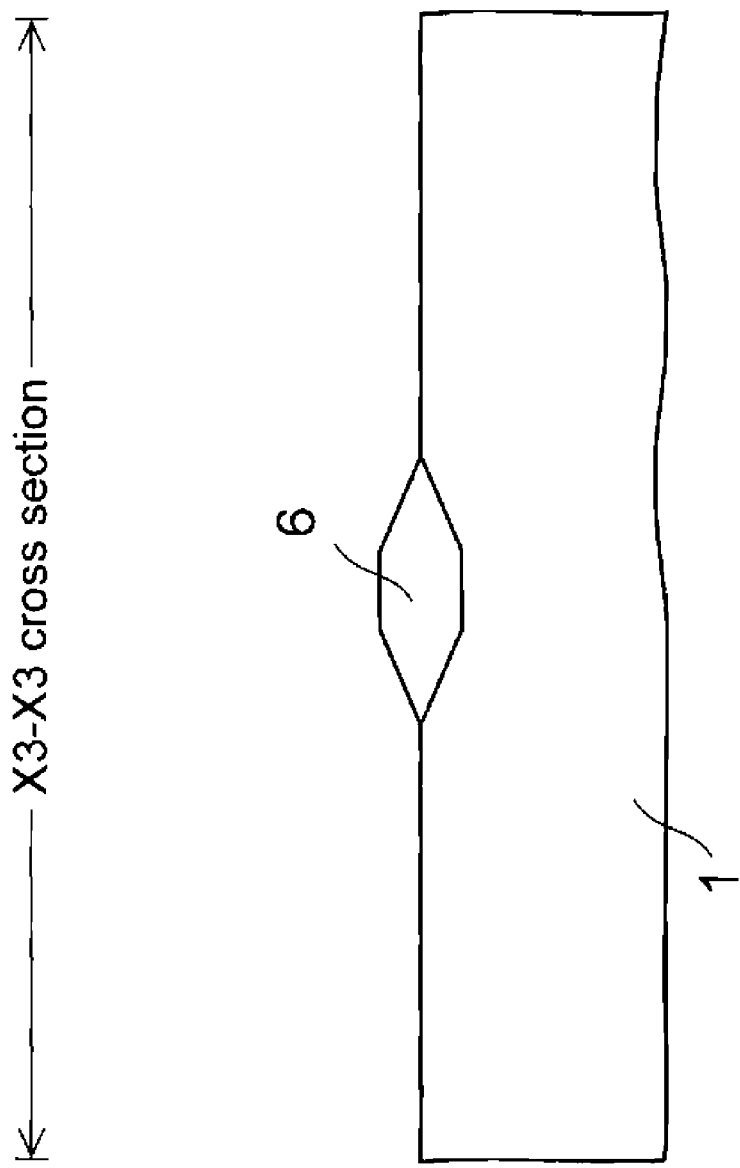
Figure 11D:
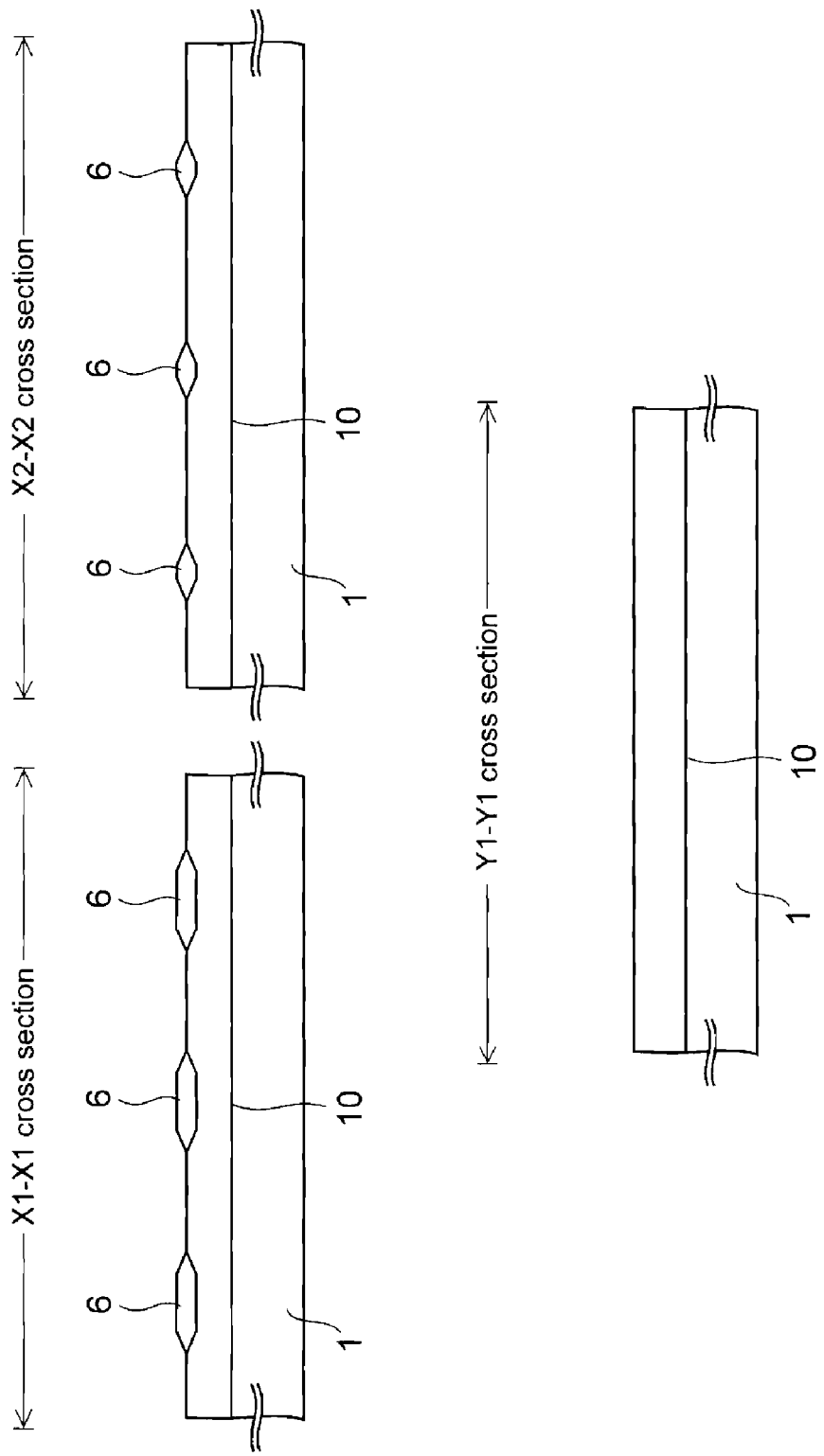

Thereafter, the thermal oxide film 2 and the silicon nitride film 3 are removed by wet etching so as to obtain the structure depicted in FIGS. 9D, 10D, and 11D.

Figure 9E:
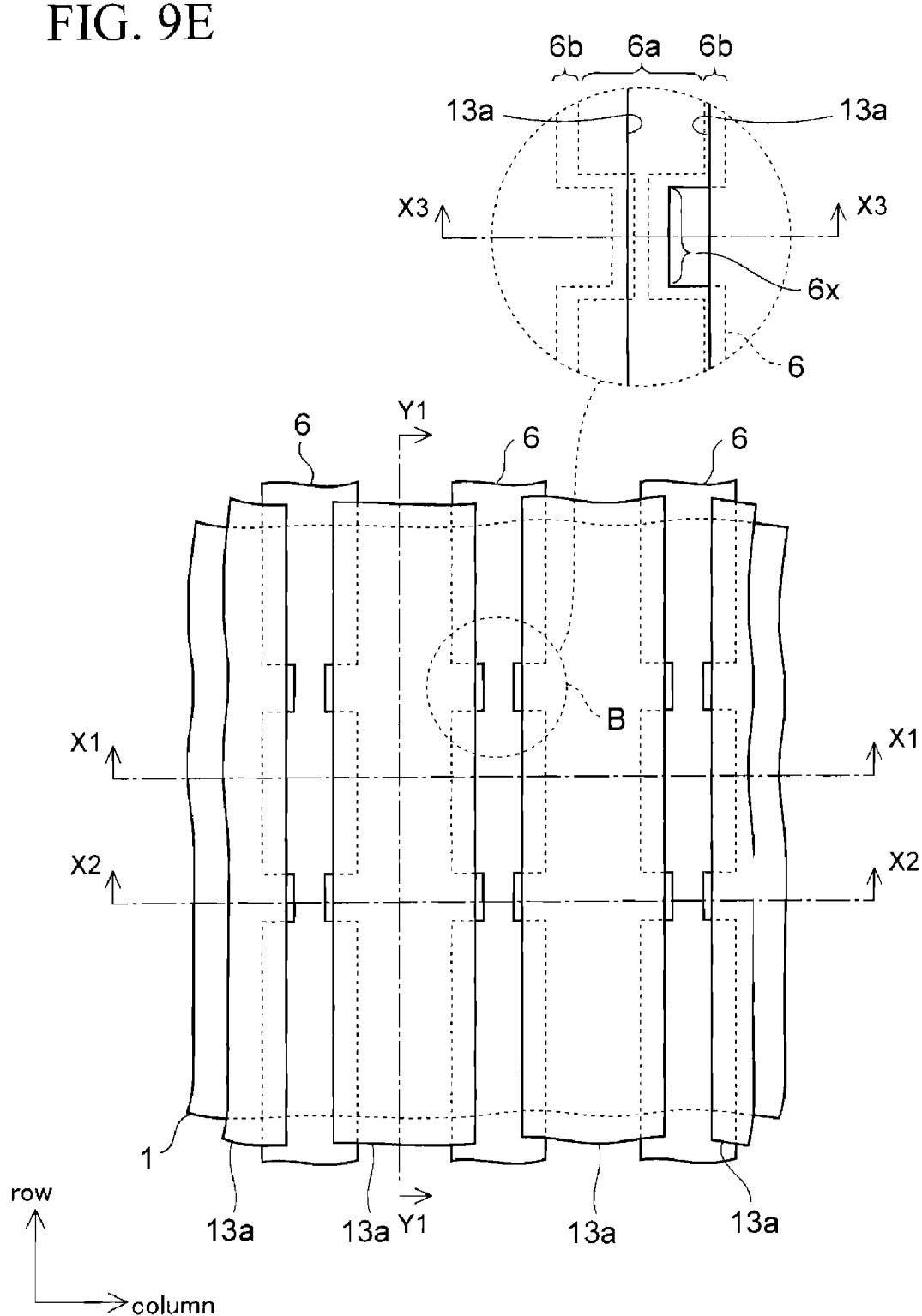
Figure 10E:
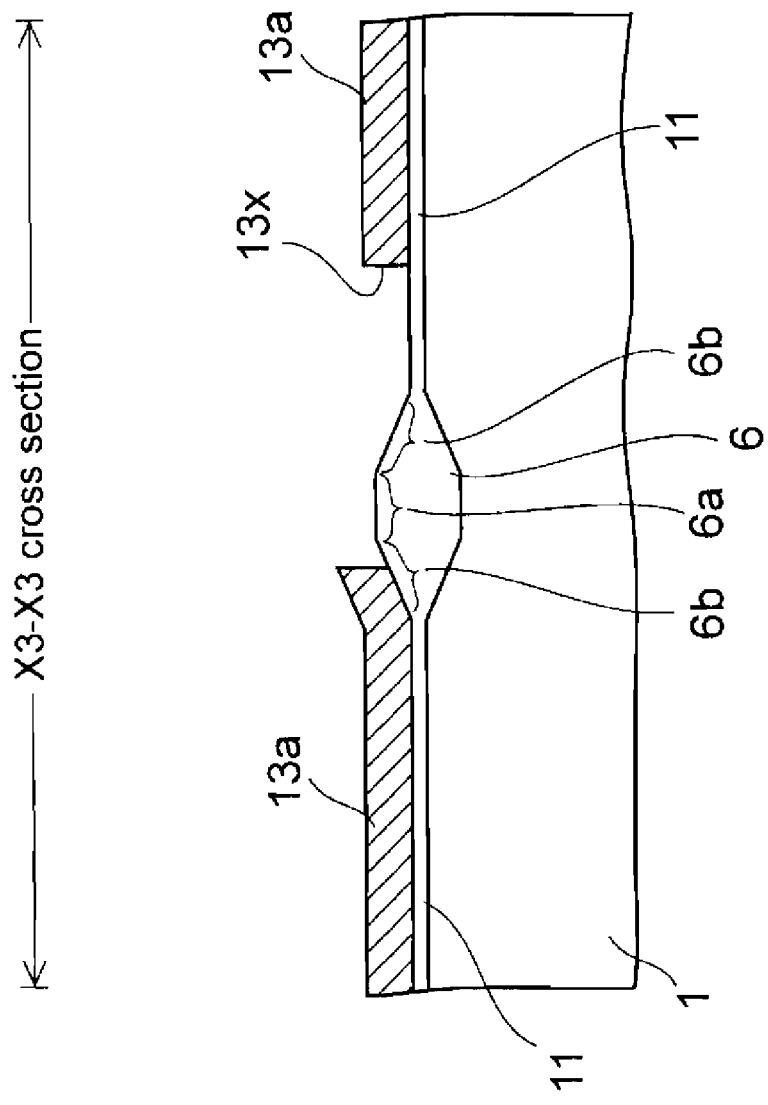

Next, the processes of FIGS. 1F to 1I described in the preliminary explanation are performed to form strip-shaped conductive patterns 13a extending in a row direction, as depicted in FIGS. 9E, 10E, and 11E.

Here, when the conductive pattern 13a and the device isolation insulating film 6 are misaligned, a side surface 13x of the conductive pattern 13a is positioned out of a slanting surface 6b, and the side surface 13x is positioned on a tunnel insulating film 11 formed on the flat surface of the silicon substrate 1, as depicted in FIG. 10E.

Figure 9F:
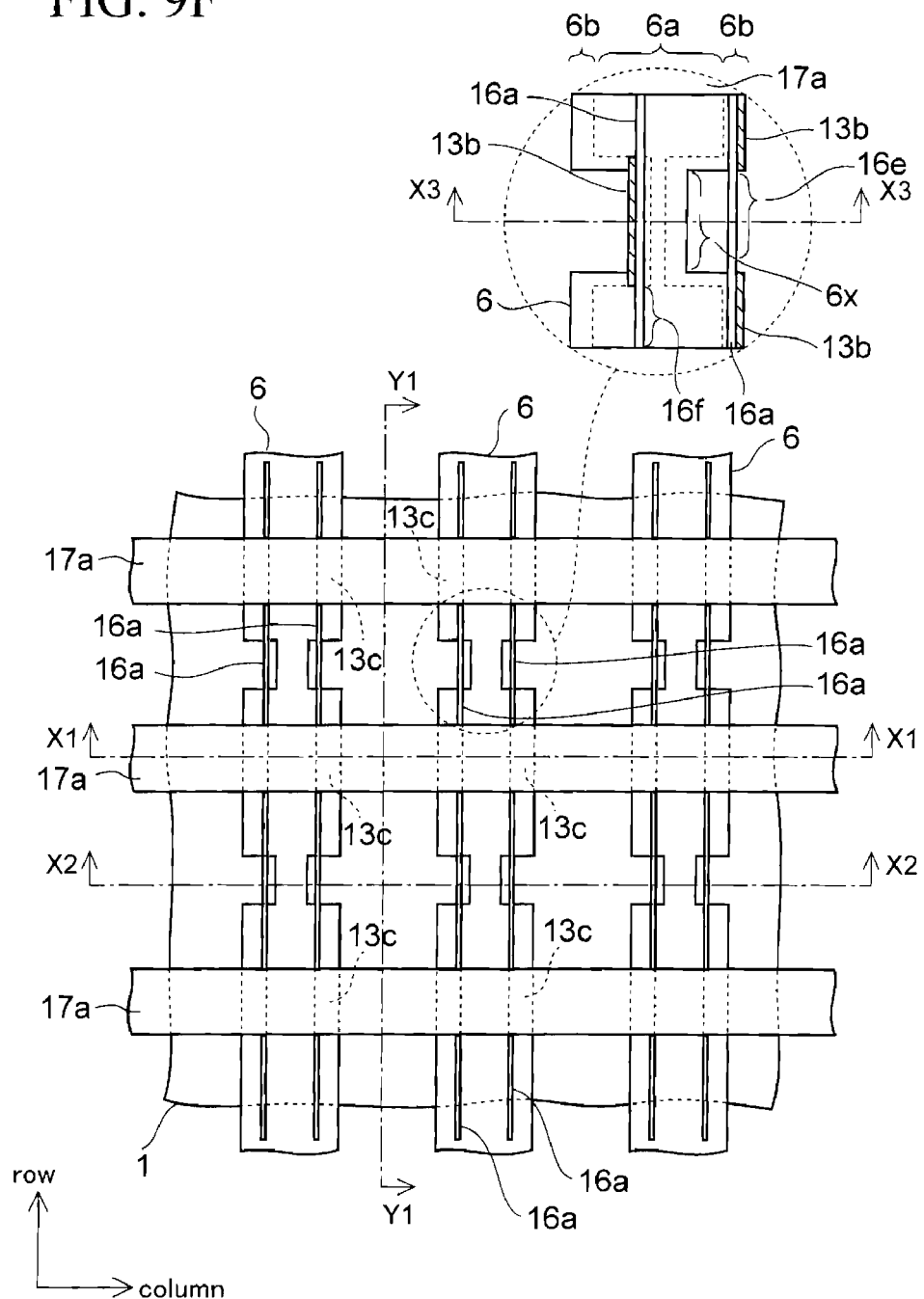
Figure 10F:
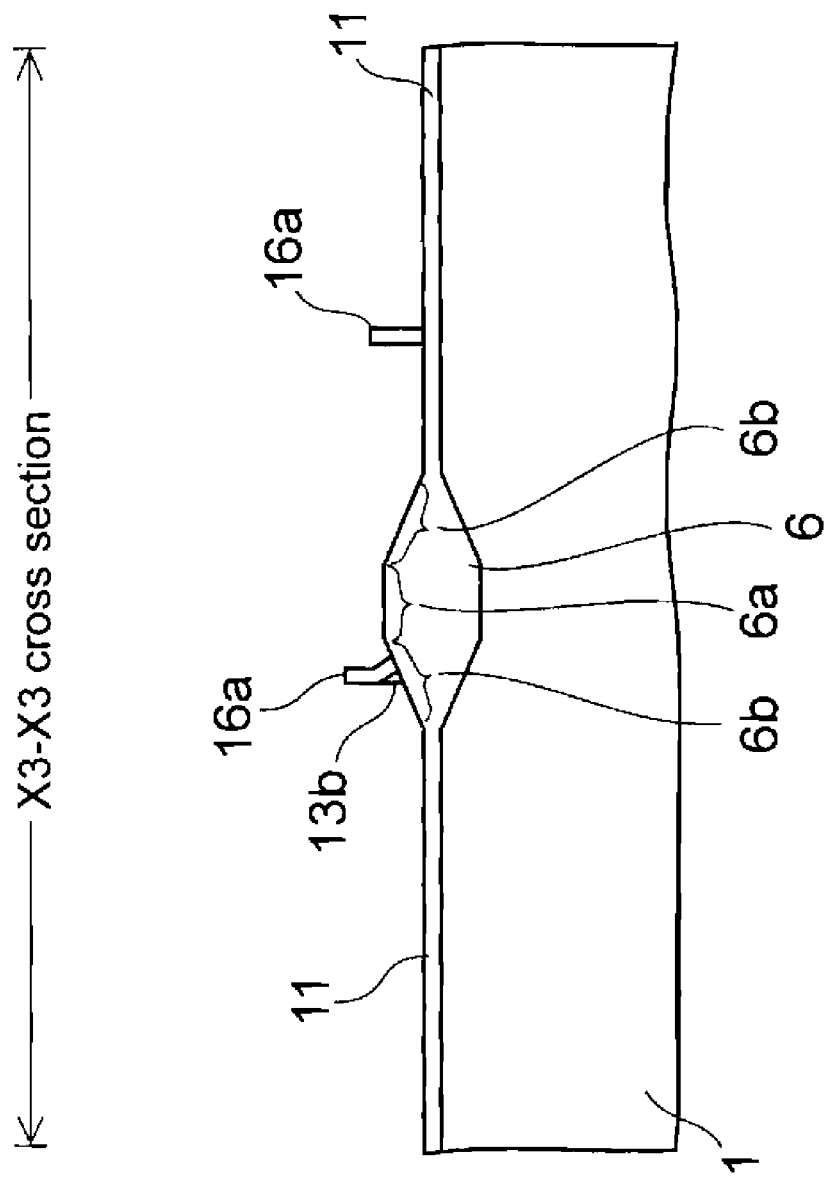

Furthermore, the processes of FIGS. 1J to 1O in the preliminary explanation are performed to pattern the conductive patterns 13a, the intermediate insulating film 16, and the second conductive film 17, so that floating gates 13c and control gates 17a as depicted in FIGS. 9F, 10F, and 11F are formed.

Among these processes, the process of etching the intermediate insulating film 16 is performed as described in FIG. 1N before the floating gates 13c are formed. In this process, the residue 16a of the intermediate insulating film 16 is linearly formed along the edge of the conductive pattern 13a.

Note that, in the present embodiment, unlike the first and second embodiments, the convex portions 13x and the concave portions 13y are not provided in the first conductive film 13a. Instead, the edges of the first conductive film 13a are linearly formed like the preliminary explanation. Accordingly, the planar shape of each residue 16a is also linearly formed.

In addition, as depicted in the dotted circle in FIG. 9F, the concave portions 6x are provided in the device isolation insulating film 6. Accordingly, when the conductive pattern 13a and the device isolation insulating film 6 are misaligned, a portion 16e of the residue 16a is positioned out of the slanting surface 6b of the device isolation insulating film 6, and the portion 16e is formed on the tunnel insulating film 11 beside the concave portion 6x.

In addition, another portion 6f of the residue 16a is positioned out of the slanting surface 6b, and the portion 16f is positioned on the top surface 6a.

Furthermore, in the process of forming the control gates 17a, the stringer 13b of the conductive pattern 13a is formed beside the residue 16a formed on the slanting surface 6b, due to the trailing of the conductive pattern 13a as described in the preliminary explanation. However, since the tunnel insulating film 11 and the top surface 6a are made flat, such trailing does not occur on these films and thus the stringer 13b is not formed beside the portions 6e and 6f of the residue 16a.

Figure 11G:
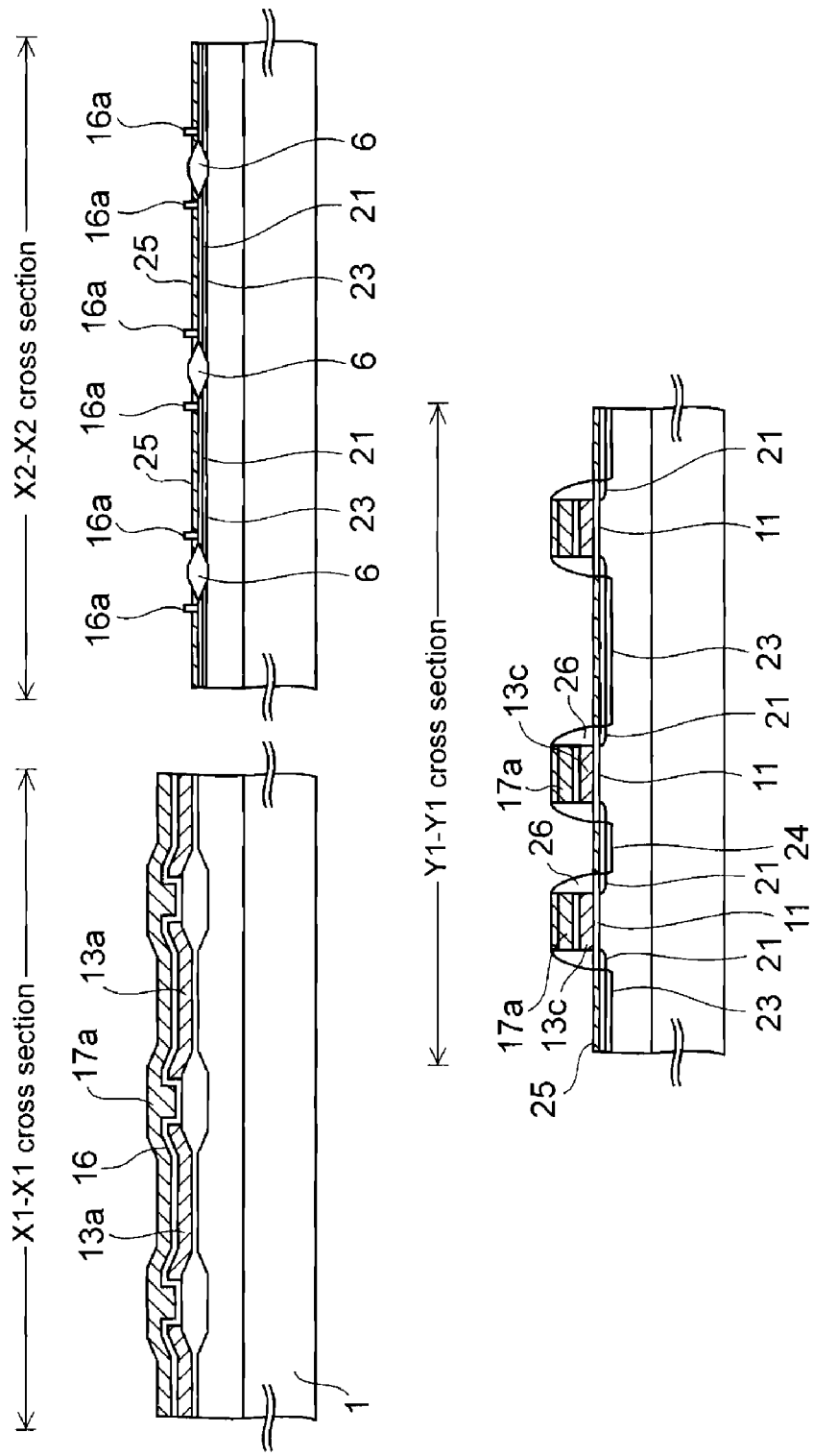

Thereafter, the process of FIG. 1P described in the preliminary explanation is performed to complete the basic structure of the semiconductor device according to the present embodiment as depicted in FIG. 11G.

In the above-described present embodiment, in the process of forming the device isolation insulating films 6 (FIGS. 9A to 9D), in the region B between the control gates 17a adjacent in the row direction, the concave portions 6x recessed toward the inner side of the device isolation insulating film 6 is provided in the plan layout of the device isolation insulating film 6.

With this configuration, as depicted in the dotted circle in FIG. 9F, the portions 6e and 6f of the residue 16a of the intermediate insulating film 16 are formed to be located out of the slanting surfaces 6b of the device isolation insulating film 6. Therefore, the stringer 13b of the first conductive film 13a is not formed beside the portions 6e and 6f. Accordingly, the stringers 13b in the region B are divided. Consequently, the floating gates 13c adjacent in the row direction are prevented from being electrically short-circuited by the conductive stringers 13b.

Fourth Embodiment

Figure 12A:
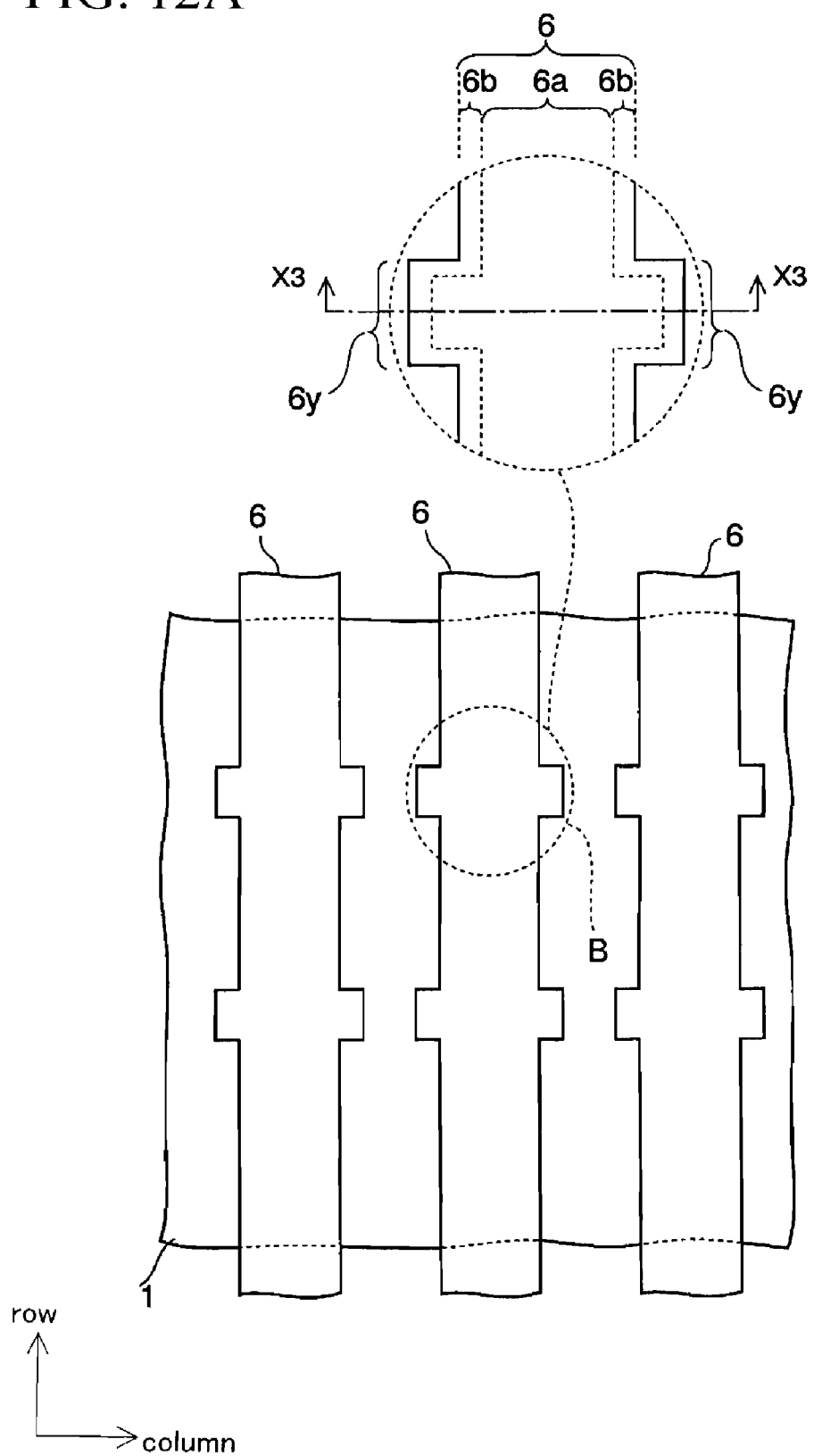
FIGS. 12A and 12B are plan views of a semiconductor device according to a fourth embodiment during the manufacturing thereof.
Figure 12B:
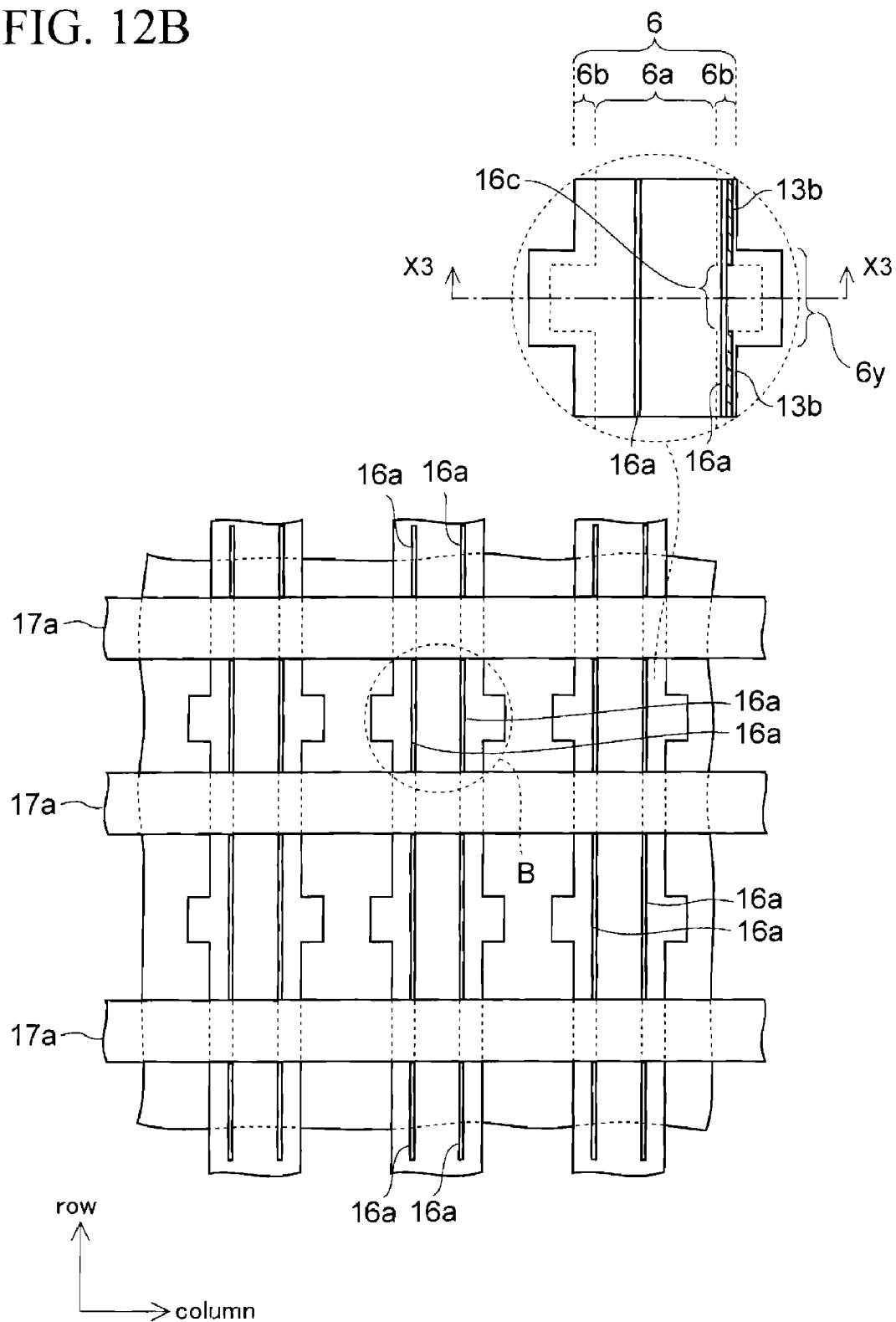
Figure 13A:
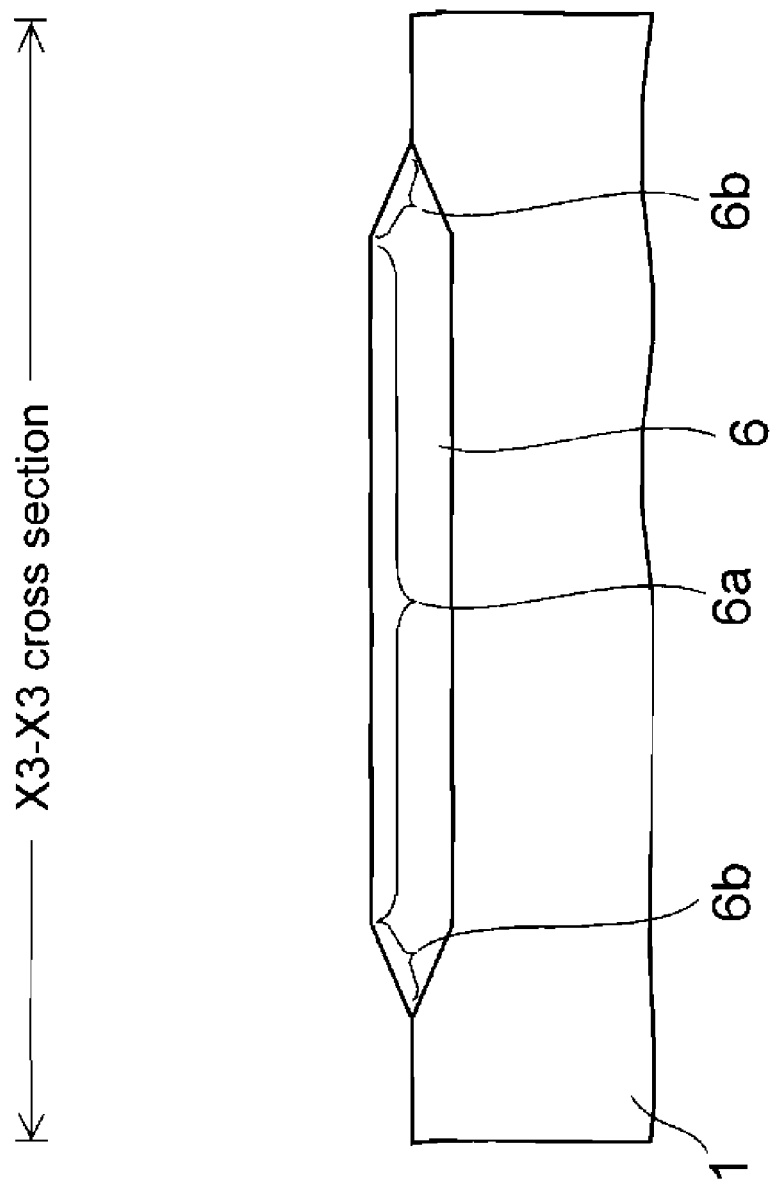
FIGS. 13A and 13B are enlarged cross-sectional views of the semiconductor device according to the fourth embodiment during the manufacturing thereof.
Figure 13B:
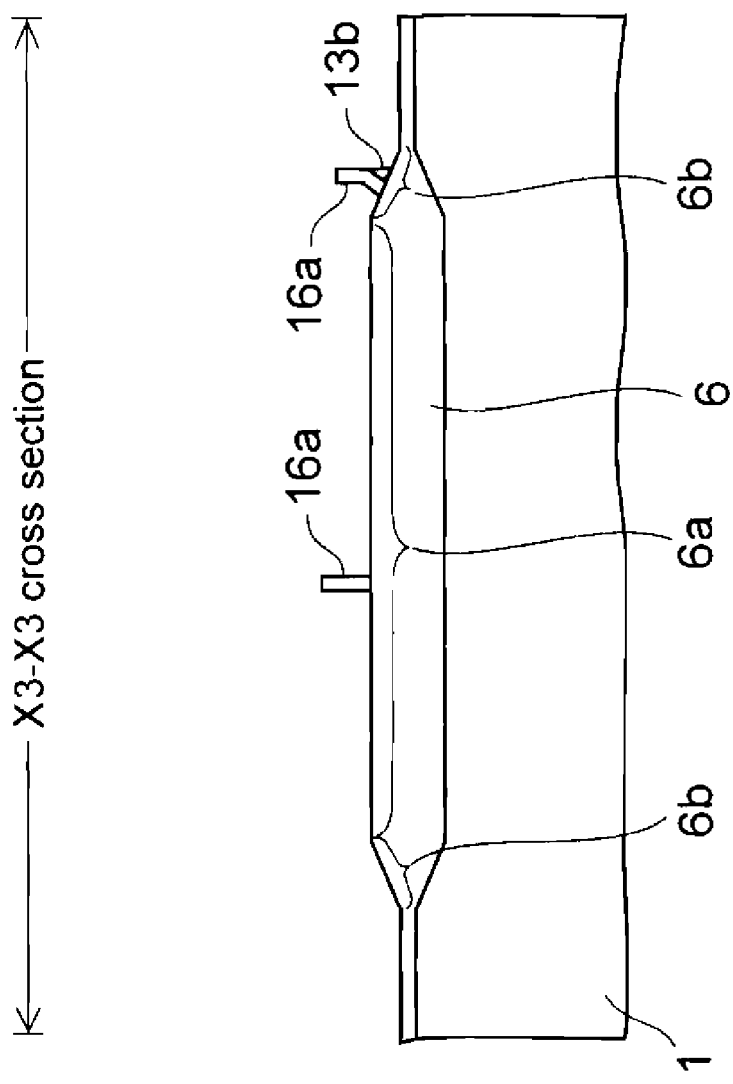

FIGS. 12A and 12B are plan views of a semiconductor device according to a fourth embodiment during the manufacturing thereof. FIGS. 13A and 13B are enlarged cross-sectional views taken along the line X3-X3 in these plan views.

To manufacture this semiconductor device, the processes of FIGS. 1A to 1E described in the preliminary explanation are performed to form device isolation insulating films 6 as depicted in FIGS. 12A and 13A.

In the present embodiment, however, as depicted in FIG. 12A, in the processes of FIGS. 1A to 1E, convex portions 6y protruding toward the outer side of the device isolation insulating film 6 are provided in the edges of the plan layout of the device isolation insulating film 6 in the plan view.

After that, the processes of FIGS. 1F to 1O in the preliminary explanation are performed to obtain the structure depicted in FIGS. 12B and 13B.

Note that, in the present embodiment, for the reason similar to the third embodiment, residues 16a of the intermediate insulating film 16 are linearly formed.

According to the present embodiment, as depicted in the FIGS. 12B and 13B, the convex portions 6y are provided in the device isolation insulating film 6. Therefore, when the conductive pattern 13a and the device isolation insulating film 6 are misaligned, a portion 16c of the residue 16a of the intermediate insulating film 16 is formed on a top surface 6a of the device isolation insulating film 6. Since the top surface 6a is planar, the trailing of the conductive pattern 13a as described in the preliminary explanation does not occur. Accordingly, a stringer 13b of the conductive pattern 13a is not left beside the portion 16c of the residue 16a. Thus, the floating gates 13c adjacent in a row direction can be prevented from being electrically short-circuited by the stringer 13b.

The embodiments are described thus far in detail. However, the present embodiments are not limited to the above-described embodiments.

For example, in the first and second embodiments, the convex portions 13x and the concave portions 13y are provided in the conductive pattern 13a. However, as long as the edge of the conductive pattern 13a is bent, the shape to be given to the conductive pattern 13a is not limited to these shapes. Similarly, in the third and fourth embodiments as well, as long as the edge of the device isolation insulating film 6 is bent, the shape of the edge is not limited to the concave portions 6x or the convex portions 6y.

Furthermore, the first to fourth embodiments may be arbitrarily combined, as long as the edge of the plan layout of either of the conductive patterns 13a and device isolation insulating films 6 is bent.

What is claimed is:

1. A semiconductor device comprising:
    a semiconductor substrate;
    device isolation insulating films formed in the semiconductor substrate and extending in a row direction;
    a tunnel insulating film formed over the semiconductor device between the device isolation insulating films;
    a plurality of floating gates formed in a matrix form over the tunnel insulating film;
    an intermediate insulating film formed over the floating gates; and
    a plurality of strip-shaped control gates that are respectively formed over the intermediate insulating films and that respectively extend in a column direction, the control gate collectively covering the plurality of the floating gates aligned in a single column, wherein
    a residue of the intermediate insulating film is formed to linearly extend over the device isolation insulating film or over the tunnel insulating film in a region between the control gates adjacent in the row direction,
    and a portion of the residue is located out of a slanting surface of the device isolation insulating film, and
    wherein the residue extends to bend toward an inner side in the column direction of the device isolation insulating film in a plan view, and
    the portion of the residue is formed over a top surface of the device isolation insulating film.

2. A semiconductor device comprising:
    a semiconductor substrate;
    device isolation insulating films formed in the semiconductor substrate and extending in a row direction;
    a tunnel insulating film formed over the semiconductor device between the device isolation insulating films;
    a plurality of floating gates formed in a matrix form over the tunnel insulating film;
    an intermediate insulating film formed over the floating gates; and
    a plurality of strip-shaped control gates that are respectively formed over the intermediate insulating films and that respectively extend in a column direction, the control gate collectively covering the plurality of the floating gates aligned in a single column, wherein
    a residue of the intermediate insulating film is formed to linearly extend over the device isolation insulating film or over the tunnel insulating film in a region between the control gates adjacent in the row direction,
    and a portion of the residue is located out of a slanting surface of the device isolation insulating film, and
    wherein the residue extends to bend toward an outer side in the column direction of the device isolation insulating film in a plan view, and
    the portion of the residue is formed over the tunnel insulating film in the region between the control gates adjacent in the row direction.

3. A semiconductor device comprising:
    a semiconductor substrate;
    device isolation insulating films formed in the semiconductor substrate and extending in a row direction;
    a tunnel insulating film formed over the semiconductor device between the device isolation insulating films;
    a plurality of floating gates formed in a matrix form over the tunnel insulating film;
    an intermediate insulating film formed over the floating gates; and
    a plurality of strip-shaped control gates that are respectively formed over the intermediate insulating films and that respectively extend in a column direction, the control gate collectively covering the plurality of the floating gates aligned in a single column, wherein
    a residue of the intermediate insulating film is formed to linearly extend over the device isolation insulating film or over the tunnel insulating film in a region between the control gates adjacent in the row direction,
    and a portion of the residue is located out of a slanting surface of the device isolation insulating film, and
    wherein the device isolation insulating film has a concave portion in the region between the control gates adjacent in the row direction, the concave portion being recessed toward an inner side in the column direction of the device isolation insulating film in a plan view, and
    the portion of the residue is formed either over the tunnel insulating film beside the concave portion or over a top surface of the device isolation insulating film.

4. A semiconductor device comprising:
    a semiconductor substrate;
    device isolation insulating films formed in the semiconductor substrate and extending in a row direction;
    a tunnel insulating film formed over the semiconductor device between the device isolation insulating films;
    a plurality of floating gates formed in a matrix form over the tunnel insulating film;
    an intermediate insulating film formed over the floating gates; and
    a plurality of strip-shaped control gates that are respectively formed over the intermediate insulating films and that respectively extend in a column direction, the control gate collectively covering the plurality of the floating gates aligned in a single column, wherein a residue of the intermediate insulating film is formed to linearly extend over the device isolation insulating film or over the tunnel insulating film in a region between the control gates adjacent in the row direction, and a portion of the residue is located out of a slanting surface of the device isolation insulating film, and wherein the device isolation insulating film has a convex portion in the region between the control gates adjacent in the row direction, the convex portion protruding toward an outer side in the column direction of the device isolation insulating film in a plan view, and the portion of the residue is formed over a top surface of the device isolation insulating film.

5. The semiconductor device according to claim 3, wherein the residue is linearly formed.

6. The semiconductor device according to claim 1, wherein the residue extends from the floating gate to the other floating gate, the floating gates being adjacent in the row direction.

7. The semiconductor device according to claim 1, wherein no stringers made of a same material as that of the floating gates exist beside the portion of the residue of the intermediate insulating film.

8. The semiconductor device according to claim 1, wherein the intermediate insulating film is any one of the group consisting of a silicon oxide film, an ONO film, and an ONONO film.

9. The semiconductor device according to claim 1, wherein the device isolation insulating film is formed of a field oxide film.

10. The semiconductor device according to claim 4, wherein the residue is linearly formed.

11. The semiconductor device according to claim 2, wherein the residue extends from the floating gate to the other floating gate, the floating gates being adjacent in the row direction.

12. The semiconductor device according to claim 2, wherein no stringers made of a same material as that of the floating gates exist beside the portion of the residue of the intermediate insulating film.

13. The semiconductor device according to claim 2, wherein the intermediate insulating film is any one of the group consisting of a silicon oxide film, an ONO film, and an ONONO film.

14. The semiconductor device according to claim 2, wherein the device isolation insulating film is formed of a field oxide film.

15. The semiconductor device according to claim 3, wherein the residue extends from the floating gate to the other floating gate, the floating gates being adjacent in the row direction.

16. The semiconductor device according to claim 3, wherein no stringers made of a same material as that of the floating gates exist beside the portion of the residue of the intermediate insulating film.

17. The semiconductor device according to claim 3, wherein the intermediate insulating film is any one of the group consisting of a silicon oxide film, an ONO film, and an ONONO film.

18. The semiconductor device according to claim 3, wherein the device isolation insulating film is formed of a field oxide film.

19. The semiconductor device according to claim 4, wherein the residue extends from the floating gate to the other floating gate, the floating gates being adjacent in the row direction.

20. The semiconductor device according to claim 4, wherein no stringers made of a same material as that of the floating gates exist beside the portion of the residue of the intermediate insulating film.

21. The semiconductor device according to claim 4, wherein the intermediate insulating film is any one of the group consisting of a silicon oxide film, an ONO film, and an ONONO film.

22. The semiconductor device according to claim 4, wherein the device isolation insulating film is formed of a field oxide film.

* * * * *